(12) United States Patent
Dairiki et al.

(10) Patent No.: US 8,618,544 B2
(45) Date of Patent: Dec. 31, 2013

(54) THIN FILM TRANSISTOR AND DISPLAY DEVICE

(75) Inventors: Koji Dairiki, Kanagawa (JP); Takayuki Ikeda, Kanagawa (JP); Hidekazu Miyairi, Kanagawa (JP); Yoshiyuki Kurokawa, Kanagawa (JP); Hiromichi Godo, Kanagawa (JP); Daisuke Kawae, Kanagawa (JP); Takayuki Inoue, Kanagawa (JP); Satoshi Kobayashi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/167,762

(22) Filed: Jun. 24, 2011

(65) Prior Publication Data
US 2011/0248268 A1    Oct. 13, 2011

Related U.S. Application Data

(63) Continuation of application No. 12/391,398, filed on Feb. 24, 2009, now Pat. No. 7,968,880.

(30) Foreign Application Priority Data

Mar. 1, 2008    (JP) .................................. 2008-051436

(51) Int. Cl.
*H01L 29/04*    (2006.01)
*H01L 31/036*    (2006.01)
*H01L 31/0376*    (2006.01)
*H01L 31/20*    (2006.01)

(52) U.S. Cl.
USPC ................... 257/57; 257/59; 257/61; 257/72

(58) Field of Classification Search
USPC .............................................. 257/E29.291, 57
See application file for complete search history.

(56) References Cited

U.S. PATENT DOCUMENTS

| | | | |
|---|---|---|---|
| 4,409,134 A | 10/1983 | Yamazaki | |
| 5,101,242 A | 3/1992 | Ikeda et al. | |
| 5,221,631 A | 6/1993 | Ikeda et al. | |
| 5,311,040 A | 5/1994 | Hiramatsu et al. | |
| 5,453,858 A | 9/1995 | Yamazaki | |

(Continued)

FOREIGN PATENT DOCUMENTS

| | | |
|---|---|---|
| EP | 0 383 743 A2 | 8/1990 |
| EP | 0 449 539 A2 | 10/1991 |

(Continued)

*Primary Examiner* — Thien F Tran
(74) *Attorney, Agent, or Firm* — Nixon Peabody LLP; Jeffrey L. Costellia

(57) ABSTRACT

To improve problems with on-state current and off-state current of thin film transistors, a thin film transistor includes a pair of impurity semiconductor layers to which an impurity element imparting one conductivity type is added, provided with a space therebetween; a conductive layer which is overlapped, over the gate insulating layer, with the gate electrode and one of the pair of impurity semiconductor layers to which an impurity element imparting one conductivity type is added; and an amorphous semiconductor layer which is provided successively between the pair of impurity semiconductor layers to which an impurity element imparting one conductivity type is added in such a manner that the amorphous semiconductor layer extends over the gate insulating layer from the conductive layer and is in contact with both of the pair of impurity semiconductor layers to which an impurity element imparting one conductivity type is added.

16 Claims, 28 Drawing Sheets

(56) References Cited

U.S. PATENT DOCUMENTS

| | | |
|---|---|---|
| 5,473,168 A | 12/1995 | Kawai et al. |
| 5,514,879 A | 5/1996 | Yamazaki |
| 5,614,732 A | 3/1997 | Yamazaki |
| 5,701,167 A | 12/1997 | Yamazaki |
| 5,849,601 A | 12/1998 | Yamazaki |
| 5,859,445 A | 1/1999 | Yamazaki |
| 6,011,277 A | 1/2000 | Yamazaki |
| 6,023,075 A | 2/2000 | Yamazaki |
| 6,153,893 A | 11/2000 | Inoue et al. |
| 6,252,249 B1 | 6/2001 | Yamazaki |
| 6,281,520 B1 | 8/2001 | Yamazaki |
| 6,306,213 B1 | 10/2001 | Yamazaki |
| 6,468,839 B2 | 10/2002 | Inoue et al. |
| 6,737,676 B2 | 5/2004 | Yamazaki |
| 7,067,844 B2 | 6/2006 | Yamazaki |
| 7,098,479 B1 | 8/2006 | Yamazaki |
| 7,115,902 B1 | 10/2006 | Yamazaki |
| 7,323,369 B2 * | 1/2008 | Lee et al. .................. 438/149 |
| 7,537,976 B2 | 5/2009 | Hirose |
| 7,786,485 B2 | 8/2010 | Dairiki et al. |
| 7,821,012 B2 | 10/2010 | Jinbo |
| 8,207,538 B2 | 6/2012 | Jinbo |
| 2005/0115930 A1 | 6/2005 | Tanaka et al. |
| 2007/0012919 A1 | 1/2007 | Oh et al. |
| 2007/0018165 A1 | 1/2007 | Yamazaki |
| 2008/0006827 A1 | 1/2008 | Shim et al. |
| 2009/0218572 A1 | 9/2009 | Dairiki et al. |

FOREIGN PATENT DOCUMENTS

| | | |
|---|---|---|
| EP | 0 535 979 A2 | 4/1993 |
| EP | 0 652 595 A2 | 5/1995 |
| EP | 1 537 938 A2 | 6/2005 |
| JP | 63-258072 | 10/1988 |
| JP | 02-047633 | 2/1990 |
| JP | 02-056462 | 4/1990 |
| JP | 02-101434 | 4/1990 |
| JP | 2-218166 | 8/1990 |
| JP | 03-217027 | 9/1991 |
| JP | 03-278466 | 12/1991 |
| JP | 4-242724 | 8/1992 |
| JP | 04-242724 | 8/1992 |
| JP | 5-129608 | 5/1993 |
| JP | 05-190857 | 7/1993 |
| JP | 7-131030 | 5/1995 |
| JP | 07-047876 | 11/1995 |
| JP | 2001-053283 | 2/2001 |
| JP | 2005-049832 | 2/2005 |
| JP | 2005-49832 | 2/2005 |
| JP | 2005-167051 | 6/2005 |
| JP | 2005-191546 | 7/2005 |
| WO | WO-2008/018478 A1 | 2/2008 |

* cited by examiner

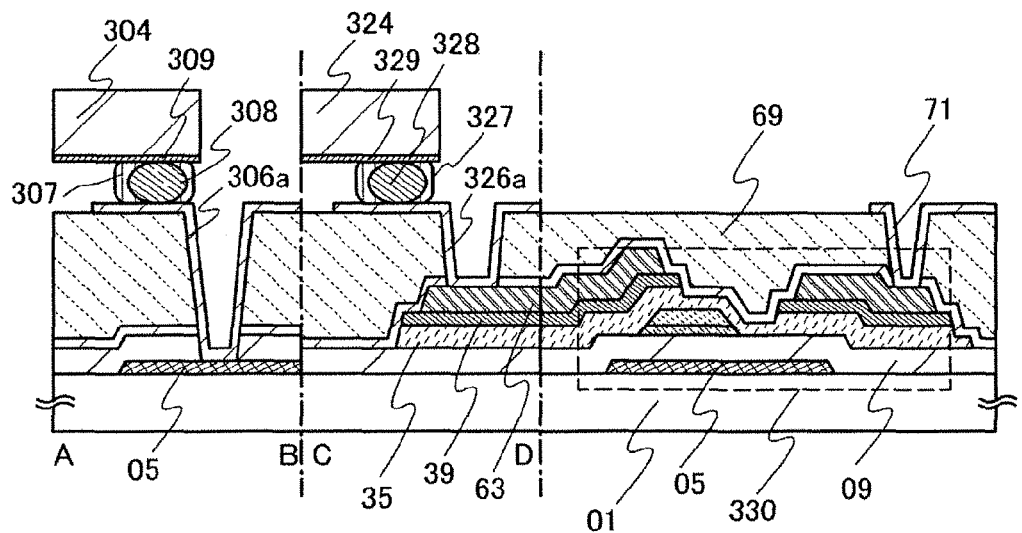
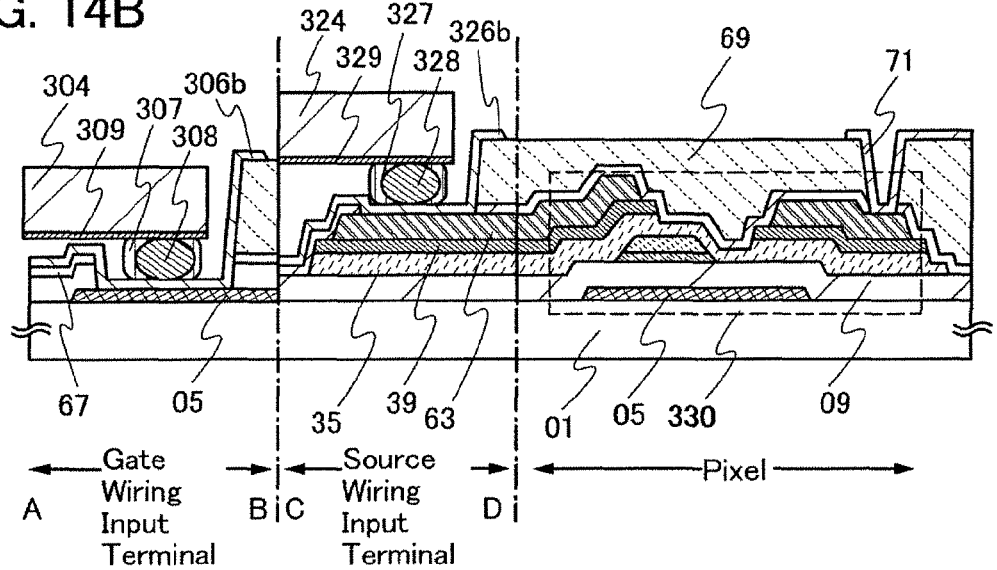

THIN FILM TRANSISTOR AND DISPLAY DEVICE

BACKGROUND OF INVENTION

1. Field of the Invention

The present invention relates to a thin film transistor and a display device which is operated using the thin film transistor.

2. Description of the Related Art

As a kind of field-effect transistor, a thin film transistor in which a channel region is formed in a semiconductor layer formed over a substrate having an insulating surface is known. Techniques in which amorphous silicon, microcrystalline silicon, or polycrystalline silicon is used for the semiconductor layer used in the thin film transistor have been disclosed (see Patent Documents 1 to 5: Japanese Published Patent Application No. 2001-053283, Japanese Published Patent Application No. H5-129608, Japanese Published Patent Application No. 2005-049832, Japanese Published Patent Application No. H7-131030, and Japanese Published Patent Application No. 2005-191546). A typical application of a thin film transistor is a liquid crystal television device, in which the thin film transistor has been put to the practical use as a switching transistor for each pixel included in a display screen.

SUMMARY OF THE INVENTION

The thin film transistor in which the channel is formed in an amorphous silicon layer has a problem in that the field-effect mobility is only about 0.4 to 0.8 $cm^2/V \cdot sec$ and the on-state current is low. On the other hand, the thin film transistor in which the channel is formed in a microcrystalline silicon layer has a problem in that, whereas the field-effect mobility is higher than that of the thin film transistor using amorphous silicon, the off-state current is high, so that sufficient switching characteristics cannot be obtained.

The thin film transistor in which a polycrystalline silicon layer is used for the channel formation region has characteristics in that the field-effect mobility is far higher than those of the abode-described two kinds of thin film transistors and high on-state current can be obtained. According to the above-described characteristics, this thin film transistor can be used not only as a switching thin film transistor in each pixel but also for a driver circuit which needs operating at high speed.

However, the thin film transistor in which a polycrystalline silicon layer is used for the channel formation region has a problem in that the manufacturing cost becomes higher than that of the thin film transistor using an amorphous silicon layer due to the necessity for a step of crystallizing a semiconductor layer. For example, with the laser annealing technique involved in the process for manufacturing a polycrystalline silicon layer, large-screen liquid crystal panels cannot be produced efficiently because the irradiated area with a laser beam is small.

A mother glass for manufacturing display panels which has been grown in size from year to year is as follows: 3rd generation (550 mm×650 mm), 3.5th generation (600 mm×720 mm or 620 mm×750 mm), 4th generation (680×880 mm or 730 mm×920 mm), 5th generation (1100 mm×1300 mm), 6th generation (1500 mm×1850 mm), 7th generation (1870 mm×2200 mm), and 8th generation (2200 mm×2400 mm). From now on, the size of mother glasses is expected to grow to 9th generation (2400 mm×2800 mm or 2450 mm×3050 mm) and 10th generation (2950 mm×3400 mm). Increase in size of mother glasses is based on the minimum-cost design concept.

However, the technique that thin film transistors capable of high-speed operation can be manufactured over a large-area mother glass such as a 10th generation (2950 mm×3400 mm) mother glass with high production has not established yet, which becomes a problem in industry.

In view of the foregoing, it is an object of the present invention to solve the above-described problems with on-state current and off-state current of thin film transistors. It is another object of the present invention to provide a thin film transistor capable of high-speed operation.

A thin film transistor according to one aspect of the present invention includes a pair of impurity semiconductor layers to which an impurity element imparting one conductivity type is added to form a source region and a drain region, provided with a space therebetween so that at least part thereof is overlapped with a gate electrode with a gate insulating layer interposed between the gate electrode and the pair of impurity semiconductor layers. The thin film transistor includes a conductive layer which is overlapped, over the gate insulating layer, with the gate electrode and one of the pair of impurity semiconductor layers to which an impurity element imparting one conductivity type is added; and an amorphous semiconductor layer which is provided successively between the pair of impurity semiconductor layers to which an impurity element imparting one conductivity type is added in such a manner that the amorphous semiconductor layer extends over the gate insulating layer from the conductive layer and is in contact with both of the pair of impurity semiconductor layers to which an impurity element imparting one conductivity type is added. Further, a buffer layer which is overlapped with the conductive layer may be provided.

A thin film transistor according to one aspect of the present invention includes a gate insulating layer covering a gate electrode; an amorphous semiconductor layer provided over the gate insulating layer; and a pair of impurity semiconductor layers to which an impurity element imparting one conductivity type is added to form a source region and a drain region, provided with a space therebetween over the amorphous semiconductor layer. The thin film transistor includes a conductive layer which is provided between the gate insulating layer and the amorphous semiconductor layer, which is overlapped with one of the pair of impurity semiconductor layers to which an impurity element imparting one conductivity type is added, and which extends to a region between the source region and the drain region. Further, the thin film transistor includes a buffer layer which is in contact with the conductive layer and the amorphous semiconductor layer and which is overlapped with the conductive layer.

A thin film transistor according to one aspect of the present invention includes a conductive layer which is overlapped with a gate electrode, with a gate insulating layer interposed therebetween; an amorphous semiconductor layer covering a side face of the conductive layer; and a pair of impurity semiconductor layers to which an impurity element imparting one conductivity type is added to form a source region and a drain region, provided over the amorphous semiconductor layer. At least part of one of the pair of impurity semiconductor layers to which an impurity element imparting one conductivity type is added is overlapped with the conductive layer, and the other of the pair of impurity semiconductor layers to which an impurity element imparting one conductivity type is added is provided outside the conductive layer.

In the thin film transistor, carriers (electrons and holes) flowing between the source region and the drain region, which are controlled by a voltage applied to the gate electrode, flow through the conductive layers overlapped with the gate electrode and the amorphous semiconductor layer provided to extend in the channel length direction over the conductive layers.

Note that the conductive layer does not extend all over the region in the channel length direction of the thin film transistor, but is provided so as not to overlap with one of the pair of impurity semiconductor layers to which an impurity element imparting one conductivity type is added to form a source region and a drain region. That is, this thin film transistor is structured such that carriers flowing through the channel flow through the amorphous semiconductor layer at a certain distance in the channel length direction between the source region and the drain region.

The electrical conductivity of the conductive layer is 0.1 S/cm to 1.8 S/cm, and the electrical conductivity of the amorphous semiconductor layer is lower than that of the conductive layer. The donor concentration of the microcrystalline semiconductor layer is greater than or equal to $1 \times 10^{18}$ atoms/cm$^3$ and less than or equal to $2 \times 10^{20}$ atoms/cm$^3$. The conductive layer, which extends at least in the channel length direction of the thin film transistor and has the above-described electrical conductivity, operates so as to generate high on-state current. On the other hand, the amorphous semiconductor layer, which is between channels and forms a so-called off-set region, operates so as to reduce off-state current.

The impurity semiconductor means a semiconductor in which most of carriers having a role in electrical conduction is supplied from the added impurity element. The impurity element is an element capable of being a donor which supplies an electron as a carrier or an element capable of being an acceptor which supplies a hole as a carrier; typically, the donor is a Group 15 element in the periodic table and the acceptor is a Group 13 element in the periodic table.

The microcrystalline semiconductor means a semiconductor, for example, in which the crystal grain size is greater than or equal to 2 nm and less than or equal to 200 nm, preferably greater than or equal to 10 nm and less than or equal to 80 nm, more preferably greater than or equal to 20 nm and less than or equal to 50 nm, and the electrical conductivity, about $10^{-7}$ S/cm to $10^{-4}$ S/cm, can be increased to about $10^1$ S/cm by valence electron control. The concept of the microcrystalline semiconductor is not fixed at only the above-described crystal grain size and electrical conductivity; the microcrystalline semiconductor can be replaced with any other semiconductor material having an equivalent property value. The amorphous semiconductor means a semiconductor which does not have a crystal structure (long-range order in the atomic arrangement). Amorphous silicon may include hydrogen.

The "on-state current" means current flowing through the channel formation region when an appropriate gate voltage is applied to the gate electrode such that current flow through the channel formation region (that is, when the thin film transistor is on). The "off-state current" means current flowing between the source and the drain when the gate voltage is lower than the threshold voltage of the thin film transistor (that is, when the thin film transistor is off).

The conductive layer does not extend all over the region in the channel length direction of the thin film transistor, but is provided so as not to overlap with one of the pair of impurity semiconductor layers to which an impurity element imparting one conductivity type is added to form a source region and a drain region such that carriers flowing through the channel flow through the amorphous semiconductor layer at a certain distance in the channel length direction between the source region and the drain region. Accordingly, the high on-state current can be obtained whereas the off-current can be reduced.

In addition, the field-effect mobility can be increased and the operation can be performed at high speed by increasing the donor concentration of the conductive layer.

BRIEF DESCRIPTION OF THE DRAWINGS

In the accompanying drawings:

FIGS. 14A and 14B are cross-sectional views each illustrating a terminal portion and a pixel portion of the element substrate according to the embodiment mode of the present invention;

DETAILED DESCRIPTION OF THE INVENTION

Figure 1A:
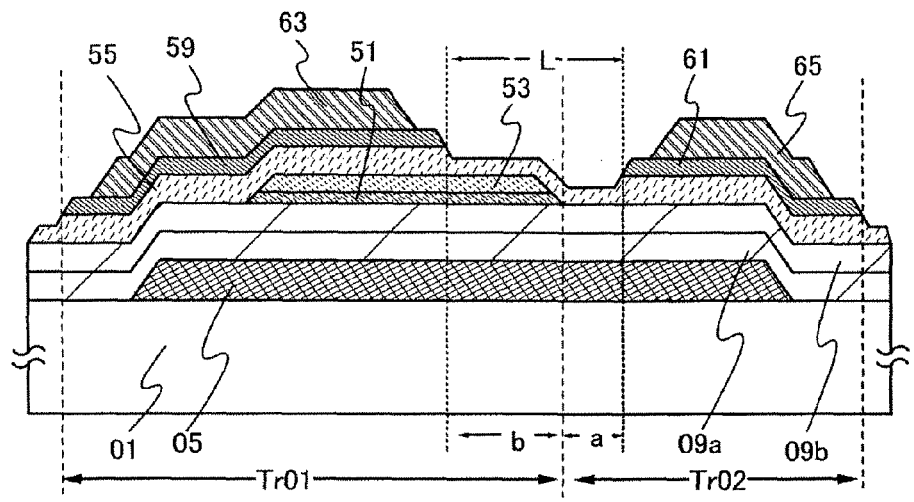
FIGS. 1A to 1C are cross-sectional views each illustrating a thin film transistor according to an embodiment mode of the present invention.

Hereinafter, the embodiment modes and embodiments of the present invention will be described with reference to the accompanying drawings. The disclosed present invention is not limited to the following description, and it is easily understood by those skilled in the art that the mode and detail of the disclosed present invention can be variously changed without departing from the spirit and scope thereof. Therefore, the disclosed present invention is not construed as being limited to the description of the following embodiment modes and embodiments. In the structures of the disclosed present invention described hereinafter, reference numerals denoting the same parts are used in common in the drawings.

In the description on the following embodiment modes, a gate electrode 05 is part of a gate wiring; hence, the gate electrode 05 is described as a gate wiring 05 in some cases. Similarly, a wiring 63 is described as a source wiring 63 or a source electrode 63 in some cases.

[Embodiment Mode 1]

In this embodiment mode, a structure of a thin film transistor will be described with reference to FIGS. 1A to 1C, in which the off-state current is lower as compared to a thin film transistor including a microcrystalline semiconductor layer for a channel formation region and operation at higher speed can be performed and the on-state current is higher as compared to a thin film transistor including an amorphous semiconductor layer for a channel formation region.

In a thin film transistor illustrated in FIG. 1A, the gate electrode 05 is formed over a substrate 01, gate insulating layers 09*a* and 09*b* are formed over the gate electrode 05, a conductive layer 51 is formed over the gate insulating layer 09*b*, and a buffer layer 53 is formed over the conductive layer 51. The buffer layer 53 is almost overlapped with the conductive layer 51. Further, an amorphous semiconductor layer 55 which covers the side surfaces of the conductive layer 51 and the buffer layer 53 and the top surface of the buffer layer 53 is formed. A pair of an impurity semiconductor layer 59 (a first impurity semiconductor layer) to which an impurity element imparting one conductivity type is added and an impurity semiconductor layer 61 (a second impurity semiconductor layer) to which an impurity element imparting one conductivity type is added to form a source region and a drain region is formed over the amorphous semiconductor layer 55, and wirings 63 and 65 are formed over the pair of the impurity semiconductor layer 59 to which an impurity element imparting one conductivity type is added and the impurity semiconductor layer 61 to which an impurity element imparting one conductivity type is added, respectively. In addition, in the pair of the impurity semiconductor layer 59 to which an impurity element imparting one conductivity type is added and the impurity semiconductor layer 61 to which an impurity element imparting one conductivity type is added, the impurity semiconductor layer 61 is not overlapped with the buffer layer 53, whereas one end portion of the impurity semiconductor layer 59 is overlapped with the buffer layer 53.

The conductive layer 51 is formed using a conductive film having an electrical conductivity of 0.1 $Scm^{-1}$ to 1.8 $Scm^{-1}$. As examples of each of the conductive layer 51, there are a metal layer, a metal nitride layer, a metal carbide layer, a metal boride layer, a metal silicide layer, a semiconductor layer to which an impurity element which serves as a donor is added, and the like which satisfy the above-described electrical conductivity.

As the metal layer, typically, a metal layer of aluminum, copper, titanium, neodymium, scandium, molybdenum, tantalum, tungsten, cobalt, nickel, silver, gold, platinum, tin, iridium, or the like, or a metal alloy layer made of a plurality of them can be used as appropriate. A singe layer of the above-described metal layer or the metal alloy layer or a stack layer thereof can be used.

As the metal nitride layer, the following can be used: a titanium nitride layer, a zirconium nitride layer, a hafnium nitride layer, a tantalum nitride layer, a vanadium nitride layer, a niobium nitride layer, a chromium nitride layer, a lanthanum nitride layer, an yttrium nitride layer, or the like. A singe layer of the above-described metal nitride layer or a stack layer thereof can be used.

As the metal carbide layer, the following can be used: a titanium carbide layer, a hafnium carbide layer, a niobium carbide layer, a tantalum carbide layer, a vanadium carbide layer, a zirconium carbide layer, a chromium carbide layer, a cobalt carbide layer, a molybdenum carbide layer, a tungsten carbide layer, or the like. A singe layer of the above-described metal carbide layer or a stack layer thereof can be used.

As the metal boride layer, a titanium boride layer can be used.

As the metal silicide layer, the following can be used: a platinum silicide layer, a titanium silicide layer, a molybdenum silicide layer, a nickel silicide layer, a chromium silicide layer, a cobalt silicide layer, a vanadium silicide layer, a tungsten silicide layer, a zirconium silicide layer, a hafnium silicide layer, a niobium silicide layer, a tantalum silicide layer, or the like. A singe layer of the above-described metal silicide layer or a stack layer thereof can be used.

The conductive layer 51 can have a stack structure using plural kinds of layers selected from the metal layer, the metal nitride layer, the metal carbide layer, the metal boride layer, and the metal silicide layer.

Figure 32A:
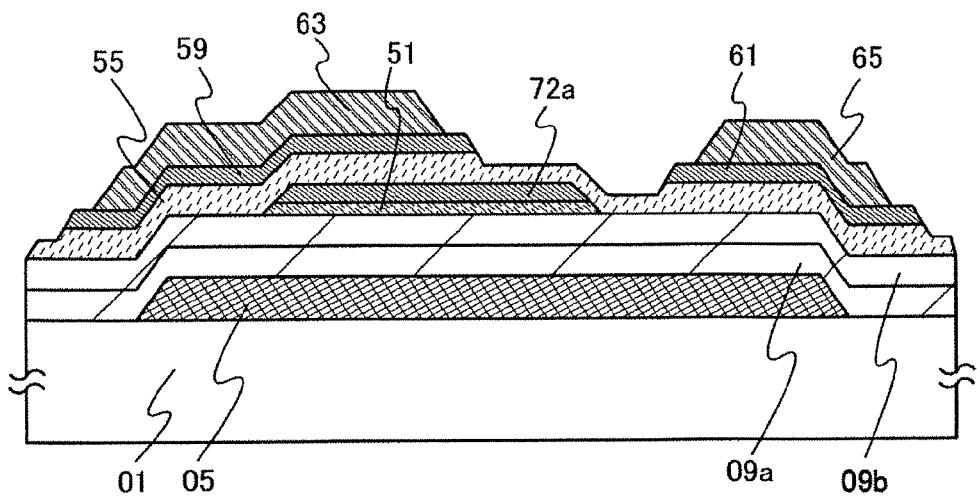
FIGS. 32A to 32C are cross-sectional views each illustrating a thin film transistor according to the embodiment mode of the present invention.
Figure 32B:
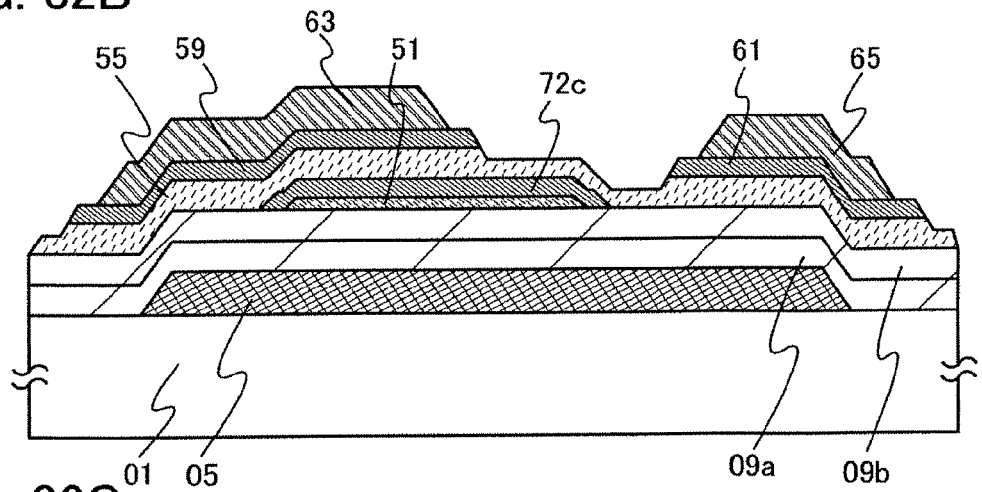
Figure 32C:
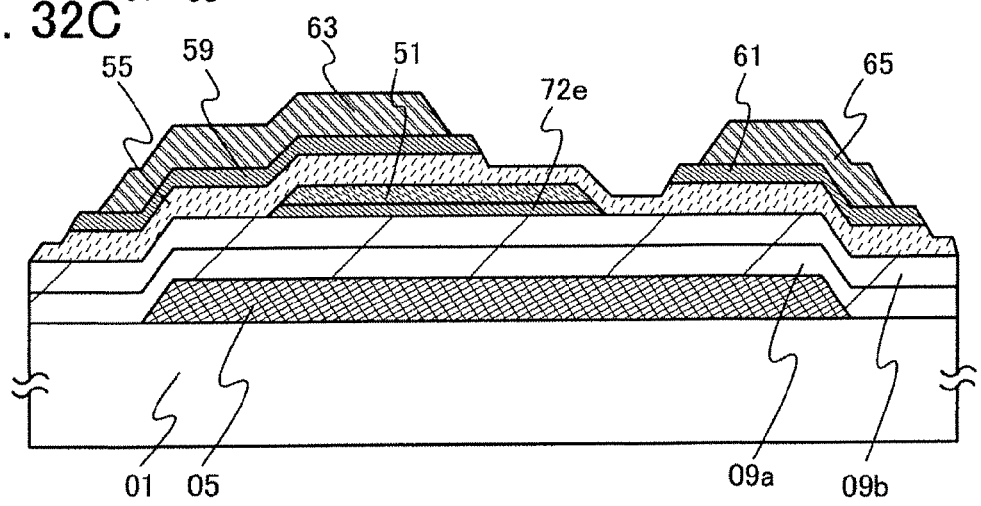

Note that when plural kinds of layers selected from the metal layer, the metal nitride layer, the metal carbide layer, the metal boride layer, and the metal silicide layer are formed as the conductive layer 51, in order to form an ohmic contact between the amorphous semiconductor layer 55 and the conductive layer 51, a semiconductor layer 72a to which an impurity element which serves as a donor or an impurity element which serves as an acceptor is added may be formed over any of the plural kinds of layers selected from the metal layer, the metal nitride layer, the metal carbide layer, the metal boride layer, and the metal silicide layer to have a stack structure (see FIG. 32A). Alternatively, a semiconductor layer 72c to which an impurity element which serves as a donor or an impurity element which serves as an acceptor is added may cover the top and side surfaces of the metal layer, the metal nitride layer, the metal carbide layer, the metal boride layer, the metal silicide layer, or the like (see FIG. 32B). Further alternatively, a semiconductor layer 72e to which an impurity element which serves as a donor or an impurity element which serves as an acceptor is added may be formed over the gate insulating layer 09b, and over the semiconductor layer 72e, a metal layer, a metal nitride layer, a metal carbide layer, a metal boride layer, a metal silicide layer, or the like may be formed (see FIG. 32C). With such a structure, formation of Schottky junction at the interface between the amorphous semiconductor layer and the metal layer, the metal nitride layer, the metal carbide layer, the metal boride layer, the metal silicide layer, or the like can be prevented so that characteristics of a thin film transistor are improved.

To the semiconductor layer to which an impurity element which serves as a donor is added, a donor which is an element that supplies an electron as a carrier is added. As the impurity element which serves as a donor, a Group 15 element in the periodic table such as phosphorus, arsenic, and antimony are typically given. As the semiconductor layer to which the impurity element which serves as a donor is added, an amorphous silicon layer, an amorphous silicon germanium layer, an amorphous germanium layer, a microcrystalline silicon layer, a microcrystalline silicon germanium layer, a microcrystalline germanium layer, a polycrystalline silicon layer, a polycrystalline silicon germanium layer, a polycrystalline germanium layer, or the like is used. When an amorphous germanium layer or a microcrystalline germanium layer is used as the semiconductor layer, the resistivity is small, so that the impurity element which serves as a donor is not necessarily added.

When the concentration of the impurity element which serves as a donor that is added to the semiconductor layer is greater than or equal to $1 \times 10^{18}$ atoms/cm$^3$ and less than or equal to $2 \times 10^{20}$ atoms/cm$^3$ when being measured by secondary ion mass spectroscopy (SIMS), the resistance at the interface between the gate insulating layer 09b and the semiconductor layer to which the impurity element which serves as a donor is added can be reduced and a thin film transistor in which operation at higher speed can be performed and the on-state current is high can be manufactured.

The microcrystalline semiconductor here is a semiconductor having an intermediate structure between an amorphous structure and a crystalline structure (including a single crystal and a polycrystal). This semiconductor is a semiconductor having a third state that is stable in terms of free energy and is a crystalline substance having a short-range order and lattice distortion, and column-like or needle-like crystals with a grain size which is greater than or equal to 0.2 nm and less than or equal to 200 nm, preferably greater than or equal to 10 nm and less than or equal to 80 nm, more preferably greater than or equal to 20 nm and less than or equal to 50 nm, grown in the direction of a normal line with respect to the surface of a substrate. The microcrystalline semiconductor also means a semiconductor the electrical conductivity of which is about $10^{-7}$ S/cm to $10^{-4}$ S/cm, can be increased to about $10^1$ S/cm by valence electron control. Further, a non-single-crystal semiconductor exists in a plurality of microcrystalline semiconductors. The Raman spectrum of microcrystalline silicon, which is a typical example of a microcrystalline semiconductor, is located in lower wave numbers than 520 cm$^{-1}$ which represents a peak of the Raman spectrum of single crystal silicon. That is, the Raman spectrum of microcrystalline silicon peaks between 520 cm$^{-1}$ and 480 cm$^{-1}$ which represent single crystal silicon and amorphous silicon. The microcrystalline semiconductor includes hydrogen or halogen at least 1 at. % to terminate a dangling bond. Moreover, microcrystalline silicon contains a rare gas element such as helium, argon, krypton, or neon to further promote the lattice distortion, so that the stability is increased and a favorable microcrystalline semiconductor can be obtained. Such a microcrystalline semiconductor is disclosed in, for example, U.S. Pat. No. 4,409,134. The concept of the microcrystalline semiconductor is not fixed at only the above-described grain size and electrical conductivity; the microcrystalline semiconductor can be replaced with any other semiconductor material having equivalent property values.

The conductive layer 51 is formed to have a thickness greater than or equal to 5 nm and less than or equal to 30 nm, preferably greater than or equal to 5 nm and less than or equal to 30 nm.

In the case where the conductive layer 51 is a semiconductor layer to which the impurity element which serves as a donor is added, it is preferable that the concentrations of oxygen and nitrogen each be less than 10 times that of the impurity element which serves as a donor, typically less than $3 \times 10^{19}$ atoms/cm$^3$, preferably less than $3 \times 10^{18}$ atoms/cm$^3$; and that the concentration of carbon be less than or equal to $3 \times 10^{18}$ atoms/cm$^3$. When the semiconductor layer to which the impurity element which serves as a donor is added is a microcrystalline semiconductor layer, defect generation of the microcrystalline semiconductor layer can be suppressed by reducing the concentration of oxygen, nitrogen, and carbon mixed into the semiconductor layer to which the impurity element which serves as a donor is added. Furthermore, oxygen and nitrogen in the microcrystalline semiconductor layer hinder crystallization. Therefore, when the semiconductor layer to which the impurity element which serves as a donor is added is a microcrystalline semiconductor layer, crystallinity of the microcrystalline semiconductor layer can be increased by reducing the concentration of oxygen and nitrogen in the microcrystalline semiconductor layer relatively low and adding the impurity element which serves as a donor.

In the case where the conductive layer 51 is the semiconductor layer to which the impurity element which serves as a donor is added, an impurity element which serves as an acceptor may be added to the semiconductor layer to which the impurity element which serves as a donor is added at the same time as or after the deposition of the semiconductor layer, so that the threshold voltage can be controlled. A typical example of the impurity element which serves as an acceptor is boron, and an impurity gas of $B_2H_6$ or $BF_3$ is preferably mixed into silicon hydride at 1 ppm to 1000 ppm, preferably 1 ppm to 100 ppm. The concentration of boron is preferably set to be about one tenth that of the impurity element which serves as a donor, e.g., $1 \times 10^{14}$ atoms/cm$^3$ to $6 \times 10^{16}$ atoms/cm$^3$.

The buffer layer 53 is formed using an amorphous semiconductor layer to which halogen such as fluorine or chlorine is added. The buffer layer is formed to have a thickness of 30 nm to 200 nm, preferably 50 nm to 150 nm. As examples of the amorphous semiconductor layer, there are an amorphous silicon layer, an amorphous silicon layer including germanium, and the like.

By inclining the side surface of the buffer layer 53 at angles of 30° to 60° to the bottom surface, when the conductive layer 51 is a microcrystalline semiconductor layer, the crystallinity of the interface between the microcrystalline semiconductor layer and the amorphous semiconductor layer 55 which is in contact with the microcrystalline semiconductor layer can be increased using the microcrystalline semiconductor layer as a crystal growth seed, leading to high-speed operation of a thin film transistor and increase of the on-state current.

When the conductive layer 51 is a microcrystalline semiconductor layer, the buffer layer 53 is formed using an amorphous semiconductor layer or an amorphous semiconductor layer including hydrogen, nitrogen, or halogen, thereby preventing native oxidation of the surface of each crystal grain of the semiconductor layer to which the impurity element which serves as a donor is added. In particular, in a region where an amorphous semiconductor is in contact with microcrystal grains, a crack is likely to be caused due to local stress in the microcrystalline semiconductor layer. If a crack is exposed to oxygen, the crystal grains are oxidized to form silicon oxide. However, the oxidation of microcrystal grains can be prevented by forming the buffer layer 53 on the surface of the semiconductor layer to which the impurity element which serves as a donor is added. Therefore, generation of defects by which carriers are trapped or a region where the travel of carriers is hindered can be decreased, so that high-speed operation of the thin film transistor can be realized and the on-state current can be increased.

As examples of the amorphous semiconductor layer 55, there are an amorphous silicon layer, an amorphous silicon layer including germanium, and the like. The amorphous semiconductor layer 55 may include fluorine, chlorine, or the like. When the semiconductor layer to which the impurity element which serves as a donor is added is formed as the conductive layer 51, an amorphous semiconductor layer to which phosphorus is added at a lower concentration than the impurity element which serves as a donor in the semiconductor layer may be used as the amorphous semiconductor layer 55. The thickness of part of the amorphous semiconductor layer 55, which is overlapped with a wiring, is greater than or equal to 50 nm and less than 500 nm.

The amorphous semiconductor layer 55 covers the side surfaces of the conductive layer 51 and the buffer layer 53. In the periphery of the conductive layer 51, the gate insulating layer 09*b* is in contact with the amorphous semiconductor layer 55. With this structure, the conductive layer 51 is spaced from the pair of the impurity semiconductor layer 59 to which an impurity element imparting one conductivity type is added and the impurity semiconductor layer 61 to which an impurity element imparting one conductivity type is added, so that leak current generated between them can be reduced. It is preferable that the amorphous semiconductor layer 55 be overlapped with the buffer layer 53. The amorphous semiconductor layer 55 covering the buffer layer 53 prevents the pair of the impurity semiconductor layer 59 to which an impurity element imparting one conductivity type is added and the impurity semiconductor layer 61 to which an impurity element imparting one conductivity type is added from being in direct contact with the buffer layer 53, so that leak current can be reduced.

When the gate insulating layer 09*b* is a silicon oxide layer or a silicon nitride layer and the semiconductor layer to which the impurity element which serves as a donor is added is used as the conductive layer 51, an amorphous semiconductor layer to which phosphorus is added at a lower concentration than the impurity element which serves as a donor in the semiconductor layer may be used as the amorphous semiconductor layer 55, so that fluctuation of the threshold voltage can be reduced.

As the substrate 01, an alkali-free glass substrate manufactured by a fusion method or a float method, made of barium borosilicate glass, aluminoborosilicate glass, aluminosilicate glass, or the like; a ceramic substrate; a plastic substrate which has high heat resistance enough to withstand a process temperature of this manufacturing process; or the like can be used. Alternatively, a substrate in which an insulating layer is provided for the surface of a metal substrate made of a stainless alloy or the like may be used. When the substrate 01 is mother glass, the substrate may have any of the following sizes: 1st generation (320 mm×400 mm), 2nd generation (400 mm×500 mm), 3rd generation (550 mm×650 mm), 4th generation (680 mm×880 mm, or 730 mm×920 mm), 5th generation (1000 mm×1200 mm, or 1100 mm×1250 mm), 6th generation (1500 mm×1800 mm), 7th generation (1900 mm×2200 mm), 8th generation (2160 mm×2460 mm), 9th generation (2400 mm×2800 mm, or 2450 mm×3050 mm), 10th generation (2950 mm×3400 mm), and the like.

The gate electrode 05 is formed using a metal material. As the metal material, aluminum, chromium, titanium, tantalum, molybdenum, copper, or the like is used. As a preferable example, the gate electrode 05 is formed using aluminum or has a stack structure of aluminum and a barrier metal. As the barrier metal, a refractory metal such as titanium, molybdenum, or chromium is used. The barrier metal is preferably provided for preventing generation of hillocks and oxidation of aluminum.

The gate electrode 05 is formed to have a thickness greater than or equal to 50 nm and less than or equal to 300 nm. With the thickness of the gate electrode 05 being greater than or equal to 50 nm and less than or equal to 100 nm, disconnection due to a step, of a semiconductor layer or a wiring formed later can be prevented. With the thickness of the gate electrode 05 being greater than or equal to 150 nm and less than or equal to 300 nm, the resistance of the gate electrode 05 can be reduced and the area of the gate electrode 05 can be increased.

It is preferable that the end portion of the gate electrode 05 be processed to be tapered so as to prevent disconnection due to a step of the semiconductor layer or wiring formed thereover. Although not illustrated, in this step, a wiring connected to the gate electrode or a capacitor wiring can also be formed at the same time.

The gate insulating layers 09*a* and 09*b* each can be formed using a silicon oxide layer, a silicon nitride layer, a silicon oxynitride layer, or a silicon nitride oxide layer with a thickness of 50 nm to 150 nm. Here, a silicon nitride layer or a silicon nitride oxide layer is formed as the gate insulating layer 09*a* and a silicon oxide layer or a silicon oxynitride layer is formed as the gate insulating layer 09*b* to form a stack structure. Instead of the two-layer structure, the gate insulating layer may alternatively be formed to have a single layer structure of a silicon oxide layer, a silicon nitride layer, a silicon oxynitride layer, or a silicon nitride oxide layer.

With the gate insulating layer 09*a* being formed using a silicon nitride layer or a silicon nitride oxide layer, adhesion between the substrate 01 and the gate insulating layer 09a is increased, which leads to prevention of diffusion of impurities from the substrate 01 into the conductive layer 51, the buffer layer 53, and the amorphous semiconductor layer 55 when a glass substrate is used as the substrate 01 and to prevention of oxidation of the gate electrode 05. That is, film peeling can be prevented, and electric characteristics of a thin film transistor formed later can be improved. It is preferable that the thickness of each of the gate insulating layers 09a and 09b be greater than or equal to 50 nm because reduction in coverage caused by surface roughness of the gate electrode 05 can be reduced.

In this specification, the silicon oxynitride layer means a layer that contains higher composition of oxygen than nitrogen and shows concentration ranges of oxygen, nitrogen, silicon, and hydrogen from 50 at. % to 70 at. %, 0.5 at. % to 15 at. %, 25 at. % to 35 at. %, and 0.1 at. % to 10 at. %, respectively in the measurement using Rutherford backscattering spectrometry (RBS) and hydrogen forward scattering (HFS). Further, the silicon nitride oxide layer means a layer that contains higher composition of nitrogen than oxygen, and the measurement using RBS and HFS shows the concentration ranges of oxygen, nitrogen, silicon, and hydrogen from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

In the case of forming an n-channel thin film transistor, to the pair of the impurity semiconductor layer 59 to which an impurity element imparting one conductivity type is added and the impurity semiconductor layer 61 to which an impurity element imparting one conductivity type is added, phosphorus may be added as a typical impurity element; an impurity gas such as $PH_3$ may be added to silicon hydride. On the other hand, in the case of forming a p-channel thin film transistor, boron may be added as a typical impurity element; an impurity gas such as $B_2H_6$ may be added to silicon hydride. The impurity semiconductor layers 59 and 61 to which the impurity element imparting one conductivity type is added include phosphorus or boron at a concentration of from $1\times10^{19}$ atoms/$cm^3$ to $1\times10^{21}$ atoms/$cm^3$, thereby having an ohmic contact with the wirings 63 and 65, so that the impurity semiconductor layers 59 and 61 to which the impurity element imparting one conductivity type is added each function as a source region or a drain region. Each of the pair of the impurity semiconductor layer 59 to which the impurity element imparting one conductivity type is added and the impurity semiconductor layer 61 to which the impurity element imparting one conductivity type is added can be formed using a microcrystalline semiconductor layer or an amorphous semiconductor layer. Each of the pair of the impurity semiconductor layer 59 to which the impurity element imparting one conductivity type is added and the impurity semiconductor layer 61 to which the impurity element imparting one conductivity type is added is formed to have a thickness greater than or equal to 10 nm and less than or equal to 100 nm, preferably greater than or equal to 30 nm and less than or equal to 50 nm. By reducing the thickness of each of the pair of the impurity semiconductor layer 59 to which the impurity element imparting one conductivity type is added and the impurity semiconductor layer 61 to which the impurity element imparting one conductivity type is added, the throughput can be improved.

One of the pair of the impurity semiconductor layer 59 to which the impurity element imparting one conductivity type is added and the impurity semiconductor layer 61 to which the impurity element imparting one conductivity type is added, here the impurity semiconductor layer 61 to which the impurity element imparting one conductivity type is added, has a certain distance (a distance a) between the conductive layer 51 and the semiconductor layer 61 without being overlapped with the conductive layer 51. With the structure such that the distance a is shorter than the distance (a distance b) between an end portion of the conductive layer 51 and an end portion of the impurity semiconductor layer 59 to which the impurity element imparting one conductivity type is added, the off-state current of the thin film transistor is reduced and the on-state current thereof is increased, which enables high-speed operation.

It is preferable that the wirings 63 and 65 each be formed using a single layer of aluminum, copper, or an aluminum alloy to which an element for preventing migration, an element for improving heat resistance, or an element for preventing hillocks, such as copper, silicon, titanium, neodymium, scandium, or molybdenum, is added; or a stacked layer thereof. Alternatively, the wirings 63 and 65 each may have a stacked structure in which a layer in contact with the pair of the impurity semiconductor layer 59 to which the impurity element imparting one conductivity type is added and the impurity semiconductor layer 61 to which the impurity element imparting one conductivity type is added is formed using titanium, tantalum, molybdenum, tungsten, or nitride of such an element, and aluminum or an aluminum alloy is stacked thereover. Further alternatively, the wirings 63 and 65 each may have a stacked structure in which titanium, tantalum, molybdenum, tungsten, or nitride of such an element is sandwiched between top and bottom surfaces of aluminum or an aluminum alloy. Here, the wirings 63 and 65 each can have a stacked structure of a titanium layer, an aluminum layer, and a titanium layer.

Figure 1B:
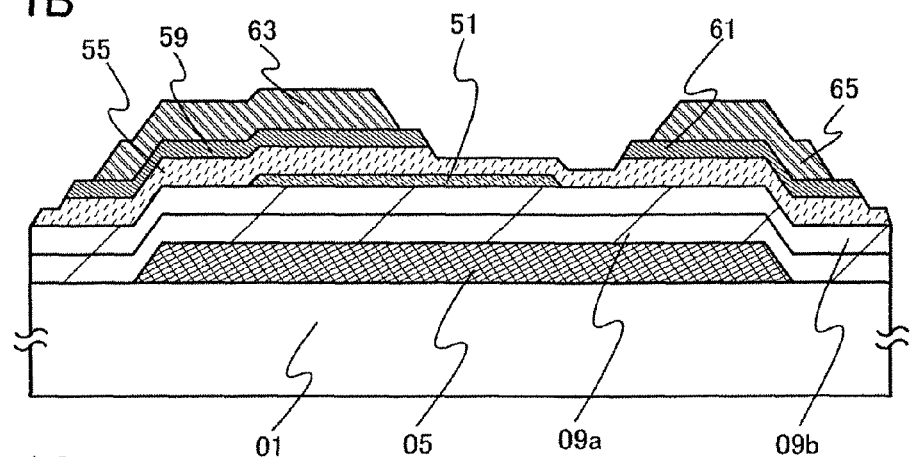

As illustrated in FIG. 1B, the amorphous semiconductor layer 55 may be formed in contact with the conductive layer 51 without providing the buffer layer 53. The buffer layer 53 is not formed, whereby throughput can be improved.

The thin film transistor illustrated in FIG. 1A has a structure in which the amorphous semiconductor layer 55 is not in contact with the wirings 63 and 65 and the wirings 63 and 65 are formed over the buffer layer 53, with the pair of the impurity semiconductor layer 59 to which the impurity element imparting one conductivity type is added and the impurity semiconductor layer 61 to which the impurity element imparting one conductivity type is added interposed therebetween, respectively. Alternatively, as illustrated in FIG. 1C, a structure in which a side surface of the amorphous semiconductor layer 55 is in contact with the wiring 63 or 65 can be employed.

In the thin film transistor described in this embodiment mode, a first thin film transistor Tr01 and a second thin film transistor Tr02 are connected. The first thin film transistor Tr01 includes the gate electrode 05, the gate insulating layers 09a and 09b, the conductive layer 51, the buffer layer 53, the amorphous semiconductor layer 55, the impurity semiconductor layer 59 to which the impurity element imparting one conductivity type is added, and the wiring 63. The second thin film transistor Tr02 includes the gate electrode 05, the gate insulating layers 09a and 09b, the amorphous semiconductor layer 55, the impurity semiconductor layer 61 to which the impurity element imparting one conductivity type is added, and the wiring 65.

The second thin film transistor Tr02 is a thin film transistor in which an amorphous semiconductor layer is used for a channel formation region. On the other hand, the region where carriers flow in the first thin film transistor Tr01 is the conductive layer 51; the electrical conductivity of the region is 0.1 to 1.8 S/cm, and the resistivity thereof is smaller than that of a normal amorphous semiconductor layer or microcrystalline semiconductor layer. Therefore, while a positive voltage which is lower than the threshold voltage of the second thin film transistor Tr02 is applied to the gate electrode 05, a large number of carriers are excited in the conductive layer 51. On applying a positive voltage which is higher than the threshold voltage of the second thin film transistor Tr02 to the gate electrode 05, the second thin film transistor Tr02 is turned on, so that the large number of carriers excited in the conductive layer 51 flow into the wiring 63 in the first thin film transistor Tr01 or the wiring 65 in the second thin film transistor Tr02.

Channel length L of the thin film transistor of this embodiment mode is the sum of the distance a between one of end portions of the conductive layer 51 and one of end portions of the impurity semiconductor layer 61 to which the impurity element imparting one conductivity type is added, and the distance b between one of the end portions of the conductive layer 51 and one of end portions of the impurity semiconductor layer 59 to which the impurity element imparting one conductivity type is added. With respect to the channel length L, the distance a between one of the end portions of the conductive layer 51 and one of the end portions of the impurity semiconductor layer 61 to which the impurity element imparting one conductivity type is added is made to be short whereas the distance b between one of the end portions of the conductive layer 51 and one of the end portions of the impurity semiconductor layer 59 to which the impurity element imparting one conductivity type is added is made to be long, so that the on-state current is increased and the field-effect mobility is also increased.

Since the channel length of the second thin film transistor Tr02 (i.e., the distance a) can be reduced according to this embodiment mode, it is preferable that the thickness of the gate insulating film be reduced so as to prevent the short-channel effect in the second thin film transistor Tr02.

On the other hand, when a negative voltage is applied to the gate electrode 05, even if carriers are excited in the conductive layer 51, the second thin film transistor Tr02 obstructs a flow of the off-state current because the second thin film transistor Tr02 is formed using an amorphous semiconductor layer: thus, the off-state current can be reduced.

Accordingly, the thin film transistor described in this embodiment mode is a thin film transistor in which the on-current and field-effect mobility are large whereas the off-current is low.

Further, the surface of the amorphous semiconductor layer 55 by which the source region is connected to the drain region, a back-channel, has roughness and is long, so that a leak-path for flowing through the surface of the amorphous semiconductor layer 55 between the source region and the drain region becomes long. As a result of this, the leak current flowing through the surface of the amorphous semiconductor layer 55 can be reduced.

Further, the amorphous semiconductor layer 55 is formed between the gate electrode 05 and the pair of impurity semiconductor layer 59 to which the impurity element imparting one conductivity type is added and the impurity semiconductor layer 61 to which the impurity element imparting one conductivity type is added, in addition to the gate insulating layers 09a and 09b. Therefore, the distance between the gate electrode 05 and the pair of the impurity semiconductor layer 59 to which the impurity element imparting one conductivity type is added and the impurity semiconductor layer 61 to which the impurity element imparting one conductivity type is added is increased. Hence, parasitic capacitance to be generated between the gate electrode 05 and the pair of the impurity semiconductor layer 59 to which the impurity element imparting one conductivity type is added and the impurity semiconductor layer 61 to which the impurity element imparting one conductivity type is added can be decreased. In particular, a thin film transistor in which voltage drop on the drain side is decreased can be formed. Therefore, the response speed of pixels can be increased in a display device using this structure. In particular, in the case of a thin film transistor formed in each pixel of a liquid crystal display device, the response speed of a liquid crystal material can be increased because voltage drop of the drain voltage can be reduced.

[Embodiment Mode 2]

In this embodiment mode, other shapes of the conductive layer 51 and the buffer layer 53 will be described with reference to FIG. 2.

Figure 2:
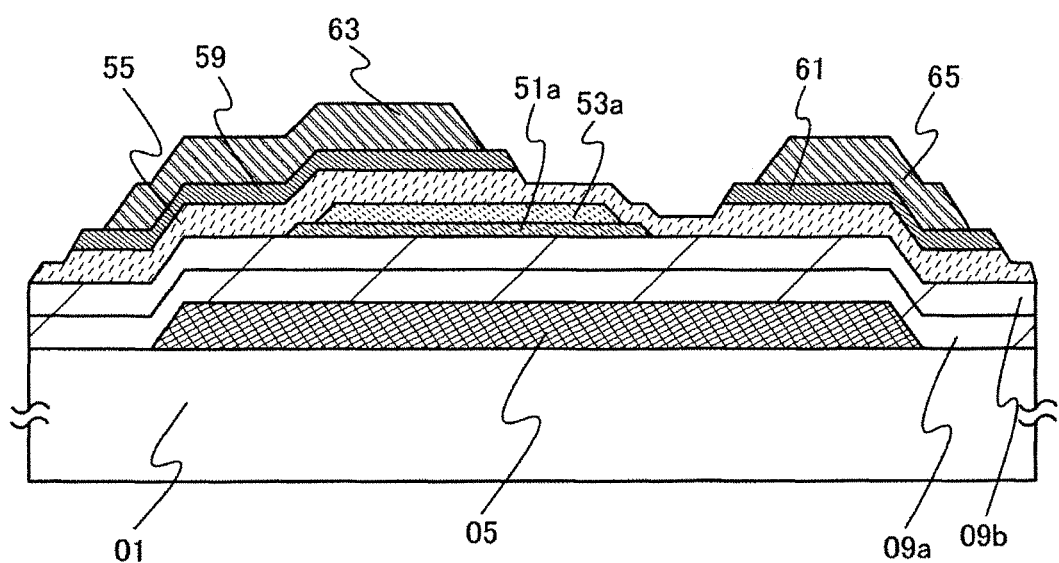
FIG. 2 is a cross-sectional view illustrating a thin film transistor according to an embodiment mode of the present invention.

A thin film transistor illustrated in FIG. 2 is a thin film transistor in which a buffer layer 53a is formed inside of a conductive layer 51a provided when seen in the cross-sectional structure. With such a structure, when the conductive layer 51a is a microcrystalline semiconductor layers, a metal silicide layer, or a metal layer, the crystallinity of the amorphous semiconductor layer 55 which is in contact with the conductive layer 51a can be increased using the microcrystalline semiconductor layer, the metal silicide layer, or the metal layer as a crystal growth seed, leading to high-speed operation of a thin film transistor and increase of the on-state current.

Further, although not illustrated in the drawing, in any of FIGS. 1A to 1C and FIG. 2, the sidewalls of the conductive layer 51 and the buffer layer 53 and the sidewalls of the conductive layer 51a and the buffer layer 53a may be perpendicular to the bottom surface, or the side surface thereof may be inclined at an angle of 80° to 100°, preferably 85° to 95° to the bottom surface. By making the sidewalls of the conductive layer 51 and the buffer layer 53 and the sidewalls of the conductive layer 51a and the buffer layer 53a almost perpendicular to the bottom surface, the area occupied by a thin film transistor can be reduced. Accordingly, the aperture ratio of a transmissive display device using the thin film transistor in each pixel can be increased.

This embodiment mode can be combined with Embodiment Mode 1.

[Embodiment Mode 3]

In this embodiment mode, other modes of the buffer layer will be described with reference to FIGS. 3A and 3B. In this embodiment mode, a buffer layer 52 is formed of an insulating layer.

Figure 3A:
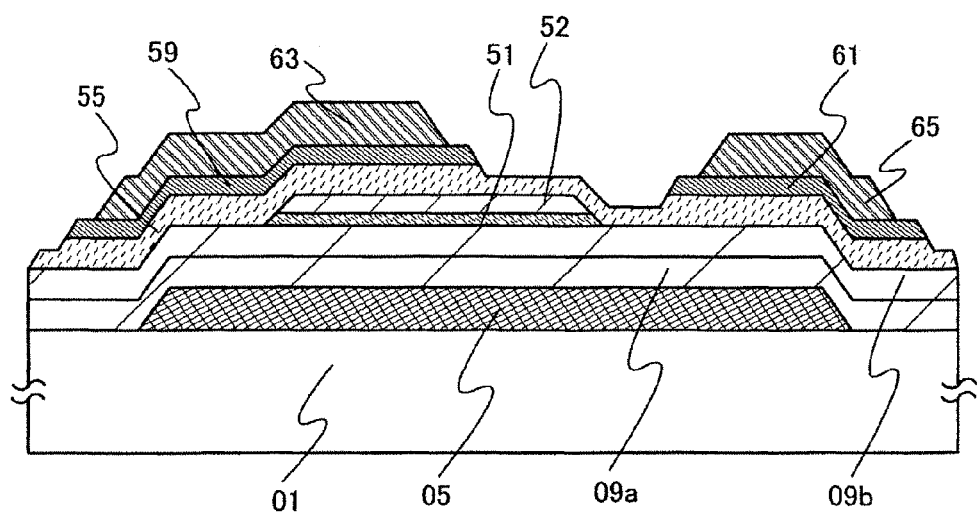
FIGS. 3A and 3B are cross-sectional views each illustrating a thin film transistor according to an embodiment mode of the present invention.

In a thin film transistor illustrated in FIG. 3A, the gate electrode 05 is formed over the substrate 01, the gate insulating layers 09a and 09b are formed over the gate electrode 05, the conductive layer 51 is formed over the gate insulating layer 09b, and the buffer layer 52 is formed over the conductive layer 51. The buffer layer 52 is almost overlapped with the conductive layer 51. Further, the amorphous semiconductor layer 55 which covers the side surfaces of the conductive layer 51 and the buffer layer 52 and the top surface of the buffer layer 52 is formed. The pair of the impurity semiconductor layer 59 to which the impurity element imparting one conductivity type is added and the impurity semiconductor layer 61 to which the impurity element imparting one conductivity type is added is formed over the amorphous semiconductor layer 55, and the wirings 63 and 65 are formed over the pair of the impurity semiconductor layer 59 to which the impurity element imparting one conductivity type is added and the impurity semiconductor layer 61 to which the impurity element imparting one conductivity type is added, respectively. In addition, in the pair of the impurity semiconductor layer 59 to which the impurity element imparting one conductivity type is added and the impurity semiconductor layer 61 to which the impurity element imparting one conductivity type is added, the impurity semiconductor layer 61 is not overlapped with the buffer layer 52, whereas one end portion of the impurity semiconductor layer 59 is overlapped with the buffer layer 52.

The buffer layer 52 is formed of an insulating layer in this embodiment mode. Typically, the buffer layer 52 is formed using an inorganic insulating layer such as a silicon nitride layer, a silicon oxide layer, a silicon nitride oxide layer, or a silicon oxynitride layer. Alternatively, the buffer layer 52 is formed using an organic insulating layer of polyimide, acrylic resin, epoxy resin, or the like. The buffer layer 52 is formed to have a thickness of 10 nm to 150 nm. With the buffer layer 52 formed using an insulating layer, the leak current flowing from the pair of the impurity semiconductor layer 59 to which the impurity element imparting one conductivity type is added and the impurity semiconductor layer 61 to which the impurity element imparting one conductivity type is added, through the amorphous semiconductor layer 55, can be stemmed, so that leak current can be reduced. Further, the off-state current can be reduced.

Figure 3B:
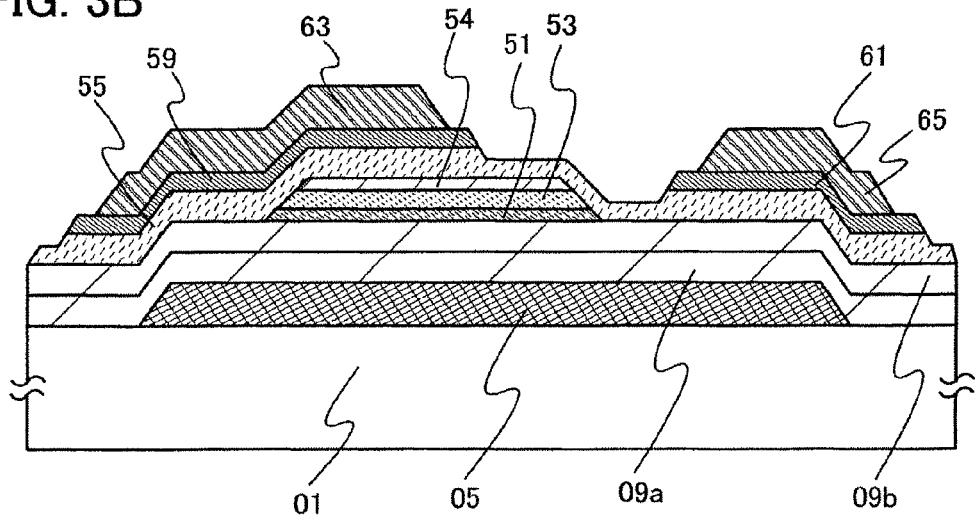

Alternatively, as illustrated in FIG. 3B, the buffer layer 53 formed using a semiconductor layer is formed over the conductive layer 51, and a buffer layer 54 formed using an insulating layer is formed over the buffer layer 53. The buffer layer 54 is formed using an inorganic insulating layer such as a silicon nitride layer, a silicon oxide layer, a silicon nitride oxide layer, or a silicon oxynitride layer. Alternatively, the buffer layer 54 is formed using polyimide, acrylic resin, epoxy resin, or another organic insulating layer.

Although the buffer layer 53 formed using a semiconductor layer is thicker than the buffer layer 54 formed using an insulating layer in FIG. 3B, the buffer layer 54 may be thicker than the buffer layer 53. The total thickness of the buffer layer 53 and the buffer layer 54 is 30 nm to 200 nm, preferably 50 nm to 150 nm. In the case where the conductive layer 51 is a semiconductor layer to which the impurity element which serves as a donor is added, with the buffer layer 53 formed using a semiconductor layer over the semiconductor layer to which the impurity element which serves as a donor is added, the oxidation of the semiconductor layer to which the impurity element which serves as a donor is added can be reduced and reduction of resistivity of the semiconductor layer to which the impurity element which serves as a donor is added can be suppressed. Further, with the buffer layer 54 formed using an insulating layer over the buffer layer 53 formed using a semiconductor layer, the leak current flowing from the pair of the impurity semiconductor layer 59 to which the impurity element imparting one conductivity type is added and the impurity semiconductor layer 61 to which the impurity element imparting one conductivity type is added, through the amorphous semiconductor layer 55, can be stemmed, so that leak current can be reduced. Further, the off-current can be reduced.

This embodiment mode can be combined with any one of Embodiment Modes 1 and 2.

[Embodiment Mode 4]

In this embodiment mode, other modes of the conductive layer 51 will be described.

Figure 4A:
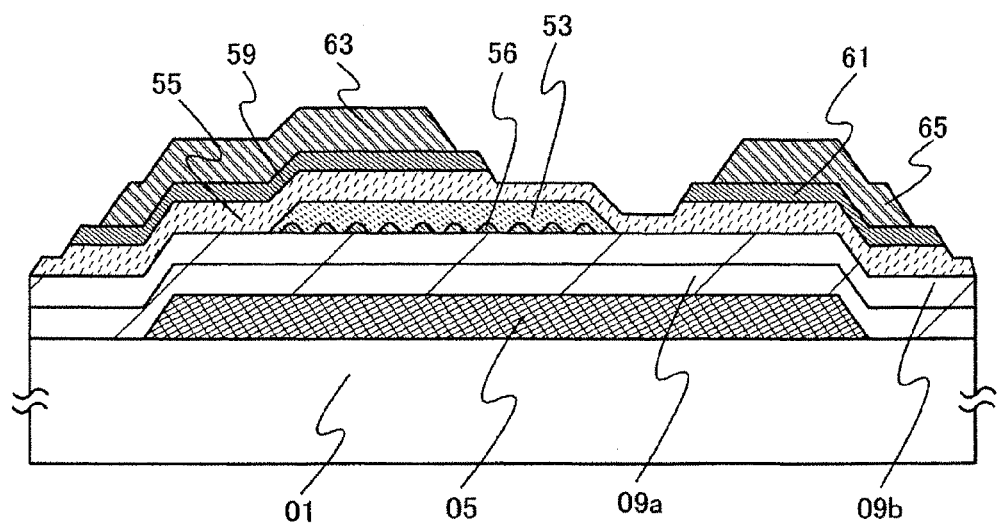
FIGS. 4A and 4B are cross-sectional views each illustrating a thin film transistor according to an embodiment mode of the present invention.

In a thin film transistor illustrated in FIG. 4A, the gate electrode 05 is formed over the substrate 01, the gate insulating layers 09a and 09b are formed over the gate electrode 05, conductive particles 56 are formed over the gate insulating layer 09b, and the buffer layer 53 is formed over the conductive particles 56 and the gate insulating layer 09b. The buffer layer 53 is almost overlapped with the conductive particles 56. Further, the amorphous semiconductor layer 55 which covers the side and top surfaces of the buffer layer 53 is formed. The pair of the impurity semiconductor layer 59 to which the impurity element imparting one conductivity type is added and the impurity semiconductor layer 61 to which the impurity element imparting one conductivity type is added is formed over the amorphous semiconductor layer 55, and the wirings 63 and 65 are formed over the pair of the impurity semiconductor layer 59 to which the impurity element imparting one conductivity type is added and the impurity semiconductor layer 61 to which the impurity element imparting one conductivity type is added, respectively. In addition, in the pair of the impurity semiconductor layer 59 to which the impurity element imparting one conductivity type is added and the impurity semiconductor layer 61 to which the impurity element imparting one conductivity type is added, neither of both end portions of the impurity semiconductor layer 61 is overlapped with the buffer layer 53, whereas one end portion of the impurity semiconductor layer 59 is overlapped with the buffer layer 53.

The conductive particles 56 can be formed using conductive particles formed using an appropriate conductive material for the conductive layer described in any embodiment mode. In the case where the conductive particles 56 each are a semiconductor crystal grain to which the impurity element which serves as a donor is added, the semiconductor crystal grain to which the impurity element which serves as a donor is added can be formed using silicon, silicon germanium having the higher composition of silicon than germanium ($Si_xGe_{1-x}$, $0.5<X<1$), or the like. By forming the conductive particles 56 such that the size is 1 nm to 30 nm and the density is less than $1\times10^{13}/cm^2$, preferably less than $1\times10^{10}/cm^2$, crystal grains can be formed separately, so that the adhesion between the buffer layer 53 formed later and the gate insulating layer 09b can be increased. As a result, the yield of a thin film transistor can be improved.

In the case where the conductive particles 56 each are a metal particle, a metal nitride particle, a metal carbide particle, a metal boride particle, or a metal silicide particle, the conductive particles 56 can be formed by a sputtering method, an evaporation method, a droplet discharge method, or a CVD method.

In the case where the conductive particles 56 are semiconductor crystal grains to which the impurity element which serves as a donor is added, the semiconductor crystal grains to which the impurity element which serves as a donor is added can be formed as follows: a microcrystalline semiconductor layer to which the impurity element which serves as a donor is added is formed by a sputtering method or a plasma CVD method, and is exposed to hydrogen plasma, so that an amorphous semiconductor in the microcrystalline semiconductor layer to which the impurity element which serves as a donor is added is etched. Alternatively, the semiconductor crystal grains to which the impurity element which serves as a donor is added can be formed by forming a microcrystalline semiconductor layer or a crystalline semiconductor layer to which the impurity element which serves as a donor is added by a sputtering method or a plasma CVD method to have a thickness where crystal grains are not consecutive but are dispersed.

Instead of the conductive particles 56, separated conductive layers may be formed by forming a conductive layer over the gate insulating layer 09b and etching using a resist mask formed by a photolithography process.

Figure 4B:
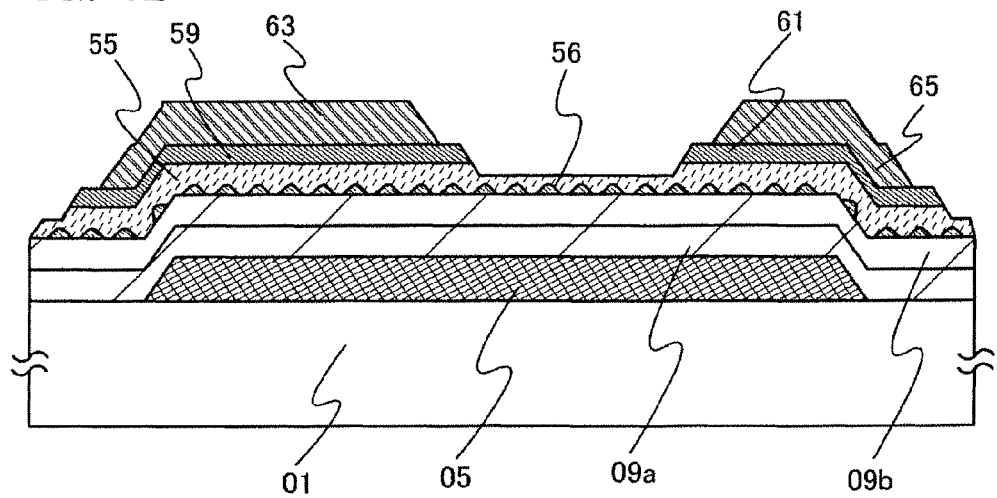

In a thin film transistor illustrated in FIG. 4B, the gate electrode 05 is formed over the substrate 01, the gate insulating layers 09a and 09b are formed over the gate electrode 05, the conductive particles 56 are formed over the gate insulating layer 09b, and the amorphous semiconductor layer 55 is formed without forming the buffer layer 53 over the conductive particles 56 and the gate insulating layer 09b. The pair of the impurity semiconductor layer 59 to which the impurity element imparting one conductivity type is added and the impurity semiconductor layer 61 to which the impurity element imparting one conductivity type is added is formed over the amorphous semiconductor layer 55, and the wirings 63 and 65 are formed over the pair of the impurity semiconductor layer 59 to which the impurity element imparting one conductivity type is added and the impurity semiconductor layer 61 to which the impurity element imparting one conductivity type is added, respectively.

Since the conductive particles 56 are not consecutive and the amorphous semiconductor layer 55 is formed therebetween, increase of off-state current can be reduced even when the conductive particles 56 are formed so as to be overlapped with the pair of the impurity semiconductor layer 59 to which the impurity element imparting one conductivity type is added and the impurity semiconductor layer 61 to which the impurity element imparting one conductivity type is added. Since a buffer layer is not formed, the number of photomasks can be reduced by one, which improves the throughput and reduces the cost.

This embodiment mode can be combined with any one of Embodiment Modes 1 to 3.

[Embodiment Mode 5]

In this embodiment mode, other modes of the amorphous semiconductor layer will be described.

Figure 5:
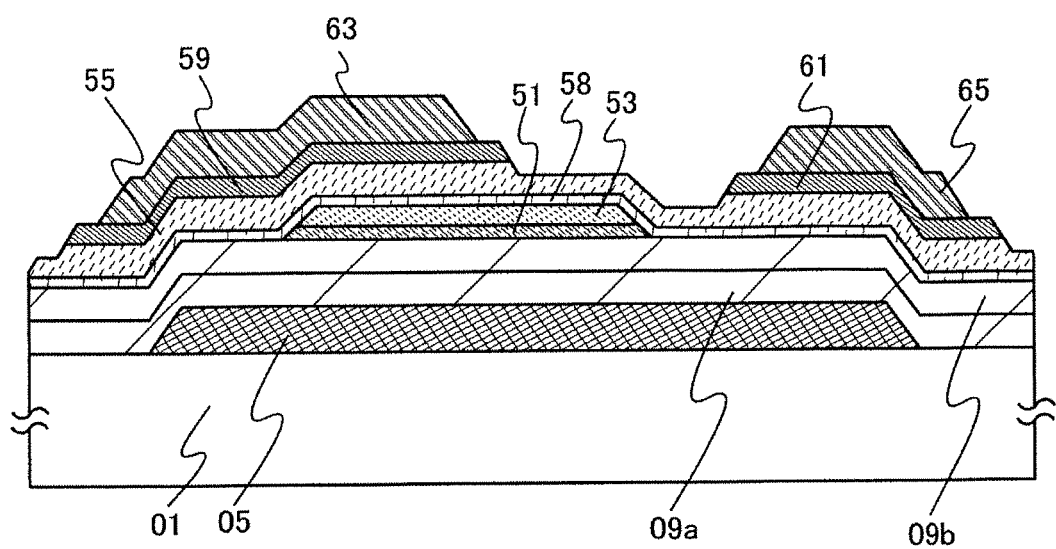
FIG. 5 is a cross-sectional view illustrating a manufacturing process of a thin film transistor according to an embodiment mode of the present invention.

In a thin film transistor illustrated in FIG. 5, the gate electrode 05 is formed over the substrate 01, the gate insulating layers 09a and 09b are formed over the gate electrode 05, the conductive layer 51 is formed over the gate insulating layer 09b, and the buffer layer 53 is formed over the conductive layer 51. The buffer layer 53 is almost overlapped with the conductive layer 51. Further, a microcrystalline semiconductor layer 58 which covers the side surfaces of the conductive layer 51 and the buffer layer 53 and the top surface of the buffer layer 53 is formed, and the amorphous semiconductor layer 55 is formed over the microcrystalline semiconductor layer 58. The shapes of the microcrystalline semiconductor layer 58 and the amorphous semiconductor layer 55 are almost the same. The pair of the impurity semiconductor layer 59 to which the impurity element imparting one conductivity type is added and the impurity semiconductor layer 61 to which the impurity element imparting one conductivity type is added is formed over the amorphous semiconductor layer 55, and the wirings 63 and 65 are formed over the pair of the impurity semiconductor layer 59 to which the impurity element imparting one conductivity type is added and the impurity semiconductor layer 61 to which the impurity element imparting one conductivity type is added, respectively. In addition, in the pair of the impurity semiconductor layer 59 to which the impurity element imparting one conductivity type is added and the impurity semiconductor layer 61 to which the impurity element imparting one conductivity type is added, the impurity semiconductor layer 61 is not overlapped with the buffer layer 53 and the conductive layer 51, whereas one end portion of the impurity semiconductor layer 59 is overlapped with the buffer layer 53 and the conductive layer 51.

The microcrystalline semiconductor layer 58 can be formed using a microcrystalline silicon layer, a microcrystalline silicon germanium layer, or a microcrystalline germanium layer. The impurity element which serves as a donor may be added to the microcrystalline semiconductor layer 58 at a lower concentration than the concentration of the impurity element which serves as a donor included in a semiconductor layer which can be used for the conductive layer 51. With the impurity element which serves as a donor added at a lower concentration, the threshold voltage of the thin film transistor can be controlled.

In addition, the microcrystalline semiconductor layer 58 may be provided in contact with the conductive layer 51 without providing the buffer layer 53 over the conductive layer 51.

By reducing the thickness of the microcrystalline semiconductor layer 58 to 5 nm to 30 nm, preferably 10 nm to 20 nm, the off-state current of the thin film transistor can be kept low. Further, in the thin film transistor in which the amorphous semiconductor layer 55 is formed between the microcrystalline semiconductor layer 58 and the pair of the impurity semiconductor layer 59 to which the impurity element imparting one conductivity type is added and the impurity semiconductor layer 61 to which the impurity element imparting one conductivity type is added, the off-state current can be reduced as compared to a thin film transistor formed using a microcrystalline semiconductor layer. Further, with the microcrystalline semiconductor layer 58, the resistivity of which is lower than that of an amorphous semiconductor layer, provided between the amorphous semiconductor layer 55 and the gate insulating layer 09b, flowing of carriers is facilitated and high-speed operation of the thin film transistor can be performed.

Further, by forming a silicon oxide layer or a silicon oxynitride layer as the gate insulating layer 09b and a microcrystalline silicon layer as the microcrystalline semiconductor layer 58, fluctuation of the threshold voltage can be reduced as compared to the case in which the gate insulating layer 09b is a silicon nitride layer and the amorphous semiconductor layer is formed without forming a microcrystalline semiconductor layer.

This embodiment mode can be combined with any one of Embodiment Modes 1 to 4.

[Embodiment Mode 6]

In this embodiment mode, another mode of the structure of the thin film transistor will be described.

Figure 6A:
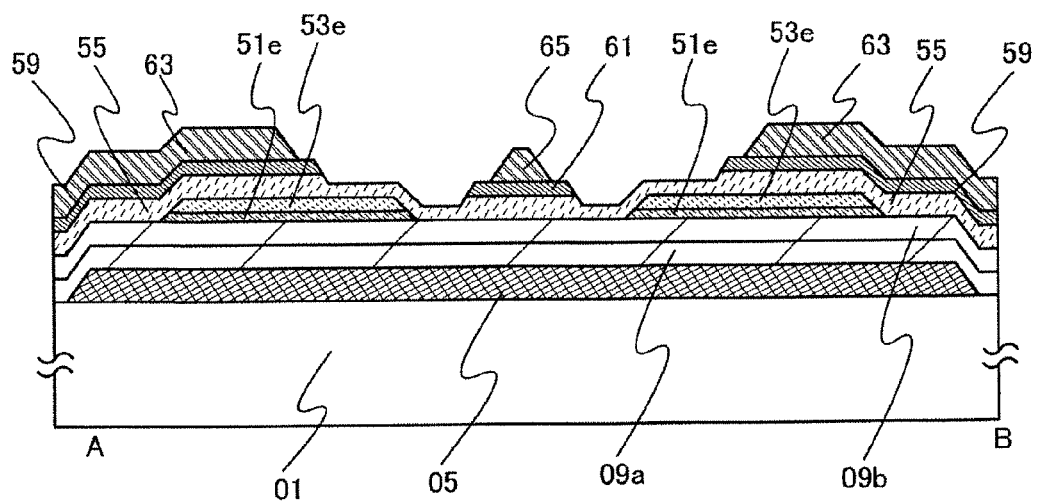
FIGS. 6A and 6B are a cross-sectional view and a top view illustrating a thin film transistor according to an embodiment mode of the present invention.

In a thin film transistor illustrated in FIG. 6A, the gate electrode 05 is formed over the substrate 01, the gate insulating layers 09a and 09b are formed over the gate electrode 05, a conductive layer 51e is formed over the gate insulating layer 09b, and a buffer layer 53e is formed over the conductive layer 51e. The buffer layer 53e is almost overlapped with the conductive layer 51e. Further, the amorphous semiconductor layer 55 which covers the side surfaces of the conductive layer 51e and the buffer layer 53e and the top surfaces of the buffer layer 53e is formed. The pair of the impurity semiconductor layers 59 to which the impurity element imparting one conductivity type is added and the impurity semiconductor layer 61 to which the impurity element imparting one conductivity type is added is formed over the amorphous semiconductor layer 55, and the wirings 63 and 65 are formed over the pair of the impurity semiconductor layers 59 to which the impurity element imparting one conductivity type is added and the impurity semiconductor layer 61 to which the impurity element imparting one conductivity type is added, respectively. In addition, in the pair of the impurity semiconductor layer 59 to which the impurity element imparting one conductivity type is added and the impurity semiconductor layer 61 to which the impurity element imparting one conductivity type is added, the impurity semiconductor layer 61 is not overlapped with the buffer layer 53e, whereas one end portion of the impurity semiconductor layer 59 is overlapped with the buffer layer 53e.

Figure 6B:
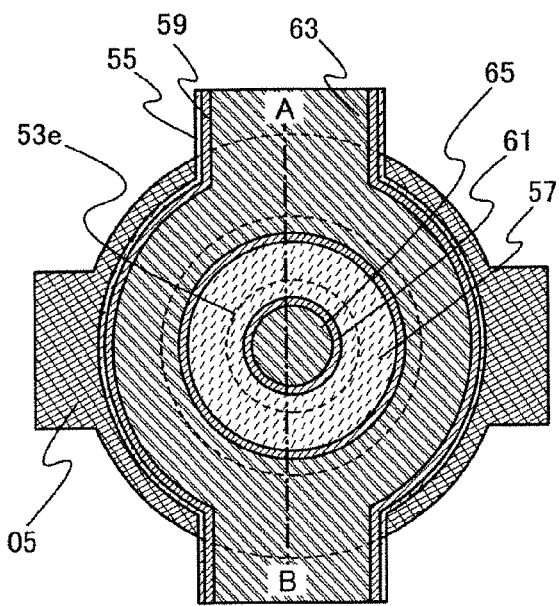

In the thin film transistor illustrated in FIGS. 6A and 6B, the channel formation region is provided in a ring, where the source region and the drain region face each other. Specifically, one of the pair of the impurity semiconductor layer 59 to which the impurity element imparting one conductivity type is added and the impurity semiconductor layer 61 to which the impurity element imparting one conductivity type is added, the impurity semiconductor layer 59 is in a ring; and the other of the pair of the impurity semiconductor layer 59 to which the impurity element imparting one conductivity type is added and the impurity semiconductor layer 61 to which the impurity element imparting one conductivity type is added, the impurity semiconductor layer 61 is in a circle. That is, one of the source region or the drain region surrounds the other of the source region or the drain region with a certain space interposed therebetween. Therefore, when the wiring 63 is a source wiring and the wiring 65 is a drain wiring, the curved channel formation region enables the fluctuation of the threshold voltage to be reduced, so that reliability of characteristics of the thin film transistor can be increased. Further, the facing area between the source region and the drain region is larger than that of the thin film transistor in which the source wiring and the drain wiring are parallel to each other, so that the area of the thin film transistor can be made smaller when the thin film transistor with the same channel width is formed.

This embodiment mode can be combined with any one of Embodiment Modes 1 to 5.

[Embodiment Mode 7]

In this embodiment mode, a manufacturing process of a thin film transistor as illustrated in FIG. 1A, in which operation at high speed can be performed and the on-state current is high and the off-state current is low, will be described.

A thin film transistor having an amorphous semiconductor layer or a microcrystalline semiconductor layer, which is of an n type, is more suitable for use in a driver circuit than that of a p type because it has a higher field-effect mobility. It is preferable that all thin film transistors formed over the same substrate have the same polarity, in order to reduce the number of steps. Here, description is made using an n-channel thin film transistor.

The manufacturing process of the thin film transistor illustrated in FIG. 1A is described with reference to FIGS. 7A to 7E, FIGS. 8A to 8C, FIGS. 9A to 9D, and FIG. 10. Note that the left sides of FIGS. 7A to 7E and FIGS. 8A to 8C are each a cross-sectional view taken along line A-B of FIG. 10, which illustrates a cross section of a region where the thin film transistor is formed; and the right sides thereof are each a cross-sectional view taken along line C-D of FIG. 10, which illustrates a cross section of a region where the gate wiring and the source wiring are intersected to each other in a pixel.

Figure 7A:
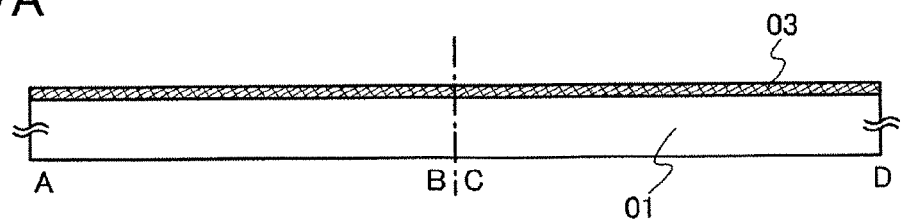
FIGS. 7A to 7E are cross-sectional views illustrating a manufacturing process of the thin film transistor according to the embodiment mode of the present invention.

As illustrated in FIG. 7A, a conductive layer 03 is formed over a substrate 01. The conductive layer 03 can be formed using the material used for the gate electrode 05 which is described in Embodiment Mode 1. The conductive layer 03 is formed by a sputtering method, a CVD method, a plating method, a printing method, a droplet discharge method, or the like.

Figure 7B:
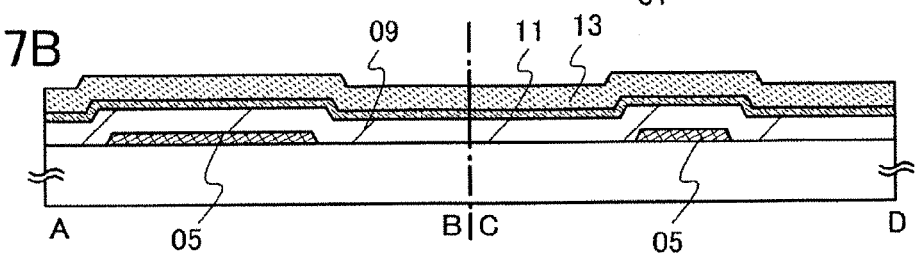

Next, with a resist mask which is formed by a photolithography step using a first photomask, the conductive layer 03 is etched into a desired shape to form a gate wiring 05, as illustrated in FIG. 7B. After that, the resist mask is removed.

Then, a gate insulating layer 09 is formed over the gate wiring 05 and the substrate 01. The gate insulating layer 09 can be formed using the material used for the gate insulating layers 09a and 09b which is described in Embodiment Mode 1. The gate insulating layer 09 is formed by a CVD method, a sputtering method, or the like.

Next, a conductive layer 11 and a buffer layer 13 are stacked over the gate insulating layer 09. Hereinafter, a film formation method in the case where the conductive layer 11 is a semiconductor layer to which the impurity element which serves as a donor is added is described.

In a reaction chamber of a plasma CVD apparatus, hydrogen and a deposition gas including silicon or germanium are mixed, and a microcrystalline semiconductor layer or an amorphous semiconductor layer is formed by glow discharge plasma. The microcrystalline semiconductor layer is formed on the condition that the flow rate of the deposition gas including silicon or germanium is reduced by addition of hydrogen whose flow rate is 10 to 2000 times, preferably 50 to 200 times higher than that of the deposition gas. The amorphous semiconductor layer is formed on the condition that the flow rate of the deposition gas including silicon or germanium is reduced by addition of hydrogen whose flow rate is 0 to 10 times, preferably 1 to 5 times higher than that of the deposition gas. The temperature for heating the substrate is 100° C. to 300° C., preferably 120° C. to 220° C. Further, a gas including phosphorus, arsenic, antimony, or the like is mixed in addition to the above source gas so that the semiconductor layer to which the impurity element which serves as a donor is added can be formed. Here, as the semiconductor layer to which the impurity element which serves as a donor is added, a microcrystalline silicon layer including phosphorus can be formed by glow discharge plasma, with phosphine in addition to silane and hydrogen and/or a rare gas mixed.

In the step of forming the semiconductor layer to which the impurity element which serves as a donor is added, glow discharge plasma is generated by applying high-frequency powers of about 3 MHz to 30 MHz, typically 13.56 MHz or 27.12 MHz; or very high-frequency powers of about greater than 30 MHz and less than or equal to 300 MHz, typically 60 MHz.

As typical examples of the deposition gas including silicon or germanium, $SiH_4$, $Si_2H_6$, $GeH_4$, $Ge_2H_6$, and the like can be given.

Note that instead of forming the semiconductor layer to which the impurity element which serves as a donor is added, an insulating layer to which the impurity element which serves as a donor is added may be formed as the gate insulating layer 09, and a semiconductor layer which does not include the impurity element which serves as a donor may be formed thereover. For example, a silicon oxide layer, a silicon nitride layer, a silicon oxynitride layer, a silicon nitride oxide layer, or the like including the impurity element which serves as a donor (phosphorus, arsenic, or antimony) can be formed as the gate insulating layer. In addition, when the gate insulating layer 09 has a stack structure, the impurity element which serves as a donor may be added to a layer in contact with the microcrystalline semiconductor layer or a layer in contact with the substrate 01.

As a method for forming the insulating layer to which the impurity element which serves as a donor is added as the gate insulating layer 09, the insulating layer may be formed using a gas including the impurity element which serves as a donor, in addition to the source gas of the insulating layer. For example, a silicon nitride layer including phosphorus can be formed by a plasma CVD method using silane, ammonia, and phosphine. On the other hand, by a plasma CVD method using silane, dinitrogen monoxide, ammonia, and phosphine, a silicon oxynitride layer including phosphorus can be formed.

Alternatively, before the gate insulating layer 09 is formed, a gas including the impurity element which serves as a donor may be fed into the reaction chamber of the film formation apparatus so that the impurity element which serves as a donor is adsorbed on the surface of the substrate 01 and the inner wall of the reaction chamber. After that, an insulating layer is deposited while the impurity element which serves as a donor is being taken in to form the gate insulating layer 09, so that the insulating layer to which the impurity element which serves as a donor is added can be formed.

Further alternatively, before the semiconductor layer to which the impurity element which serves as a donor is added is formed, the gas including the impurity element which serves as a donor may be fed into the reaction chamber of the film formation apparatus so that the impurity element which serves as a donor is adsorbed on the gate insulating layer 09 and the inner wall of the reaction chamber. After that, a semiconductor layer is deposited while the impurity element which serves as a donor is being taken in to deposit the semiconductor layer, so that the semiconductor layer to which the impurity element which serves as a donor is added can be formed.

In the case where the conductive layer 11 is a metal layer, a metal nitride layer, a metal carbide layer, a metal boride layer, or a metal silicide layer, the conductive layer is formed by a sputtering method, an evaporation method, a CVD method, a droplet discharge method, a printing method, or the like.

Note that when the gate insulating layer 09 is a silicon oxide layer or a silicon oxynitride layer, the surface of the gate insulating layer 09 may be subjected to a plasma treatment before the conductive layer 11 is formed. Typically, plasma such as hydrogen plasma, ammonia plasma, $H_2O$ plasma, helium plasma, argon plasma, or neon plasma is exposed to the surface of the gate insulating layer 09. Consequently, a surface defect of the gate insulating layer can be reduced. Typically, dangling bonds of the surface of the gate insulating layer 09 can be terminated. After that, a conductive layer or an amorphous semiconductor layer is formed, so that a defect in the interface with the conductive layer or the amorphous semiconductor can be reduced. Consequently, the number of carriers captured due to the defect can be reduced, and thus, it is possible to have high on-state current.

Next, the buffer layer 13 is formed. When a semiconductor layer is formed as the buffer layer 13, an amorphous semiconductor layer can be formed by a plasma CVD method using a deposition gas including silicon or germanium. Alternatively, by dilution of a deposition gas including silicon or germanium with one or plural kinds of rare gases selected from helium, argon, krypton, or neon, an amorphous semiconductor layer can be formed. Further alternatively, with the use of hydrogen at a flow rate which is greater than or equal to 0 time and less than or equal to 10 times, more preferably greater than or equal to 1 time and less than or equal to 5 times higher than that of a silane gas, an amorphous semiconductor layer including hydrogen can be formed. In addition, a halogen such as fluorine or chlorine may be added to the above hydrogenated semiconductor layer.

Alternatively, as the amorphous semiconductor layer, an amorphous semiconductor layer can be formed by sputtering with hydrogen or a rare gas using a semiconductor such as silicon or germanium as a target.

When an insulating layer is formed as the buffer layer 13, it can be formed in a manner similar to that of the gate insulating layer 09. Alternatively, polyimide, an acrylic resin, an epoxy resin, or a raw material of other organic insulating layer is applied and baked so that the insulating layer can be formed.

In addition, when the conductive layer 11 is the semiconductor layer to which the impurity element which serves as a donor is added, the buffer layer 13 is preferably formed at a temperature of 300° C. to 400° C. by a plasma CVD method. By this film formation treatment, hydrogen is supplied to the semiconductor layer to which the impurity element which serves as a donor is added, which brings the same effect as hydrogenation of the semiconductor layer to which the impurity element which serves as a donor is added. In other words, hydrogen is diffused in the semiconductor layer to which the impurity element which serves as a donor is added by depositing the buffer layer 13 over the semiconductor layer to which the impurity element which serves as a donor is added so that the dangling bonds can be terminated.

When the semiconductor layer to which the impurity element which serves as a donor is added is formed of a microcrystalline semiconductor layer, surfaces of crystal grains contained in the semiconductor layer to which the impurity element which serves as a donor is added can be prevented from natural oxidation by forming an amorphous semiconductor layer, particularly, an amorphous semiconductor layer including hydrogen, nitrogen, or a halogen as the buffer layer 13. In particular, in a region where an amorphous semiconductor is in contact with microcrystal grains, a crack is likely to be caused due to distortion of crystal lattice. If a crack is exposed to oxygen, the crystal grain is oxidized to form silicon oxide. However, oxidization of microcrystal grains can be prevented by forming an amorphous semiconductor layer on the surface of the semiconductor layer to which the impurity element which serves as a donor is added. In a display device, typically in a liquid crystal display device, including a thin film transistor to which high voltage (e.g., about 15 V) is applied, when the buffer layer is formed to have a large thickness, drain withstand voltage becomes high. Thus, deterioration of the thin film transistor can be reduced even when high voltage is applied to the thin film transistor.

Figure 7C:
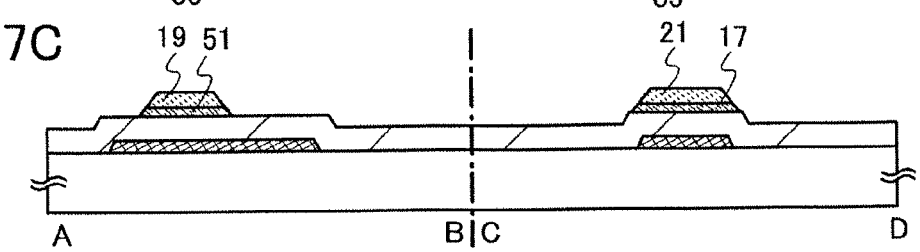

Next, a resist mask is formed by a photolithography step using a second photomask after a resist is applied over the buffer layer 13. With the resist mask, the buffer layer 13 and the conductive layer 11 are etched into desired shapes to form a conductive layer 51 and a buffer layer 19 in a region for forming a thin film transistor, as illustrated in FIG. 7C. In addition, in the region where the gate wiring and the source wiring are intersected to each other, a conductive layer 17 and a buffer layer 21 are formed. After that, the resist mask is removed.

Figure 7D:
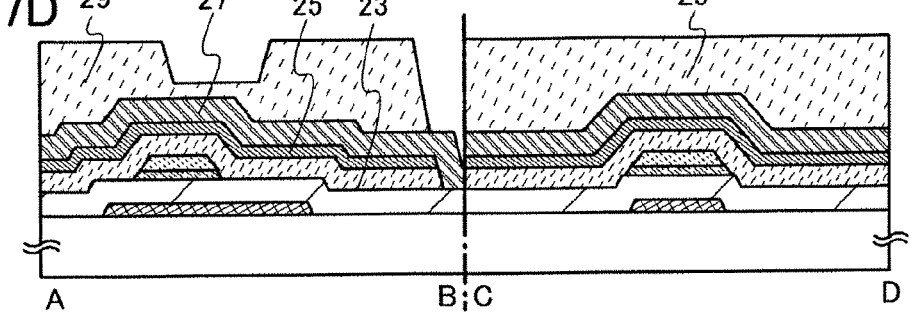

Next, as illustrated in FIG. 7D, an amorphous semiconductor layer 23 and an impurity semiconductor layer 25 to which the impurity element imparting one conductivity type is added are formed.

The amorphous semiconductor layer 23 can be formed in a manner similar to that in the case of forming the buffer layer 13 using a semiconductor layer.

Note that at the time of forming the amorphous semiconductor layer 23, a dense amorphous semiconductor layer can be formed without crystallization by the following manner: the inner wall of the film formation chamber of the plasma CVD apparatus is precoated with a silicon nitride oxide layer, a silicon nitride layer, a silicon oxide layer, or a silicon oxynitride layer, and the flow rate of the deposition gas is reduced to form a semiconductor layer by addition of hydrogen whose flow rate is 10 to 2000 times, preferably 50 to 200 times higher than that of the deposition gas, so that the film is deposited while oxygen, nitrogen, or the like of the inner wall of the film formation chamber is being taken in the film. Note that the semiconductor layer contains a microcrystal in some cases. In addition, when the gate insulating layer 09 is a silicon nitride layer, the amorphous semiconductor layer formed by the film formation method prevents film peeling and increases the yield.

Here, in order to form an n-channel thin film transistor, the impurity semiconductor layer 25 to which the impurity element imparting one conductivity type is added is formed by a plasma CVD method using phosphine and a deposition gas including silicon or germanium. In addition, in the case of forming a p-channel thin film transistor, it is formed by a plasma CVD method using diborane and a deposition gas including silicon or germanium.

In the steps of forming the conductive layer 11, the buffer layer 13, the amorphous semiconductor layer 23, and the impurity semiconductor layer 25 to which the impurity element imparting one conductivity type is added, glow discharge plasma is generated by applying high-frequency powers of about 3 MHz to 30 MHz, typically 13.56 MHz or 27.12 MHz; or very high-frequency powers of about greater than 30 MHz and less than or equal to 300 MHz, typically 60 MHz.

A conductive layer 27 can be formed using the material used for the wirings 63 and 65 which is described in Embodiment Mode 1. The conductive layer 27 is formed by a CVD method, a sputtering method, a printing method, a droplet discharge method, or the like.

Next, a resist is applied over the conductive layer 27. As the resist, a positive type resist or a negative type resist can be used. Here, a positive type resist is used.

Then, the resist is irradiated with light, using a multi-tone mask as a third photomask, and then developed to form a resist mask 29.

Now, light exposure using the multi-tone mask is described with reference to FIGS. 9A to 9D.

A multi-tone mask can achieve three levels of light exposure to obtain an exposed portion, a half-exposed portion, and an unexposed portion, and one-time exposure and development step allows a resist mask with regions having plural thicknesses (typically, two kinds of thicknesses) to be formed. Thus, the number of photomasks can be reduced by using a multi-tone mask.

Figure 9A:
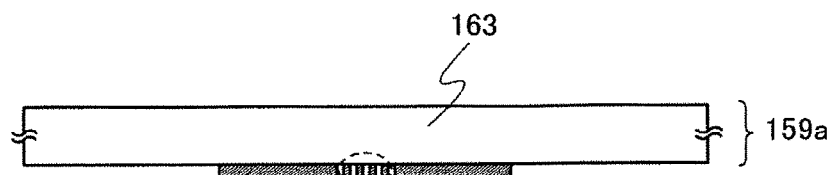
FIGS. 9A to 9D are views illustrating multi-tone masks applicable to the embodiment mode of the present invention.
Figure 9B:
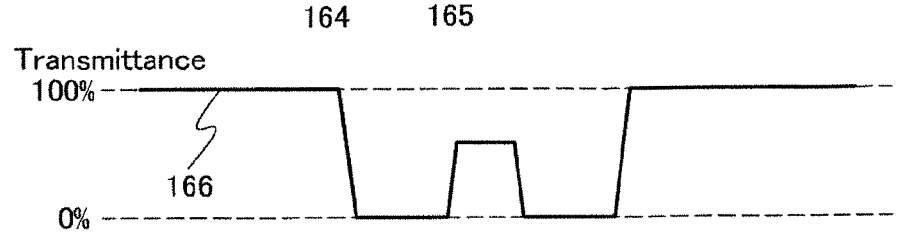
Figure 9C:
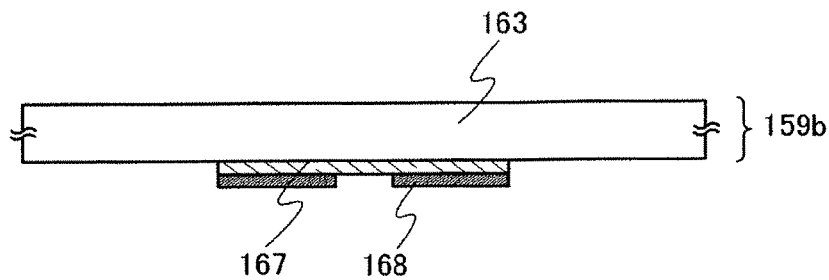
Figure 10:
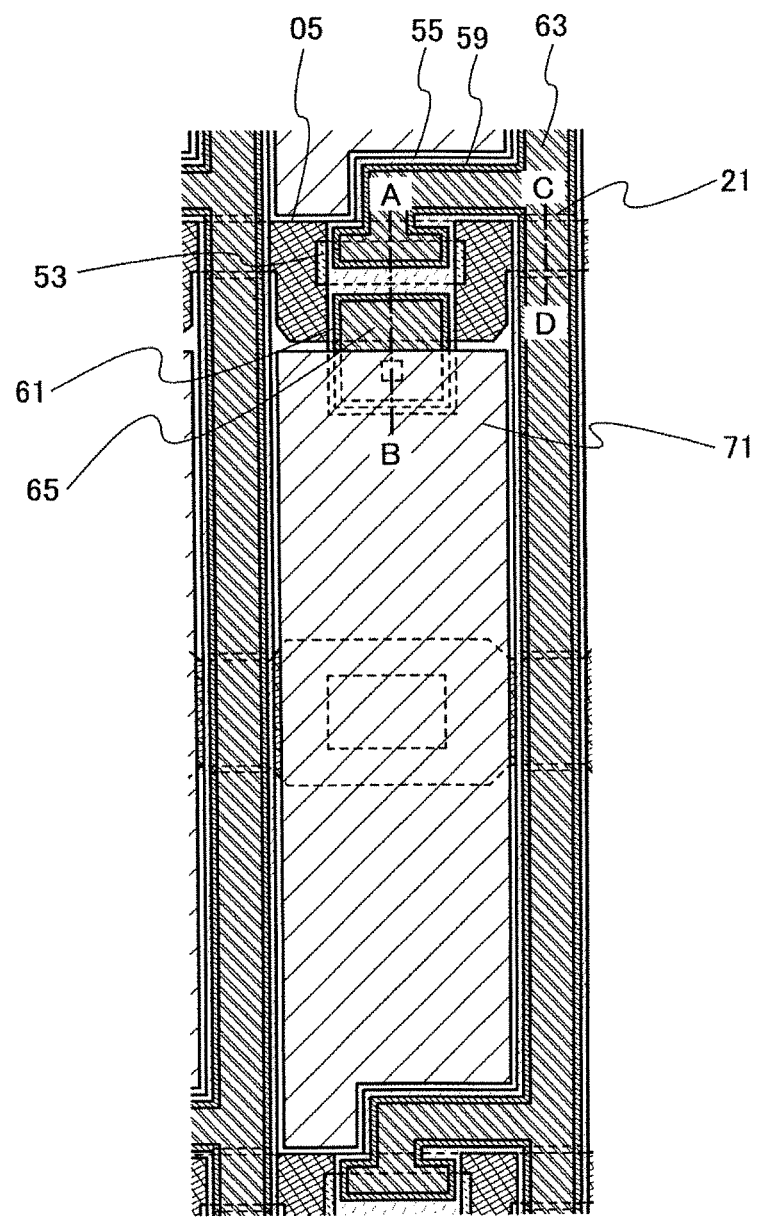
FIG. 10 is a top view illustrating the manufacturing process of the thin film transistor according to the embodiment mode of the present invention.

Typical examples of a multi-tone mask include a gray-tone mask 159a as illustrated in FIG. 9A and a half-tone mask 159b as illustrated in FIG. 9C.

As illustrated in FIG. 9A, the gray-tone mask 159a includes a light transmitting substrate 163, and a light-blocking portion 164 and a diffraction grating 165 formed thereover. The light transmittance of the light-blocking portion 164 is 0%. On the other hand, the diffraction grating 165 has a light transmitting portion in a slit form, a dot form, a mesh form, or the like with intervals, which are less than or equal to the resolution limit for light used for the exposure; thus, amount of the transmitted light can be controlled. The diffraction grating 165 can be in a slit form, a dot form, or a mesh form with either regular or irregular intervals.

For the light transmitting substrate 163, a light transmitting substrate such as a quartz substrate can be used. The light blocking portion 164 and the diffraction grating 165 can be formed using a light blocking material such as chromium or chromium oxide, which absorbs light.

When the gray-tone mask 159a is irradiated with light for exposure, light transmittance of amount of the transmitted light 166 of the light blocking portion 164 is 0% and that of a region where neither the light blocking portion 164 nor the diffraction grating 165 is provided is 100%, as illustrated in FIG. 9B. Amount of the transmitted light of the diffraction grating 165 can be controlled in a range of 10% to 70%. The light transmittance of the diffraction grating 165 can be controlled with an interval or a pitch of slits, dots, or meshes of the diffraction grating 165.

As illustrated in FIG. 9C, the half-tone mask 159b includes a light transmitting substrate 163, and a semi-transmissive portion 167 and a light blocking portion 168 formed thereover. The semi-transmissive portion 167 can be formed using MoSiN, MoSi, MoSiO, MoSiON, CrSi, or the like. The light blocking portion 168 can be formed using a light blocking material such as chromium or chromium oxide, which absorbs light.

Figure 9D:
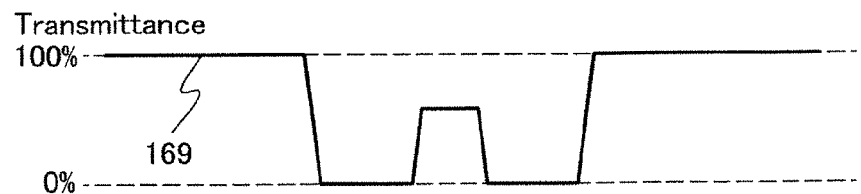

When the half-tone mask 159b is irradiated with light for exposure, light transmittance of amount of the transmitted light 169 of the light blocking portion 168 is 0% and that of a region where neither the light blocking portion 168 nor the semi-transmissive portion 167 is provided is 100%, as illustrated in FIG. 9D. Further, the light transmission in the semi-transmissive portion 167 can be controlled within the range of 10% to 70%. Amount of the transmitted light of the semi-transmissive portion 167 can be controlled with a material of the semi-transmissive portion 167.

After the light exposure using the multi-tone mask, development is performed, whereby the resist mask 29 with regions having different thicknesses can be formed, as illustrated in FIG. 7D.

Figure 7E:
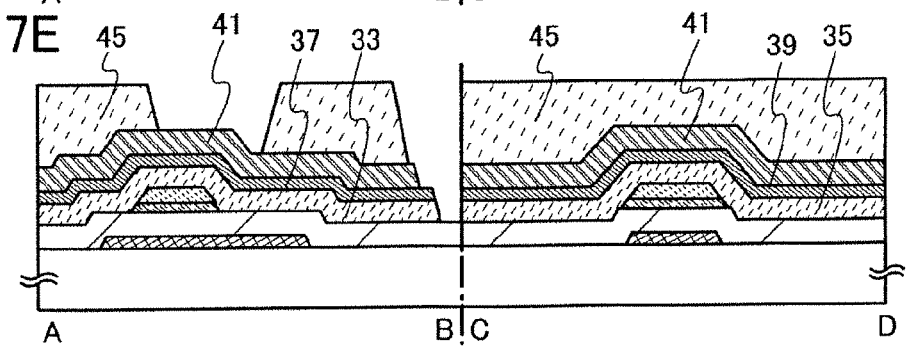

Next, by the resist mask 29, the amorphous semiconductor layer 23, the impurity semiconductor layer 25 to which the impurity element imparting one conductivity type is added, and the conductive layer 27 are etched to be separated. Consequently, a pair of an amorphous semiconductor layer 33 and an amorphous semiconductor layer 35, a pair of a semiconductor layer 37 to which the impurity element imparting one conductivity type is added and a semiconductor layer 39 to which the impurity element imparting one conductivity type is added, and a conductive layer 41, as illustrated in FIG. 7E, can be formed.

Next, ashing is performed on the resist mask 29. Consequently, the area and the thickness of the resist are reduced. At this time, the resist in a region with a small thickness (a region overlapping with part of the gate wiring 05) is removed to form a separated resist mask 45, as illustrated in FIG. 7E.

Figure 8A:
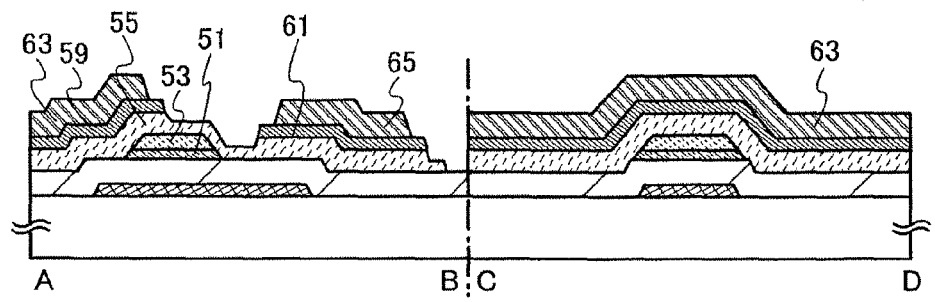
FIGS. 8A to 8C are cross-sectional views illustrating the manufacturing process of the thin film transistor according to the embodiment mode of the present invention.

Subsequently, the conductive layer 41 is etched to be separated using the resist mask 45. Consequently, a source wiring 63 and a drain electrode 65 as illustrated in FIG. 8A can be formed. When wet etching is performed on the conductive layer 41 with the resist mask 45, the conductive layer 41 is etched isotropically. Consequently, the source wiring 63 and the drain electrode 65 which are smaller than the resist mask 45 in area can be formed.

In a portion where the gate wiring 05 and the impurity semiconductor layer 39 to which the impurity element imparting one conductivity type is added are intersected to each other, the conductive layer 17, the buffer layer 21, and the amorphous semiconductor layer 35, in addition to the gate insulating layer 09, are formed; and the distance between the gate wiring 05 and the impurity semiconductor layer 39 to which the impurity element imparting one conductivity type is added is increased. Therefore, the parasitic capacitance in the region where the gate wiring 05 and the impurity semiconductor layer 39 to which the impurity element imparting one conductivity type is added are intersected to each other can be reduced.

Next, with the use of the resist mask 45, the semiconductor layer 37 to which the impurity element imparting one conductivity type is added is etched to form a pair of an impurity semiconductor layer 59 to which the impurity element imparting one conductivity type is added and an impurity semiconductor layer 61 to which the impurity element imparting one conductivity type is added. Note that in the etching step, part of the amorphous semiconductor layer 33 is also etched to be an amorphous semiconductor layer 55.

Here, end portions of the source wiring 63 and the drain electrode 65 are misaligned with end portions of the pair of the impurity semiconductor layer 59 to which the impurity element imparting one conductivity type is added and the impurity semiconductor layer 61 to which the impurity element imparting one conductivity type is added. The end portions of the pair of the impurity semiconductor layer 59 to which the impurity element imparting one conductivity type is added and the impurity semiconductor layer 61 to which the impurity element imparting one conductivity type is added are positioned outside the end portions of the source wiring 63 and the drain electrode 65. After that, the resist mask 45 is removed.

Next, the exposed amorphous semiconductor layer 55 may be irradiated with $H_2O$ plasma. Typically, irradiation with radicals which are generated by plasma discharging of water that is vaporized is performed on exposed portions of the amorphous semiconductor layer 55, the pair of the impurity semiconductor layer 59 to which the impurity element imparting one conductivity type is added and the impurity semiconductor layer 61 to which the impurity element imparting one conductivity type is added, the source wiring 63, and the drain electrode 65, so that operation at high speed of a thin film transistor can be performed and the on-state current can be further enhanced. Further, the off-state current can be reduced.

Through the above-described process, a thin film transistor can be formed.

Figure 8B:
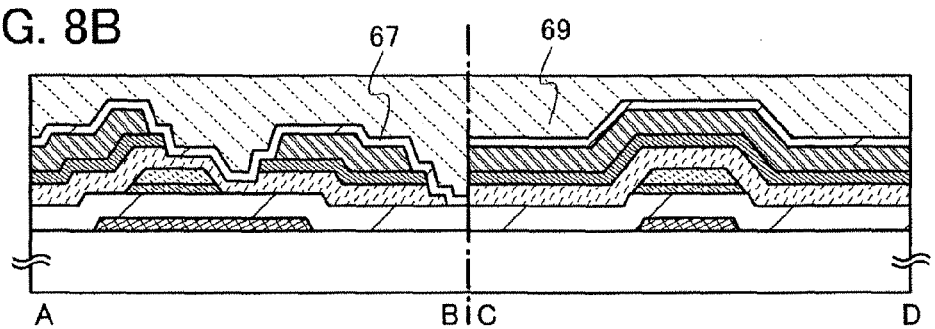

Next, as illustrated in FIG. 8B, a protective insulating layer 67 is formed over the source wiring 63, the drain electrode 65, and the gate insulating layer 09. The protective insulating layer 67 can be formed using a silicon nitride layer, a silicon nitride oxide layer, a silicon oxide layer, or a silicon oxynitride layer. The protective insulating layer 67 prevents intrusion of a contaminating impurity such as an organic matter, a metal, or water vapor included in the air; thus, a dense film is preferably used for the protective insulating layer 67.

Figure 8C:
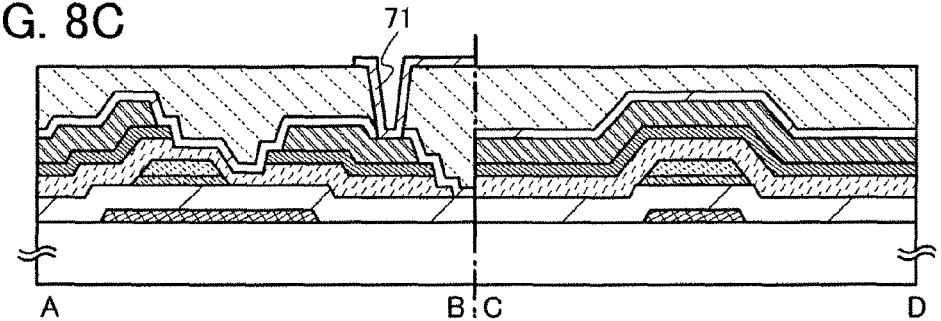

Next, a planarizing layer 69 may be formed over the protective insulating layer 67. The planarizing layer 69 can be formed using an organic insulating layer of an acrylic resin, polyimide, an epoxy resin, a siloxane polymer, or the like. Here, the planarizing layer 69 is formed using a photosensitive organic resin. Then, the planarizing layer 69 is exposed to light using a fourth photomask and developed so as to expose the protective insulating layer 67, as illustrated in FIG. 8C. Then, the protective insulating layer 67 is etched using the planarizing layer 69 so as to form a contact hole which exposes part of the drain electrode 65.

Next, a pixel electrode 71 is formed in the contact hole. Here, a conductive layer is formed over the planarizing layer 69 and then a resist is applied over the conductive layer. Then, with a resist mask which is formed by a photolithography step using a fifth photomask, the conductive layer is etched so as to form the pixel electrode 71.

For the pixel electrode 71, a light transmitting conductive material such as indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

Further, the pixel electrode 71 can be formed using a conductive composition including a conductive macromolecule (also referred to as a conductive polymer), as well. The pixel electrode 71 formed using the conductive composition preferably has a sheet resistance which is less than or equal to 10000 $\Omega$/square and a transmittance which is greater than or equal to 70% at a wavelength of 550 nm. Further, the resistance of the conductive macromolecule included in the conductive composition is preferably less than or equal to 0.1 $\Omega\cdot$cm.

As the conductive macromolecule, a so-called $\pi$-electron conjugated conductive macromolecule can be used. For example, polyaniline or a derivative thereof, polypyrrole or a derivative thereof, polythiophene or a derivative thereof, a copolymer of more than two kinds of them, and the like can be given.

Here, as the pixel electrode 71, an ITO film is formed by a sputtering method and then a resist is applied over the ITO film. Next, the resist is exposed to light and developed using a sixth photomask to form a resist mask. Then, the pixel electrode 71 is formed by etching the ITO film using the resist mask. After that, the resist mask is removed. Note that FIG. 8C corresponds to the cross-sectional views taken along lines A-B and C-D of FIG. 10. Although, in the thin film transistor illustrated in FIG. 10, a top view shape of a channel formation region where a source region and a drain region face to each other is parallel, a thin film transistor whose top view shape in a channel formation region is a C (U) shape may be manufactured instead of the thin film transistor illustrated in FIG. 10.

As described above, a thin film transistor in which the off-state current is low, the on-state current is high, and operation at high speed can be performed can be manufactured. In addition, an element substrate having the thin film transistor as a switching element of a pixel electrode can be manufactured. Note that in this embodiment mode, the number of photomasks for etching the conductive layer and the buffer layer into predetermined shapes is increased by one as compared to a general manufacturing process of an inverted staggered thin film transistor. However, the number of photomasks can be reduced by one in this process because the multi-tone mask is used for the photomasks for etching the pair of the amorphous semiconductor layer, the pair of the impurity semiconductor layers to which the impurity element imparting one conductivity type is added, and the wiring. Therefore, the number of masks is not increased as is in the whole manufacturing process.

[Embodiment Mode 8 ]

In this embodiment mode, a manufacturing process of a thin film transistor will be described, in which operation at higher speed operation can be performed and the on-state current is higher as compared to a thin film transistor including an amorphous semiconductor layer for a channel formation region, and the off-state current is lower as compared to a thin film transistor including a microcrystalline semiconductor layer for a channel formation region.

Figure 11A:
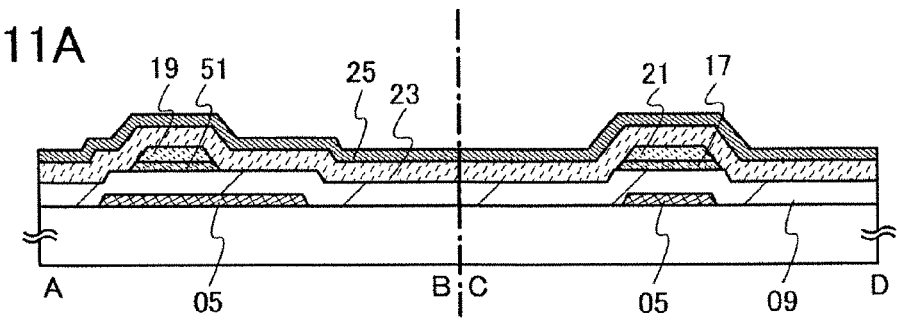
FIGS. 11A to 11E are cross-sectional views illustrating a manufacturing process of the thin film transistor according to an embodiment mode of the present invention.
Figure 11B:
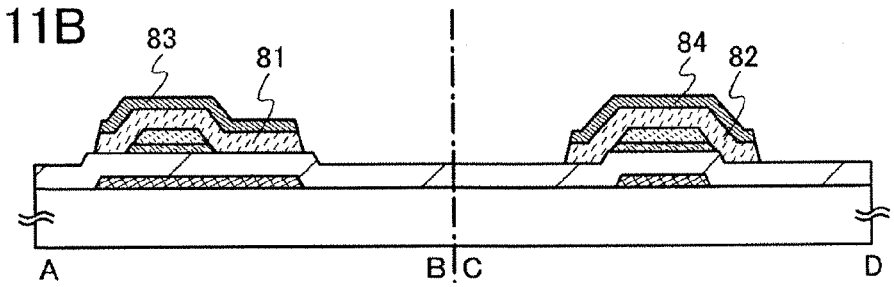
Figure 11C:
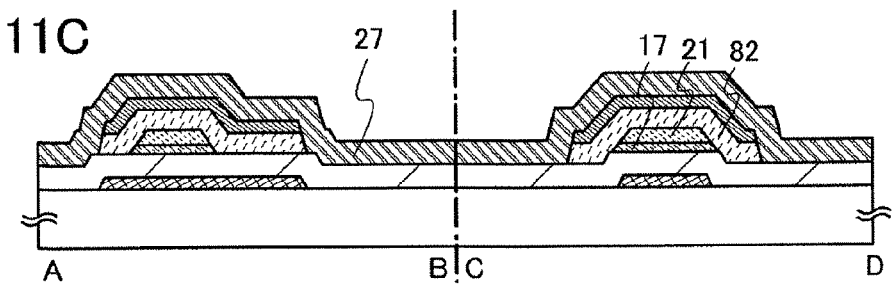
Figure 11D:
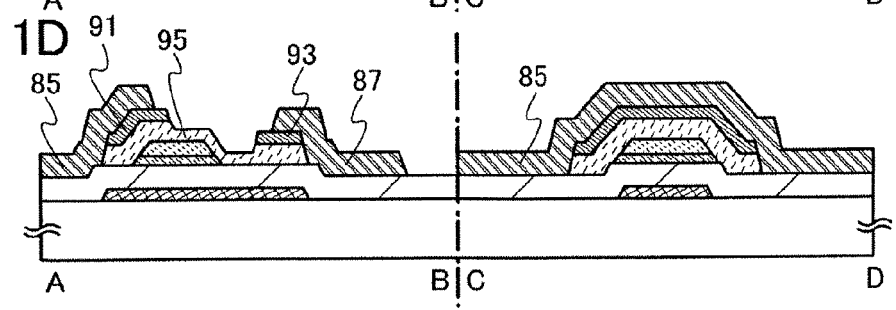
Figure 11E:
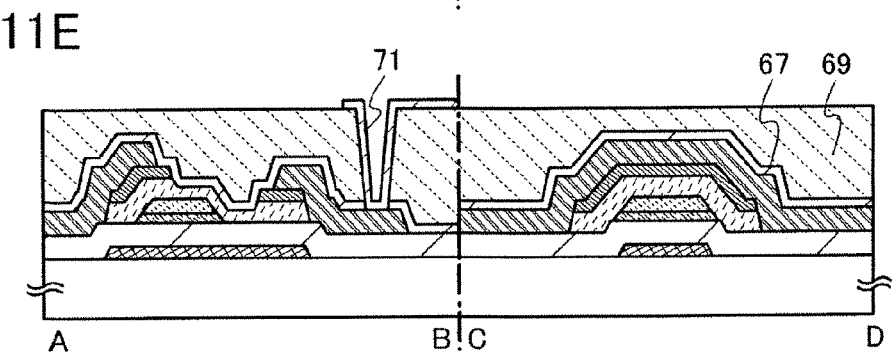
Figure 12:
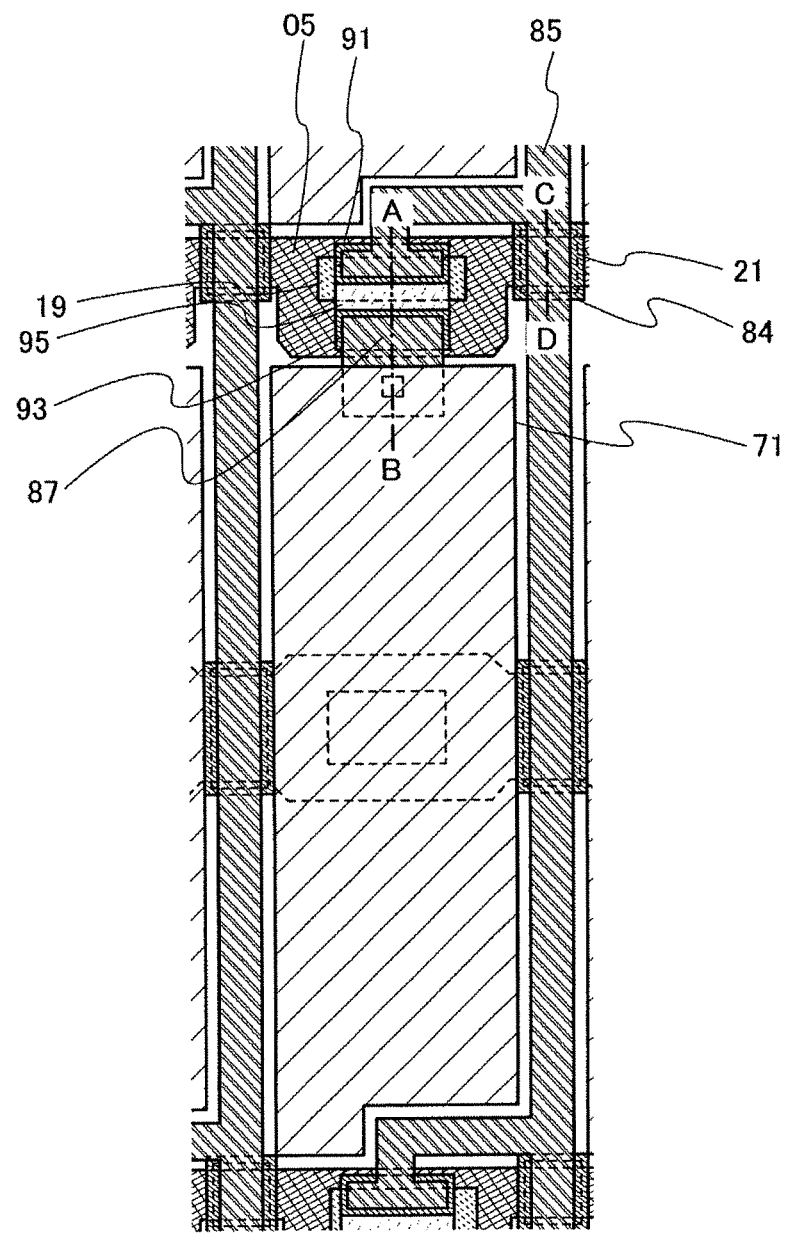
FIG. 12 is a top view illustrating the manufacturing process of the thin film transistor according to the embodiment mode of the present invention.

Note that the left sides of FIGS. 11A to 11E are each a cross-sectional view taken along line A-B of FIG. 12, which illustrates a cross section of a region where the thin film transistor is formed; and the right sides thereof are each a cross-sectional view taken along line C-D of FIG. 12, which illustrates a cross section of a region where the gate wiring and a source wiring are intersected to each other in a pixel.

Through the step of FIG. 7A described in Embodiment Mode 7, the gate wiring 05 is formed. Next, the gate insulating layer 09 is formed over the gate wiring 05 and the substrate 01.

Next, through the step of FIG. 7B, the conductive layer 11 and buffer layer 13 are stacked sequentially over the gate insulating layer 09. Then, the conductive layer 11 and the buffer layer 13 are etched using a resist mask formed by a photolithography step to form the conductive layers 51 and 17 and the buffer layers 19 and 21 as illustrated in FIG. 11A.

Next, the amorphous semiconductor layer 23 and the impurity semiconductor layer 25 to which the impurity element imparting one conductivity type is added are formed.

Next, the impurity semiconductor layer 25 to which the impurity element imparting one conductivity type is added and the amorphous semiconductor layer 23 are etched into desired shapes, using a resist mask formed by a photolithography step, to form an amorphous semiconductor layer 81 and an impurity semiconductor layer 83 to which the impurity element imparting one conductivity type is added in a region for forming a thin film transistor, as illustrated in FIG. 11B. In addition, in a region where the gate wiring and the source wiring are intersected to each other, an amorphous semiconductor layer 82 and an impurity semiconductor layer 84 to which the impurity element imparting one conductivity type is added are formed. After that, the resist mask is removed. Note that the side faces of the conductive layer 51 and the side faces of the conductive layer 17 are covered with the amorphous semiconductor layer 81 and the amorphous semiconductor layer 82, respectively.

Next, the conductive layer 27 is formed as illustrated in FIG. 11C.

Next, the conductive layer 27 is etched into a desired shape using a resist mask formed by a photolithography step to form a source wiring 85 and a drain electrode 87, as illustrated in FIG. 11D.

In a portion where the gate wiring 05 and the source wiring 85 are intersected to each other, the conductive layer 17, the buffer layer 21, and the amorphous semiconductor layer 82, in addition to the gate insulating layer 09, are formed; and the distance between the gate wiring 05 and the source wiring 85 is increased. Therefore, the parasitic capacitance in the region where the gate wiring 05 and the source wiring 85 are intersected to each other can be reduced.

Next, with the use of the resist mask, the impurity semiconductor layer 83 to which the impurity element imparting one conductivity type is added is etched to form a pair of an impurity semiconductor layer 91 to which the impurity element imparting one conductivity type is added and an impurity semiconductor layer 93 to which the impurity element imparting one conductivity type is added. In addition, in this etching step, the amorphous semiconductor layer 81 is etched. The depressed amorphous semiconductor layer part of which is etched is referred to as an amorphous semiconductor layer 95. A source region or a drain region and the depressed portion of the amorphous semiconductor layer 95 can be formed in the same step. After that, the resist mask is removed.

Next, the exposed amorphous semiconductor layer 95 may be irradiated with $H_2O$ plasma. Typically, irradiation with radicals which are generated by plasma discharging of water that is vaporized is performed on the amorphous semiconductor layer 95, the pair of the impurity semiconductor layer 91 to which the impurity element imparting one conductivity type is added and the impurity semiconductor layer 93 to which the impurity element imparting one conductivity type is added, and the source wiring 85 and the drain electrode 87, so that operation at high speed of a thin film transistor can be performed and the on-state current can be further enhanced. Further, the off-state current can be reduced.

Through the steps described above, a thin film transistor in which operation at high speed can be performed, the on-state current is high, and the off-state current is low is formed.

Next, through the steps illustrated in FIGS. 8B and 8C, the protective insulating layer 67, the planarizing layer 69, and the pixel electrode 71 which is connected to the drain electrode are formed as illustrated in FIG. 11E. Note that FIG. 11E corresponds to the cross-sectional views taken along lines A-B and C-D of FIG. 12. Although, in the thin film transistor illustrated in FIG. 12, a top view shape of a channel formation region where a source region and a drain region face to each other is parallel, a thin film transistor whose top view shape in a channel formation region is a C (U) shape may be manufactured instead of the thin film transistor illustrated in FIG. 12.

As described above, a thin film transistor in which the off-state current is low, the on-state current is high, and operation at high speed can be performed can be manufactured. In addition, an element substrate having the thin film transistor as a switching element of a pixel electrode can be manufactured.

[Embodiment Mode 9]

In this embodiment mode, a channel protective type thin film transistor will be described with reference to FIG. 33.

Figure 33:
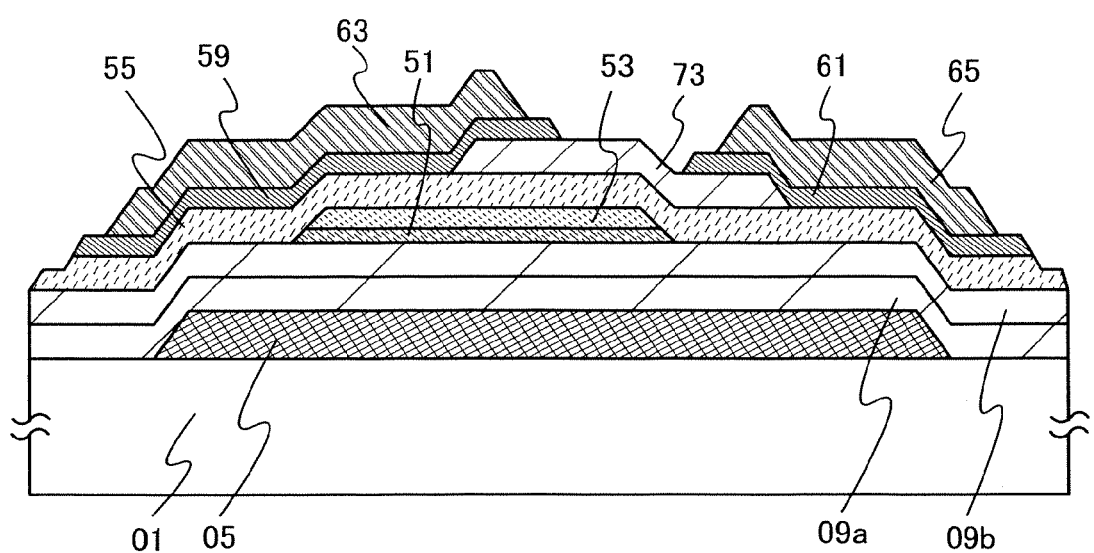
FIG. 33 is a cross-sectional view illustrating a thin film transistor according to an embodiment mode of the present invention.

In the thin film transistor illustrated in FIG. 33, the gate electrode 05 is formed over the substrate 01, the gate insulating layers 09a and 09b are formed over the gate electrode 05, and the conductive layer 51 is formed over the gate insulating layer 09b. In addition, the buffer layer 53 is formed over the conductive layer 51, and the amorphous semiconductor layer 55 is formed over the gate insulating layer 09b and the buffer layer 53. A channel protective layer 73 is formed in a region over the amorphous semiconductor layer 55, which is overlapped with the gate electrode 05 and one of end portions of the conductive layer 51. In addition, the pair of the impurity semiconductor layer 59 to which the impurity element imparting one conductivity type is added and the impurity semiconductor layer 61 to which the impurity element imparting one conductivity type is added is formed over the channel protective layer 73 and the amorphous semiconductor layer 55, and the wirings 63 and 65 are formed over the pair of the impurity semiconductor layer 59 to which the impurity element imparting one conductivity type is added and the impurity semiconductor layer 61 to which the impurity element imparting one conductivity type is added, respectively.

For the channel protective layer 73, the material of the gate insulating layers 09a and 09b or the material of the planarizing layer 69 can be used as appropriate.

Note that this embodiment mode can be combined with any of other embodiment modes.

[Embodiment Mode 10]

In this embodiment mode, a structure of a scanning line input terminal portion and a signal line input terminal portion which are provided in the peripheral portion of an element substrate 300 illustrated in FIG. 13 will be described with reference to FIGS. 14A and 14B. FIGS. 14A and 14B illustrates cross-sectional views of a scanning line input terminal portion and a signal line input terminal portion which are provided in the peripheral portion of a substrate 01, and a thin film transistor of a pixel portion.

Note that in the case of an active matrix display device provided with a thin film transistor for controlling potential of a pixel electrode in a pixel provided in a pixel portion, a scanning line is connected to a gate electrode. Alternatively, part of the scanning line functions as the gate electrode. Therefore, hereinafter, the scanning line is also referred to as a gate wiring 05. In addition, a signal line is connected to a source of the thin film transistor; therefore, hereinafter, the signal line is also referred to as a source wiring 63. However, when the signal line is connected to a drain of the thin film transistor, the signal line can serve as a drain wiring.

Figure 13:
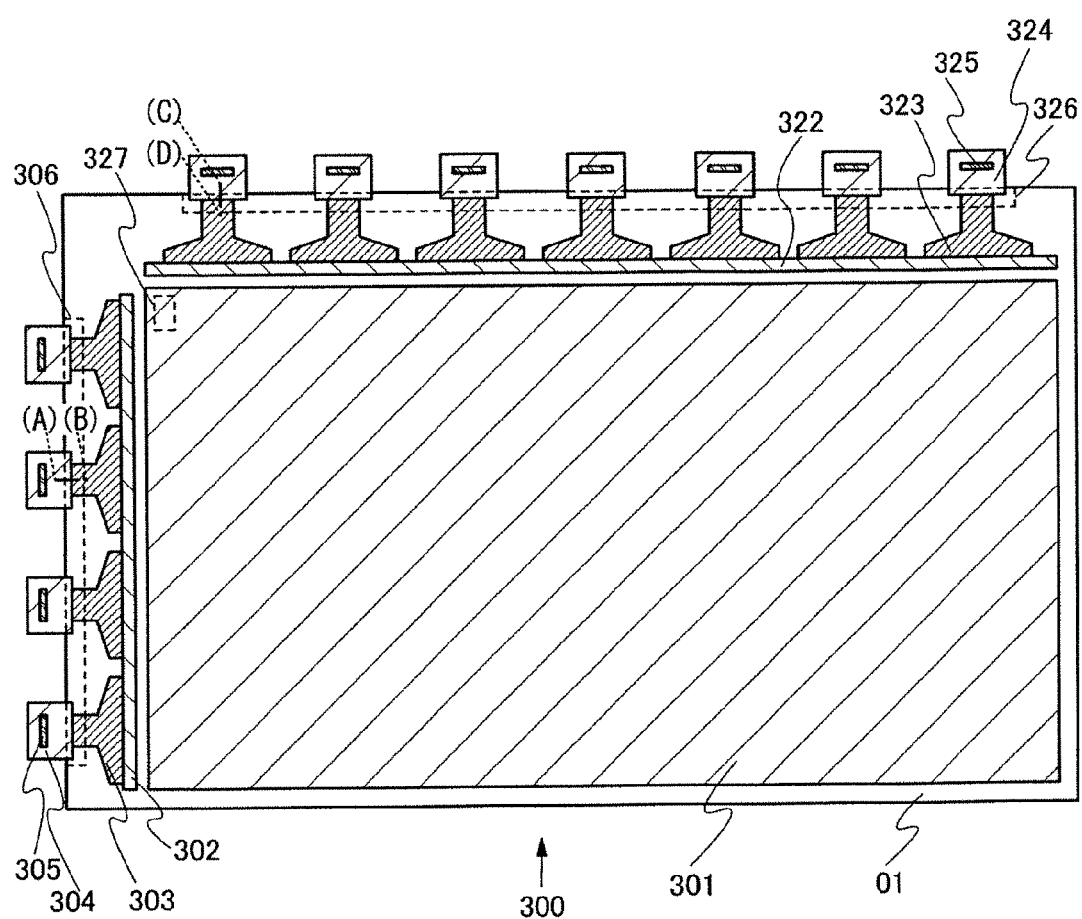
FIG. 13 is a plan view illustrating an element substrate according to an embodiment mode of the present invention.

The element substrate 300 illustrated in FIG. 13 is provided with a pixel portion 301, and protective circuits 302 and 322, a signal line 323, and a scanning line 303 are provided between the pixel portion 301 and the peripheral portion of the substrate 01. In addition, although not, illustrated, a signal line and a scanning line are formed from the protective circuits 302 and 322 to the pixel portion 301. A signal line input terminal portion 326 and a scanning line input terminal portion 306 are provided at the end portion of the signal line 323 and the end portion of the scanning line 303, respectively. An FPC 324 and an FPC 304 are connected to the terminal of the signal line input terminal portion 326 and the terminal of the scanning line input terminal portion 306, respectively, and a signal line driver circuit 325 and a scanning line driver circuit 305 are provided for the FPC 324 and the FPC 304, respectively. In addition, although not illustrated, pixels 327 are arranged in matrix in the pixel portion 301.

In FIG. 14A, a scanning line input terminal 306a is connected to the gate wiring 05 of a thin film transistor 330. In addition, a signal line input terminal 326a is connected to the source wiring 63.

The scanning line input terminal 306a and the signal line input terminal 326a are each formed using the same layer as the layer used for a pixel electrode 71 of the thin film transistor 330 in the pixel portion. In addition, the scanning line input terminal 306a and the signal line input terminal 326a are formed over the planarizing layer 69 which is formed over the source wiring 63. In addition, over the planarizing layer 69, the scanning line input terminal 306a and the signal line input terminal 326a are connected to a wiring 309 and a wiring 329 of the FPC 304 and the FPC 324, respectively, with respective conductive particles 308 and 328 of anisotropy conductive adhesives 307 and 327 interposed therebetween.

Note that although the gate wiring 05 and the scanning line input terminal 306a are connected here, a conductive layer formed using the same layer as the layer used for the source wiring 63 may be provided between the gate wiring 05 and the scanning line input terminal 306a.

In FIG. 14B, a scanning line input terminal 306b is connected to the gate wiring 05 of the thin film transistor 330. In addition, a signal line input terminal 326b is connected to the source wiring 63 of the thin film transistor 330.

The scanning line input terminal 306b and the signal line input terminal 326b are each formed using the same layer as the layer used for the pixel electrode 71 of the thin film transistor 330 in the pixel portion. In addition, the scanning line input terminal 306b and the signal line input terminal 326b are formed over the planarizing layer 69 and a protective insulating layer 67. In addition, in openings of the planarizing layer 69 and the protective insulating layer 67, the scanning line input terminal 306b and the signal line input terminal 326b are connected to the wiring 309 and the wiring 329 of the FPC 304 and the FPC 324, respectively, with the respective conductive particles 308 and 328 of the anisotropy conductive adhesives 307 and 327 interposed therebetween.

The thickness of the signal line input terminal 326b which is connected to the source wiring 63 is increased because the amorphous semiconductor layer 35 and the impurity semiconductor layer 39 to which the impurity element imparting one conductivity type is added, in addition to the gate insulating layer 09, are formed between the substrate 01 and the source wiring 63. Therefore, the signal line input terminal 326b and the wiring 328 of the FPC 324 are easily connected to each other.

[Embodiment Mode 11]

Next, a structure of a display panel, which is one mode of the present invention, will be described below.

Figure 15A:
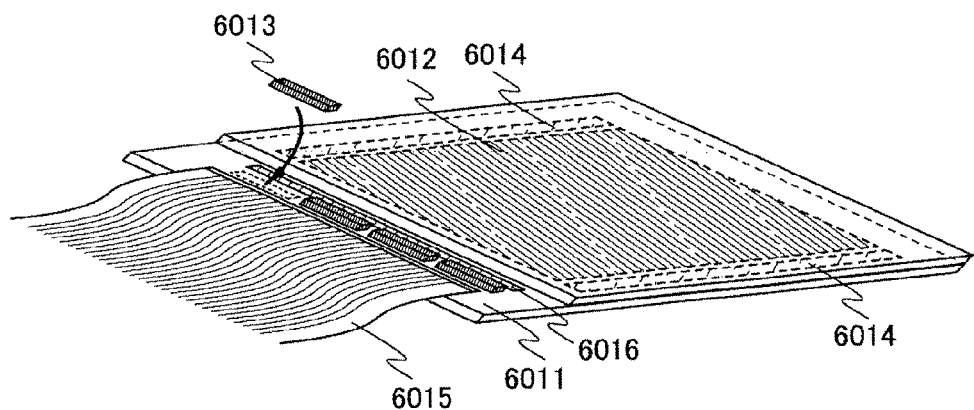
FIGS. 15A to 15C are perspective views each illustrating a display panel according to an embodiment mode of the present invention.

FIG. 15A illustrates a mode of a display panel in which a pixel portion 6012 formed over a substrate 6011 is connected to a signal line driver circuit 6013 that is formed separately. The element substrate described in the above embodiment mode is used to form an element substrate in which the pixel portion 6012, a protective circuit 6016, and a scanning line driver circuit 6014 are formed. When the signal line driver circuit is formed using a thin film transistor which can obtain higher field-effect mobility than the thin film transistor in which an amorphous semiconductor layer is used for a channel formation region, an operation of the signal line driver circuit which demands higher driving frequency than the scanning line driver circuit can be stabilized. Note that the signal line driver circuit 6013 may be formed using a transistor using a single crystal semiconductor for a channel formation region, a thin film transistor using a polycrystalline semiconductor for a channel formation region, or a transistor using SOI for a channel formation region. The transistor using SOI includes a transistor using a single crystal semiconductor layer provided over a glass substrate for a channel formation region. The pixel portion 6012, the signal line driver circuit 6013, and the scanning line driver circuit 6014 are each supplied with potential of a power source, various signals, and the like via an FPC 6015. The protective circuit 6016 formed with the thin film transistor described in the above embodiment mode may be provided between the signal line driver circuit 6013 and the FPC 6015 or between the signal line driver circuit 6013 and the pixel portion 6012. A protective circuit including one or a plurality of elements selected from a thin film transistor, a diode, a resistive element, a capacitor, or the like may be provided for the protective circuit 6016, instead of the protective circuit formed with the thin film transistor described in the above embodiment mode.

Note that the signal driver circuit and the scanning line driver circuit may both be formed over the same substrate as the pixel portion.

Figure 15B:
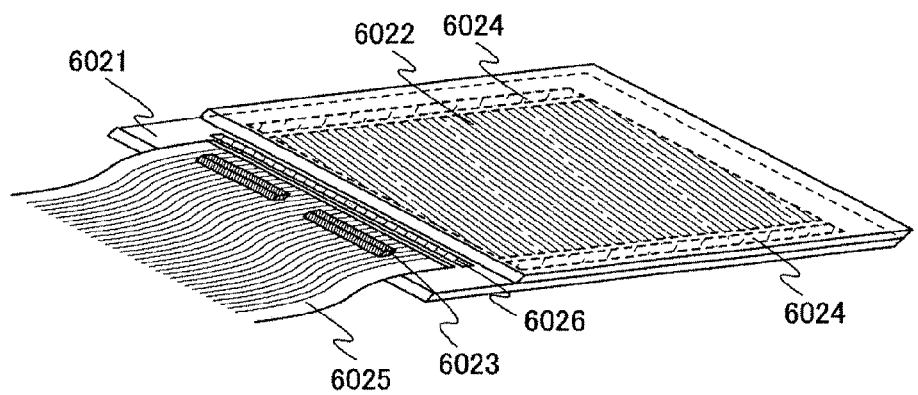

In addition, when the driver circuit is separately formed, a substrate provided with the driver circuit is not always required to be attached to a substrate provided with the pixel portion, and may be attached to, for example, the FPC. FIG. 15B illustrates a mode of a panel of a display device in which only a signal line driver circuit 6023 is formed separately and an element substrate in which a pixel portion 6022, a protective circuit 6026, and a scanning line driver circuit 6024 are formed, which is formed over a substrate 6021, is connected to an FPC. The pixel portion 6022, the protective circuit 6026, and the scanning line driver circuit 6024 are formed using the thin film transistor described in the above embodiment mode. The signal line driver circuit 6023 is connected to the pixel portion 6022 via an FPC 6025 and the protective circuit 6026. The pixel portion 6022, the signal line driver circuit 6023, and the scanning line driver circuit 6024 are each supplied with potential of a power source, various signals, and the like via the FPC 6025. The protective circuit 6026 formed with the thin film transistor described in the above embodiment mode may be provided between the FPC 6025 and the pixel portion 6022. A protective circuit including one or a plurality of elements selected from a thin film transistor, a diode, a resistive element, a capacitor, or the like may be provided for the protective circuit 6026, instead of the protective circuit formed with the thin film transistor described in the above embodiment mode.

Figure 15C:
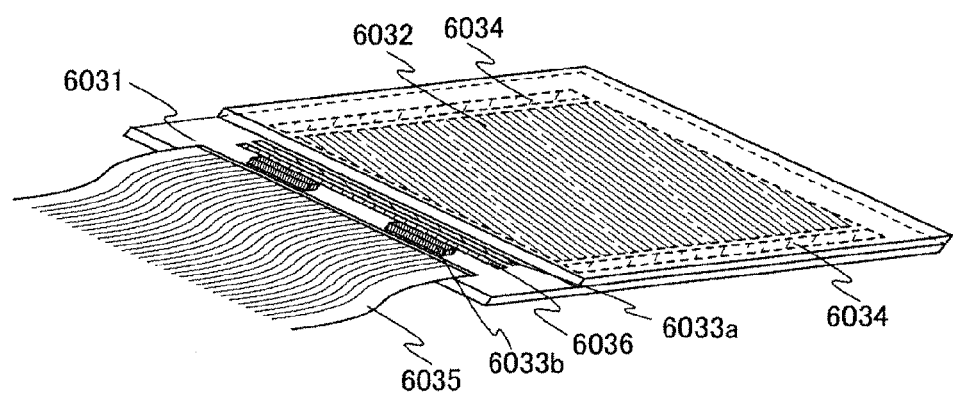

Furthermore, only part of the signal line driver circuit or only part of the scanning line driver circuit may be formed over the same substrate as the pixel portion with the use of the thin film transistor described in the above embodiment mode, and the rest may be formed separately and electrically connected to the pixel portion. FIG. 15C illustrates a mode of a panel of a display device in which an analog switch 6033a included in the signal driver circuit is formed over the same substrate 6031 as a pixel portion 6032 and a scanning line driver circuit 6034, and a shift register 6033b included in the signal line driver circuit is formed separately over a different substrate and then attached to the substrate 6031. The pixel portion 6032, a protective circuit 6036, and the scanning line driver circuit 6034 are formed using the thin film transistor described in the above embodiment mode. The shift register 6033b included in the signal line driver circuit is connected to the pixel portion 6032 via an FPC 6035 and the protective circuit 6036. The pixel portion 6032, the signal line driver circuit, and the scanning line driver circuit 6034 are each supplied with potential of a power source, various signals, and the like via the FPC 6035. The protective circuit 6036 formed with the thin film transistor described in the above embodiment mode may be provided between the shift register 6033b and the analog switch 6033a. A protective circuit including one or a plurality of elements selected from a thin film transistor, a diode, a resistive element, a capacitor, or the like may be provided for the protective circuit 6036, instead of the protective circuit formed with the thin film transistor described in the above embodiment mode.

As illustrated in FIGS. 15A to 15C, in the display device of this embodiment mode, an entire driver circuit or part thereof can be formed over the same substrate as a pixel portion using the thin film transistor described in the above embodiment mode.

Note that there are no particular limitations on a connection method of a separately formed substrate, and a known method such as a COG method, a wire bonding method, or a TAB method can be used. Further, a connection position is not limited to the position illustrated in FIGS. 15A to 15C as long as electrical connection is possible. In addition, a controller, a CPU, a memory, or the like may be formed separately and connected.

Note that the signal line driver circuit used in this embodiment mode includes a shift register and an analog switch. In addition to the shift register and the analog switch, another circuit such as a buffer, a level shifter, or a source follower may be included. In addition, the shift register and the analog switch are not always required to be provided, and, for example, a different circuit such as a decoder circuit by which selection of signal line is possible may be used instead of the shift register, and a latch or the like may be used instead of the analog switch.

[Embodiment Mode 12]

The element substrate obtained according to the above embodiment mode, a display device using the element substrate, or the like can be used for an active matrix display device panel. That is, the above embodiment mode can be implemented in all the electronic appliances having the above element substrate, the display device, or the like incorporated in display portions.

Examples of such electronic devices include cameras such as a video camera and a digital camera, a head-mounted display (a goggle-type display), a car navigation system, a projector, a car stereo, a personal computer, and a portable information terminal (e.g., a mobile computer, a cellular phone, or an e-book reader). Examples of these devices are illustrated in FIGS. 16A to 16D.

Figure 16A:
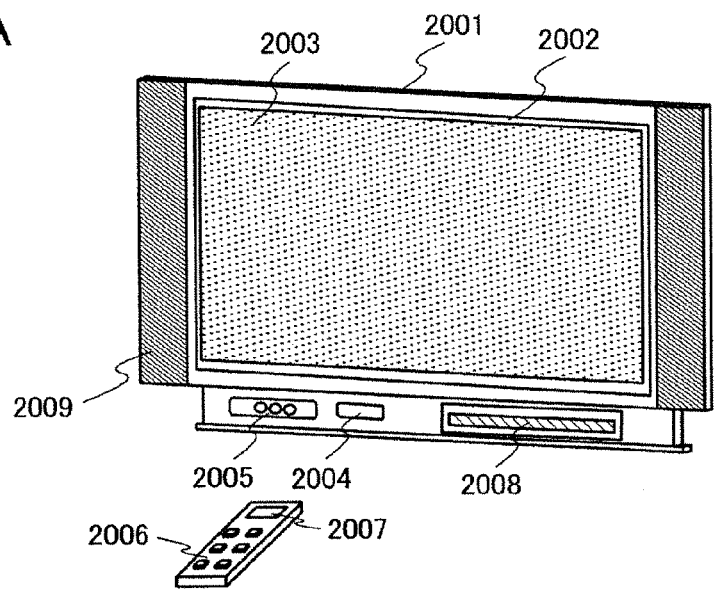
FIGS. 16A to 16D are perspective views illustrating electronic devices each using the display device, according to an embodiment mode of the present invention.

FIG. 16A illustrates a television device. The television device can be completed by incorporating a display panel into a housing as illustrated in FIG. 16A. A main screen 2003 is formed using the display panel, and other accessories such as a speaker portion 2009 and an operation switch are provided. In such a manner, the television device can be completed.

As illustrated in FIG. 16A, a display panel 2002 using a display element is incorporated in a chassis 2001. With the use of a receiver 2005, in addition to reception of general TV broadcast, communication of information can also be performed in one way (from a transmitter to a receiver) or in two ways (between a transmitter and a receiver or between receivers) by connection to a wired or wireless communication network through a modem 2004. Operation of the television device can be carried out using switches that are incorporated into the housing or by a remote control device 2006 provided separately. A display portion 2007 for displaying output information may be provided for the remote control device 2006.

Further, the television device may include a subscreen 2008 formed using a second display panel for displaying channels, sound volume, and the like, in addition to the main screen 2003. In this structure, the main screen 2003 may be formed using a liquid crystal display panel, and the subscreen may be formed using a light-emitting display panel. Furthermore, the main screen 2003 may be formed with a light-emitting display panel, and the subscreen 2008 may be formed with a light-emitting display panel, which can be switched on and off.

Figure 17:
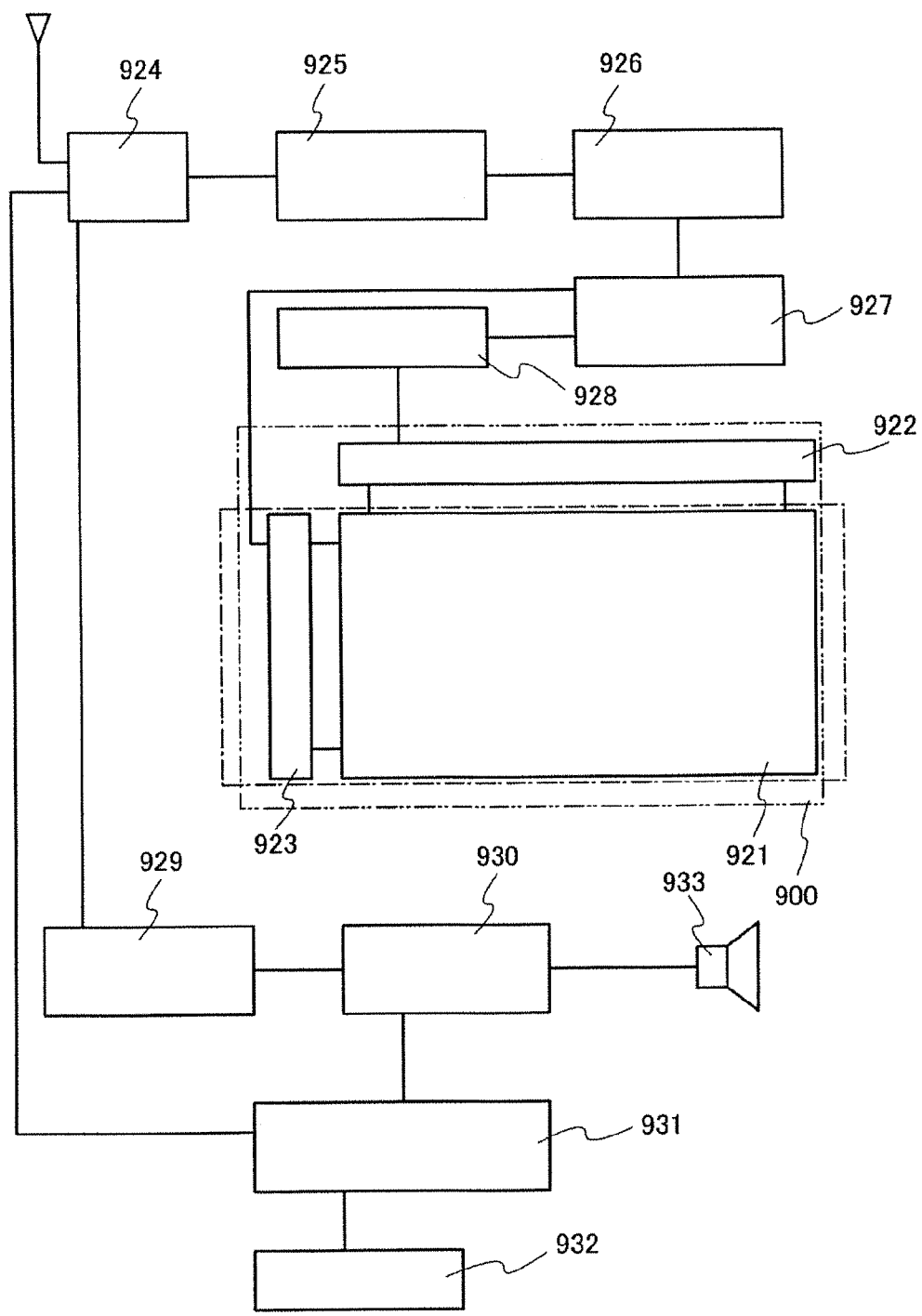
FIG. 17 is a view illustrating the electronic device using the display device, according to the embodiment mode of the present invention.

FIG. 17 is a block diagram illustrating a main structure of the television device. A display panel 900 is provided with a pixel portion 921. A signal line driver circuit 922 and a scanning line driver circuit 923 may be mounted on the display panel 900 by a COG method.

As for other external circuits, the television device includes a video signal amplifier circuit 925 which amplifies a video signal among signals received by a tuner 924; a video signal processing circuit 926 which converts a signal outputted from the video signal amplifier circuit 925 into a color signal corresponding to each color of red, green, and blue; a control circuit 927 which converts the video signal into an input specification of a driver IC; and the like in an input side of a video signal. The control circuit 927 outputs signals to each of the scanning line side and the signal line side. When digital driving is performed, a structure may be employed in which a signal dividing circuit 928 is provided on the signal line side and an input digital signal is divided into m signals to be supplied.

Among the signals received by the tuner 924, an audio signal is transmitted to an audio signal amplifier circuit 929, and an output thereof is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

Needless to say, the present invention is not limited to the television device, and can be applied to various uses such as a monitor of a personal computer, or a display medium with a large area, for example, an information display board at a train station, an airport, or the like, or an advertisement display board on the street.

The element substrate described in the above embodiment mode and the display device having the element substrate are applied to the main screen 2003 and the subscreen 2008, so that mass productivity of the television device whose image quality, such as contrast, is improved can be increased.

Figure 16B:
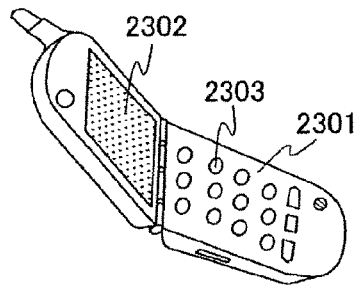

FIG. 16B illustrates one example of a cellular phone 2301. The cellular phone 2301 includes a display portion 2302, operation portions 2303, and the like. The element substrate described in the above embodiment mode and the display device having the element substrate are applied to the display portion 2302, so that mass productivity of the cellular phone whose image quality, such as contrast, is improved can be increased.

Figure 16C:
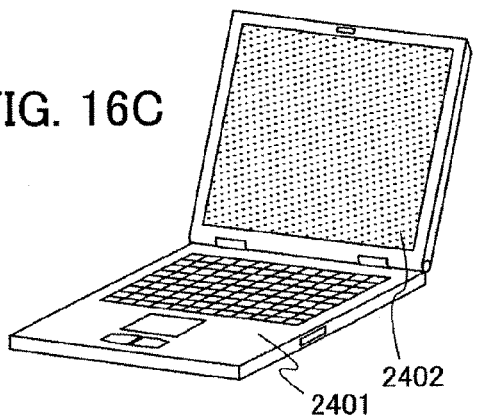

In addition, a portable computer illustrated in FIG. 16C includes a main body 2401, a display portion 2402, and the like. The element substrate described in the above embodiment mode and the display device having the element substrate are applied to the display portion 2402, so that mass productivity of the portable computer whose image quality, such as contrast, is improved can be increased.

Figure 16D:
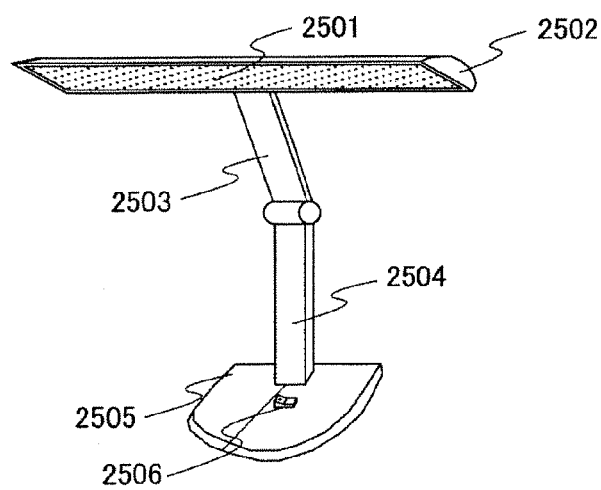

FIG. 16D illustrates a desk lamp including a lighting portion 2501, a lampshade 2502, an adjustable arm 2503, a support 2504, a base 2505, and a power supply 2506. The desk lamp can be manufactured by applying a light-emitting device to the lighting portion 2501. Note that a lighting appliance also refers to a ceiling light, a wall light, and the like in its category. The element substrate described in the above embodiment mode and the display device having the element substrate are applied, so that mass productivity can be increased and an inexpensive desk lamp can be provided.

Figure 18A:
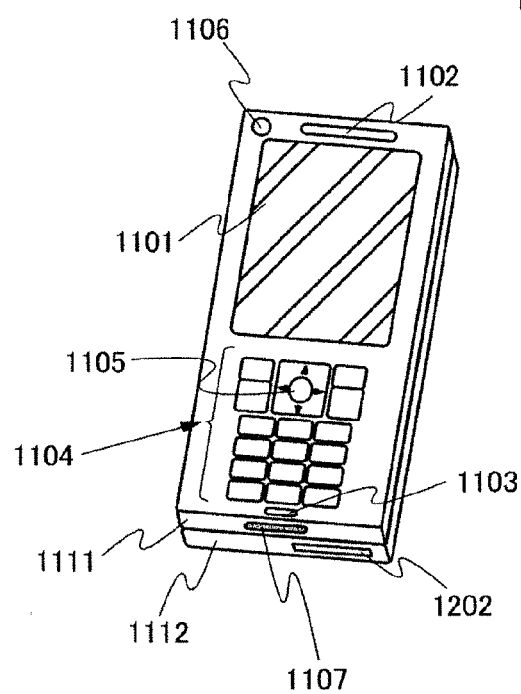
FIGS. 18A to 18C are perspective views illustrating an electronic device using the display device, according to the embodiment mode of the present invention.
Figure 18B:
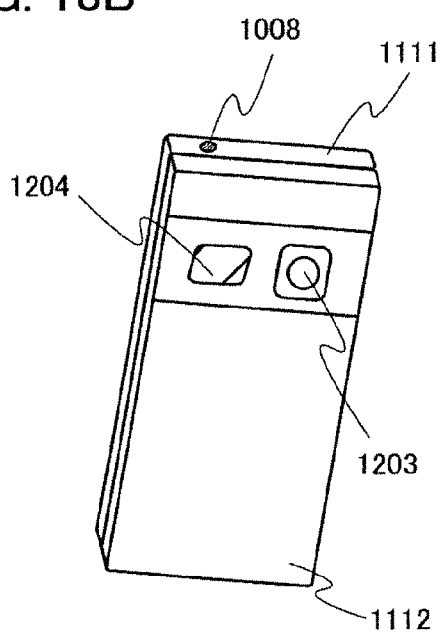
Figure 18C:
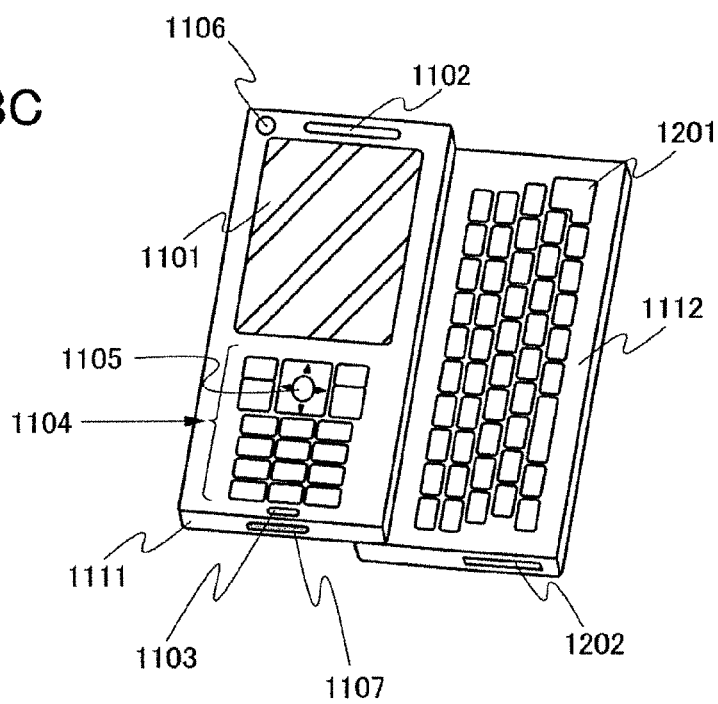

FIGS. 18A to 18C illustrate an example of a structure of a smartphone to which the above embodiment mode is applied. FIG. 18A is a front view, FIG. 18B is a rear view, and FIG. 18C is a development view. The smartphone has two housings 1111 and 1112. The smartphone has both a function of a cellular phone and a function of a portable information terminal, and incorporates a computer provided to be able to conduct a variety of data processing in addition to verbal communication.

The housing 1111 includes a display portion 1101, a speaker 1102, a microphone 1103, operation keys 1104, a pointing device 1105, a front camera lens 1106, a jack 1107 for an external connection terminal, an earphone terminal 1108, and the like, while the housing 1112 includes a keyboard 1201, an external memory slot 1202, a rear camera 1203, a light 1204, and the like. In addition, an antenna is incorporated in the housing 1111.

Further, in addition to the above structure, the smartphone may incorporate a non-contact IC chip, a small size memory device, or the like.

The housings 1111 and 1112 (FIG. 18A) which are put together to be lapped with each other are developed by sliding as illustrated in FIG. 18C. In the display portion 1101, the display device described in the above embodiment mode can be incorporated, and display direction can be changed as appropriate depending on a usage pattern. Because the front camera lens 1106 and the display portion 1101 are provided in the same plane, the smartphone can be used as a videophone. A still image and a moving image can be taken by the rear camera 1203 and the light 1204 by using the display portion 1101 as a viewfinder.

The speaker 1102 and the microphone 1103 are not limited to use for verbal communication, and can be used for uses of a videophone, recording, reproduction, and the like. With use of the operation keys 1104, operation of incoming and outgoing calls, simple information input of electronic mails or the like, scrolling of a screen, cursor motion and the like are possible.

If much information is needed to be treated, such as documentation, use as a portable information terminal, and the like, the use of the keyboard 1201 is convenient. When the housings 1111 and 1112 which are put together to be lapped with each other (FIG. 18A) are developed by sliding as illustrated in FIG. 18C and the smartphone is used as a portable information terminal, smooth operation can be performed by using the keyboard 1201 and the pointing device 1105. The jack 1107 for an external connection terminal can be connected to an AC adapter or a variety of cables such as a USB cable, and charging and data communication with a personal computer or the like is possible. Moreover, a large amount of data can be stored by inserting a storage medium into the external memory slot 1202 and can be moved.

In the rear surface of the housing 1112 (FIG. 18B), the rear camera 1203 and the light 1204 are provided, and a still image and a moving image can be taken by using the display portion 1101 as a viewfinder.

Further, the smartphone may have an infrared communication function, a USB port, a function of receiving one segment television broadcast, a non-contact IC chip, an earphone jack, or the like, in addition to the above-described functions and structures.

The display device described in the above embodiment mode is applied, so that mass productivity can be increased.

[Embodiment 1]

Figure 1C:
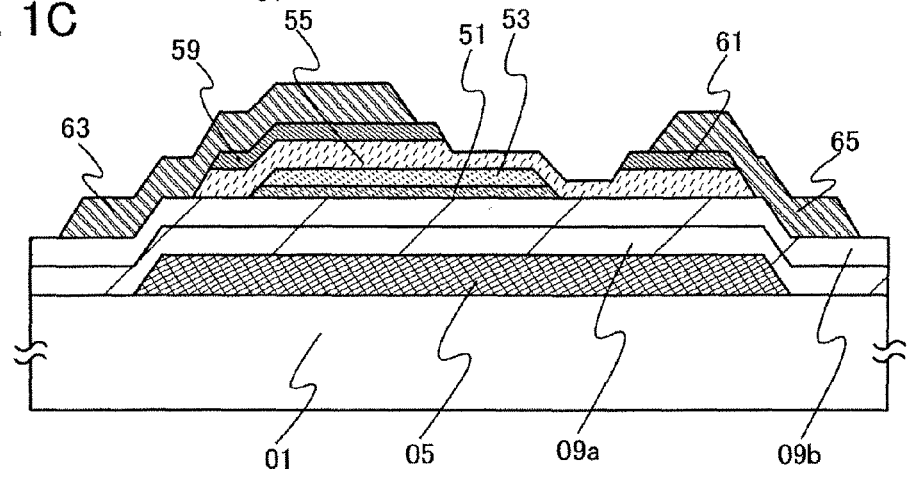

In this embodiment, the thin film transistor illustrated in FIG. 1C is manufactured, and measurement results of the transistor characteristics will be shown.

First, the manufacturing process of the thin film transistor is described.

As illustrated in FIG. 7A, the conductive layer 03 was formed over the substrate 01. Here, a glass substrate was used as the substrate 01. In addition, as the conductive layer 03, a 150 nm thick molybdenum layer was formed by sputtering a molybdenum target with argon.

Next, a resist mask was formed by a photolithography step after a resist was applied over the conductive layer 03. With the resist mask, wet etching was performed on the conductive layer 03 so as to form the gate electrode 05 as illustrated in FIG. 7B. After that, the resist mask was removed.

Next, as illustrated in FIG. 7B, the gate insulating layer 09 was formed over the substrate 01 and the gate electrode 05, the conductive layer 11 was formed over the gate insulating layer 09, and the buffer layer 13 was formed over the conductive layer 11.

Here, as the gate insulating layer 09, a 110 nm thick silicon nitride layer and a 110 nm thick silicon oxynitride layer were formed by a plasma CVD method. As the conductive layer 11, a 20 nm thick microcrystalline silicon layer including phosphorus was formed by a plasma CVD method. Here, the microcrystalline silicon layer including phosphorus was formed with 10 ppm of $PH_3$ (diluted with silane) and hydrogen at the flow ratio of 1:150. As the buffer layer 13, a 50 nm thick amorphous silicon layer was formed by a plasma CVD method.

Next, a resist mask was formed by a photolithography step after a resist was applied over the buffer layer 13. With the resist mask, dry etching was performed on the conductive layer 11 and the buffer layer 13 so as to form the conductive layer 51 and the buffer layer 19. After that, the resist mask was removed. After the buffer layer 19 was etched by 20 nm by dry etching, irradiation with chlorine plasma was performed to remove impurities on the surface of the buffer layer 19.

An oxide layer on the surface of the conductive layer 51 and the buffer layer 19 was removed by a solution in which hydrofluoric acid was diluted with pure water by 10 times to 100 times.

Next, as illustrated in FIG. 11A, the amorphous semiconductor layer 23 and the impurity semiconductor layer 25 to which the impurity element imparting one conductivity type is added were formed over the gate insulating layer 09, the buffer layer 19, and the conductive layer 51.

Here, as the amorphous semiconductor layer 23, an 80 nm thick amorphous silicon layer was formed by a plasma CVD method. In addition, as the impurity semiconductor layer 25 to which the impurity element imparting one conductivity type is added, a 50 nm thick amorphous silicon layer to which phosphorus was added was formed by a plasma CVD method.

Next, a resist mask was formed by a photolithography step. With the resist mask, dry etching was performed on the buffer layer 19 and the impurity semiconductor layer 25 to which the impurity element imparting one conductivity type is added to form an amorphous semiconductor layer 81 and an impurity semiconductor layer 83 to which the impurity element imparting one conductivity type is added as illustrated in FIG. 11B. After that, the resist mask was removed.

Next, as illustrated in FIG. 11C, a conductive layer 27 was formed over the gate insulating layer 09 and the impurity semiconductor layer 83 to which the impurity element imparting one conductivity type is added.

Here, as the conductive layer 27, a 300 nm thick molybdenum layer was formed by sputtering a molybdenum target with argon.

Next, a resist mask was formed by a photolithography step after a resist was applied over the conductive layer 27. With the resist mask, wet etching was performed on the conductive layer 27 to form a source wiring 85 and a drain electrode 87 as illustrated in FIG. 11D. In addition, dry etching was performed on the impurity semiconductor layer 83 to which the impurity element imparting one conductivity type is added to form a pair of an impurity semiconductor layer 91 to which the impurity element imparting one conductivity type is added and an impurity semiconductor layer 93 to which the impurity element imparting one conductivity type is added. At this time, part of the surface of the amorphous semiconductor layer 81 is etched to be an amorphous semiconductor layer 95. After that, the resist mask was removed.

Here, as a sample 1, as in Embodiment Mode 1 and FIG. 11D, the conductive layer 27 was etched so that one end portion of the source wiring 85 overlaps with the conductive layer 51 by 2 μm and one end portion of the drain electrode 87 is apart from the conductive layer 51 by 2 μm. In addition, as a sample 2, the conductive layer 27 was etched so that one end portion of the source wiring 85 is aligned with one end portion of the conductive layer 51, and one end portion of the drain electrode 87 is aligned with one end portion of the conductive layer 51.

Next, the surface of the amorphous semiconductor layer 95 was irradiated with chlorine plasma to remove impurities that remain in the amorphous semiconductor layer 95.

Next, a protective insulating layer 67 was formed as illustrated in FIG. 11E. Here, as the protective insulating layer 67, a 300 nm thick silicon nitride layer was formed by a plasma CVD method.

Next, a resist mask was formed by a photolithography step after a resist was applied over the protective insulating layer 67. With the resist mask, dry etching was performed on part of the protective insulating layer 67 so as to expose the drain electrode 87. Further, dry etching was performed on parts of the protective insulating layer 67 and the gate insulating layer 09 so as to expose the gate electrode 05.

Next, a conductive layer was formed over the protective insulating layer 67. Here, a 50 nm thick ITO film was formed as the conductive layer by a sputtering method. However, the ITO film is not necessarily formed.

Figure 19A:
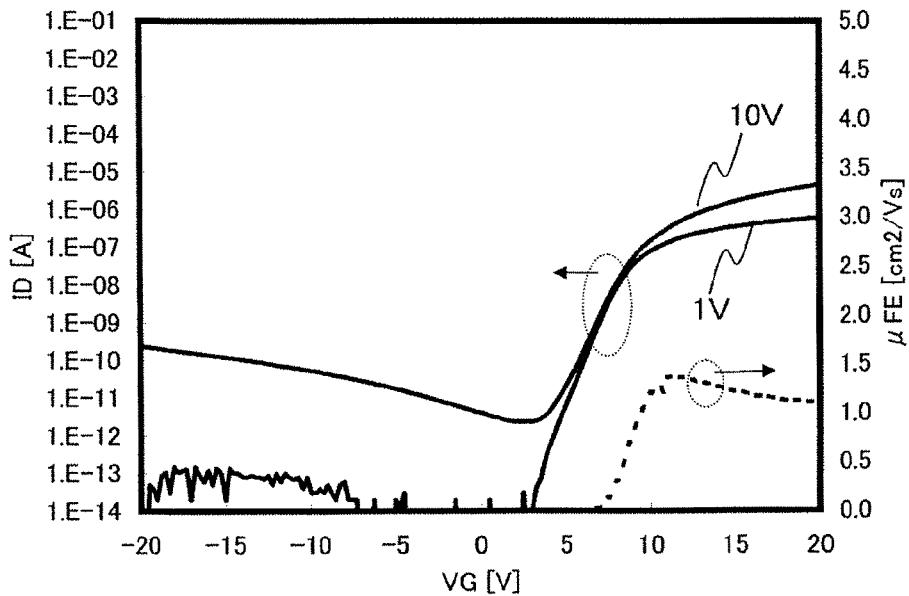
FIGS. 19A and 19B are graphs showing electric characteristics, which is obtained by Embodiment 1, of the thin film transistor.
Figure 19B:
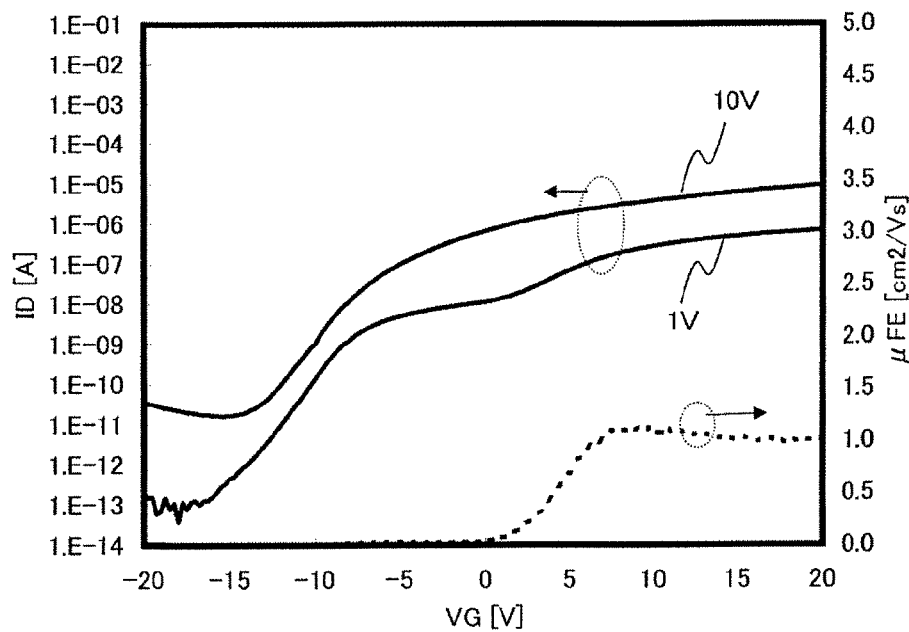

After that, electric characteristics of the thin film transistors in the samples 1 and 2 were measured. Current-voltage characteristics of the sample 1 were shown in FIG. 19A, and current-voltage characteristics of the sample 2 were shown in FIG. 19B. Note that respective channel lengths of the thin film transistors in the samples 1 and 2 were 10 μm, and respective channel widths thereof were 20 p.m. Solid lines show current-voltage characteristics when the drain voltages were 1 V and 10 V. A broken line shows a field-effect mobility when the drain voltage was 1 V.

The field-effect mobility of the sample 1 was 1.37 cm$^2$/Vs, and the field-effect mobility of the sample 2 was 1.14 cm$^2$/Vs. From this, it is found that the field-effect mobilities of the thin film transistors rise with the structure described in Embodiment Mode 1. In addition, from FIGS. 19A and 19B, it is found that the on-state current of the sample 1 rises and the off-state current thereof decreases. In addition, the threshold value of the sample 2 is largely shifted to a negative side, whereas the threshold value of the sample 1 is only slightly shifted to a positive side.

As described above, reduction in off-state current of a thin film transistor in addition to increase in on-state current and field-effect mobility thereof is possible with the structure of this embodiment.

[Embodiment 2]

In this embodiment, results of simulation of a band diagram in a current path of the thin film transistor described in any of the above-described embodiment modes and current-voltage characteristics thereof will be shown. For the device simulation, the device simulator "ATLAS" made by Silvaco Data Systems Inc. was used.

Figure 20:
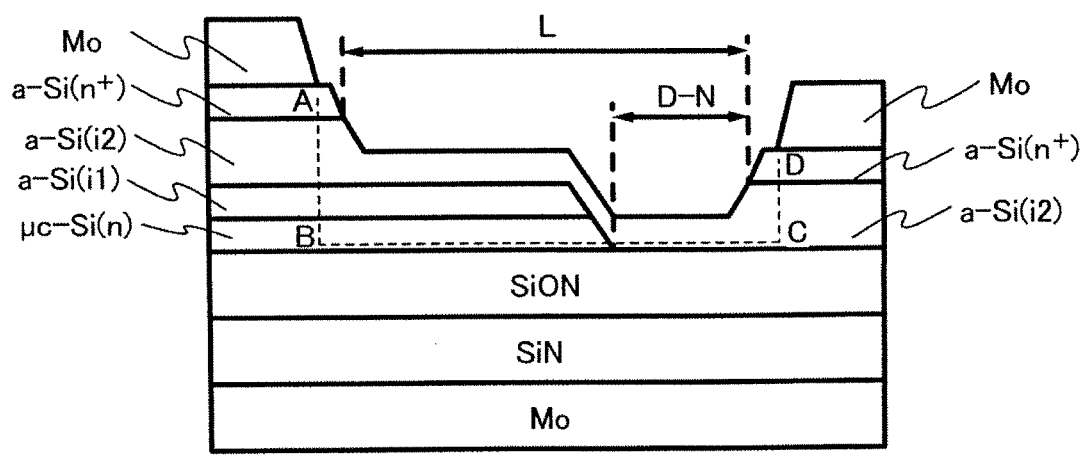
FIG. 20 is a view illustrating a device structure used for a device simulation.

FIG. 20 shows the structure of a thin film transistor used for the device simulation.

Over an insulating substrate, 150 nm thick molybdenum (Mo) was formed as a gate electrode. The work function of molybdenum (Mo) was supposed to be 4.6 eV.

A silicon nitride film (with a dielectric constant of 7.0 and a thickness of 110 nm) and a silicon oxynitride film (with a dielectric constant of 4.1 and a thickness of 110 nm) were stacked as a gate insulating layer over the gate electrode.

Over the gate insulating layer, a microcrystalline silicon layer μc-Si (n) to which phosphorus is added (the thickness of 10 nm, the donor concentration of $1\times10^{18}$ atoms/cm$^3$, and the activation rate of 100%) as a conductive layer and an amorphous silicon layer a-Si (i1) (the thickness of 30 nm) as a buffer layer were stacked.

In addition, over the buffer layer and the gate insulating layer, an amorphous silicon layer a-Si (i2) (the thickness of 80 nm) was stacked as an amorphous semiconductor layer. The amorphous semiconductor layer functions as a channel-etch layer; hence, the amorphous semiconductor layer had a depression, and the thickness at the depression was 40 nm.

Over the amorphous semiconductor layer, amorphous silicon layers a-Si (n$^+$) to which phosphorus is added (the thickness of 50 nm) were stacked as a pair of semiconductor layers to which the impurity element imparting one conductivity type is added. In FIG. 20, the distance between the amorphous silicon layers a-Si (n$^+$) to which phosphorus is added corresponds to a channel length L of the thin film transistor. Here, the channel length L was supposed to be 10 μm. In addition, the distance between the microcrystalline silicon layer μc-Si (n) to which phosphorus is added and one of the pair of amorphous silicon layers a-Si (n⁺) to which phosphorus is added was denoted by D-N. Here, the distance D-N was supposed to be 2 μm. The respective donor concentrations of the amorphous silicon layers a-Si(n⁺) to which phosphorus is added were set to $1\times10^{19}$ atoms/cm³; thus, the conductivity was high.

Over the pair of semiconductor layers to which the impurity element imparting one conductivity type is added, molybdenum (Mo) (the thickness is 300 nm) was stacked as each of a source electrode and a drain electrode. It was supposed that the contact between the molybdenum (Mo) and each amorphous silicon layer a-Si(n⁺) to which phosphorus is added was ohmic contact.

Figure 21:
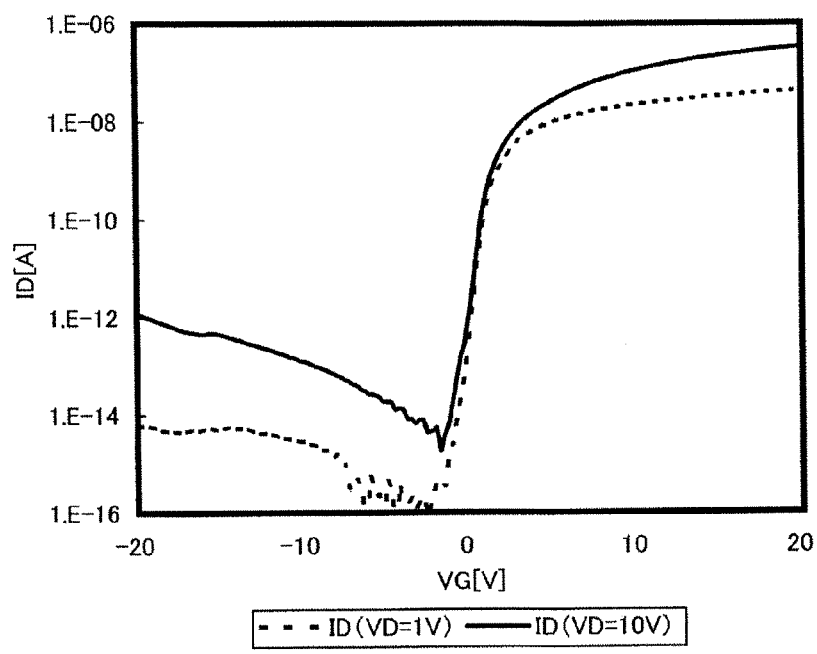
FIG. 21 is a graph showing electric characteristics, which is obtained from the device simulation, of the thin film transistor.

Hereinafter, results of device simulation of current-voltage characteristics of the thin film transistor illustrated in FIG. 20 are shown in FIG. 21. A broken line shows a drain current when the drain voltage is 1 V, and a solid line shows a drain current when the drain voltage is 10 V. When the gate voltage (VG) is the threshold voltage (here, 0.6 V), a concave and a convex of the current-voltage characteristics are reversed. That is, the graph has a downward convex curve in the case of VG<Vth, whereas the graph has an upward convex curve in the case of VG>Vth. In addition, the behavior of on or off is shown depending on the gate voltage.

Next, the device simulation of a band diagram in layers illustrated by line A-B-C-D of FIG. 20 was carried out, with the drain voltage fixed to 1 V. The results thereof and dependence of a barrier on gate voltage are shown below.

Figure 22:
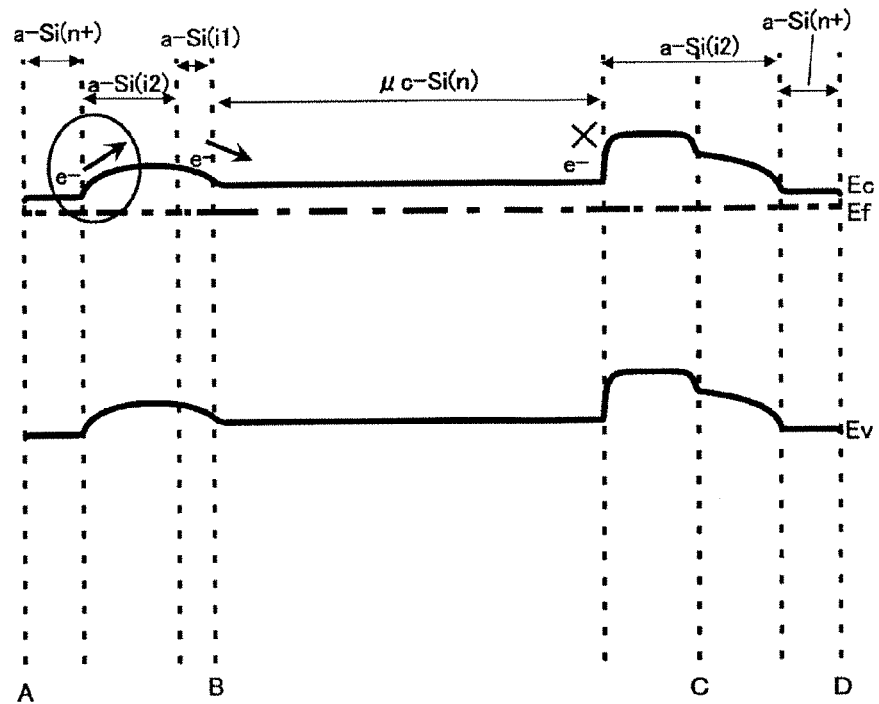
FIG. 22 is a diagram illustrating a band gap obtained from the device simulation.

FIG. 22 shows a result of the device simulation of a band diagram at VD=VG=0 V. When VG is 0 V, a barrier which prevents transfer of electrons is formed in a boundary portion of the microcrystalline silicon layer μc-Si (n) to which phosphorus is added and the amorphous silicon layer a-Si (i2).

Figure 23:
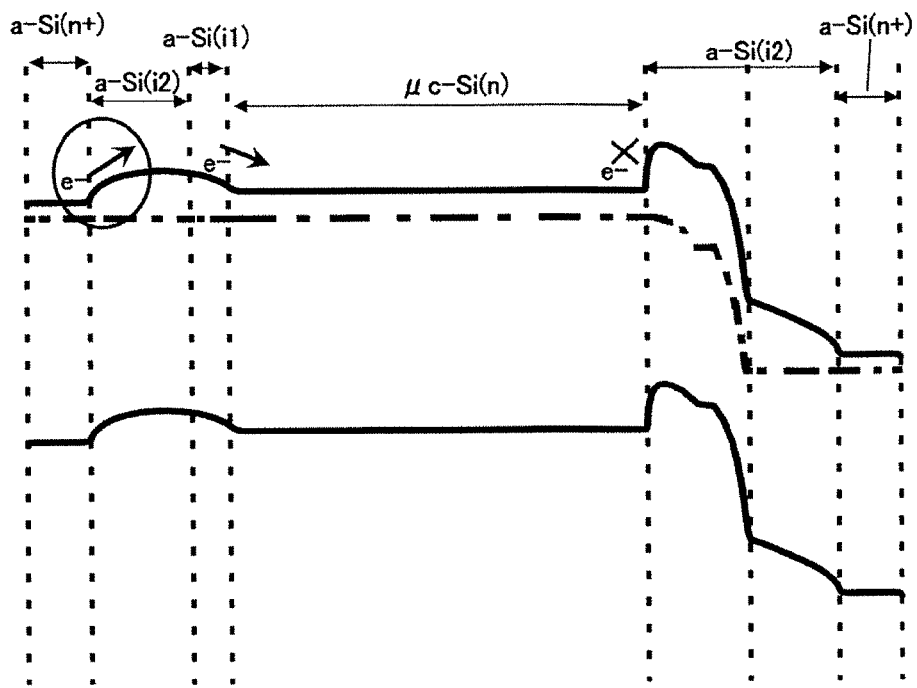
FIG. 23 is a diagram illustrating a band gap obtained from the device simulation.
Figure 24:
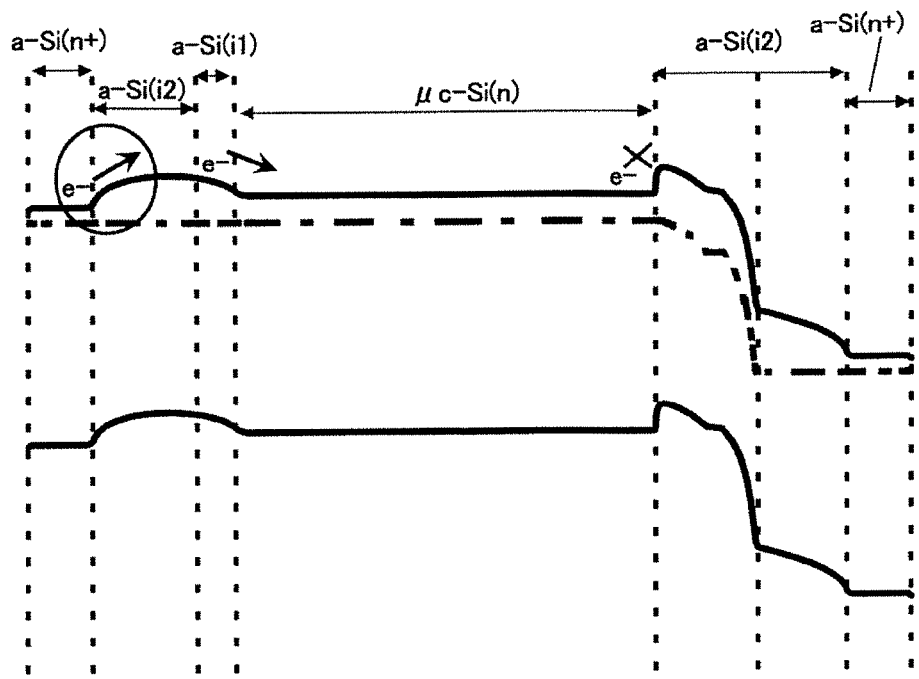
FIG. 24 is a diagram illustrating a band gap obtained from the device simulation.

FIG. 23 shows a result of the device simulation of a band diagram at VD=1 V and VG=0 V, and FIG. 24 shows a result of the device simulation of a band diagram at VD=1 V and VG=Vth (the threshold voltage is 0.6 V). The barrier exists even when VG is 0 V and threshold voltage. Note that when VG is equivalent to threshold voltage, the barrier is lower than the barrier of the band diagram at VG=0 V.

Figure 25:
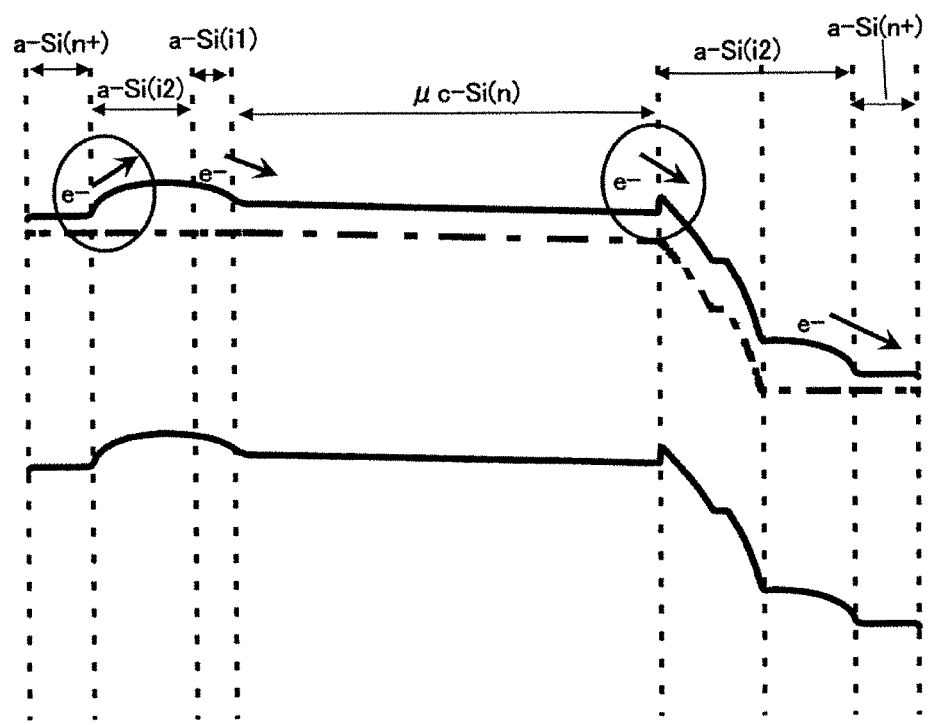
FIG. 25 is a diagram illustrating a band gap obtained from the device simulation.

FIG. 25 shows a result of the device simulation of a band diagram at VD=1 V and VG>Vth (the gate voltage is 2 V). When VG is higher than threshold voltage, the barrier is further reduced so that electrons can pass through. From this result, the thin film transistor described in this embodiment can obtain the current-voltage characteristics as shown in FIG. 21.

[Embodiment 3]

In this embodiment, results of simulation of current-voltage characteristics of the thin film transistor described in any of the above-described embodiment modes will be shown. For the device simulation, the device simulator "ATLAS" made by Silvaco Data Systems Inc. was used. In addition, the structure of a thin film transistor is the same as that of the thin film transistor described in Embodiment 2.

Figure 26:
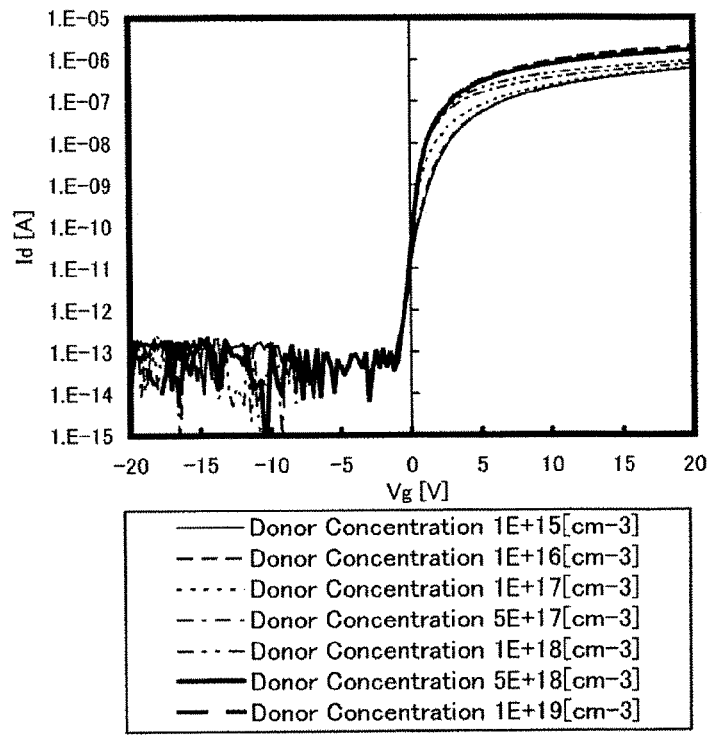
FIG. 26 is a graph showing electric characteristics, which is obtained from a device simulation, of the thin film transistor.
Figure 27:
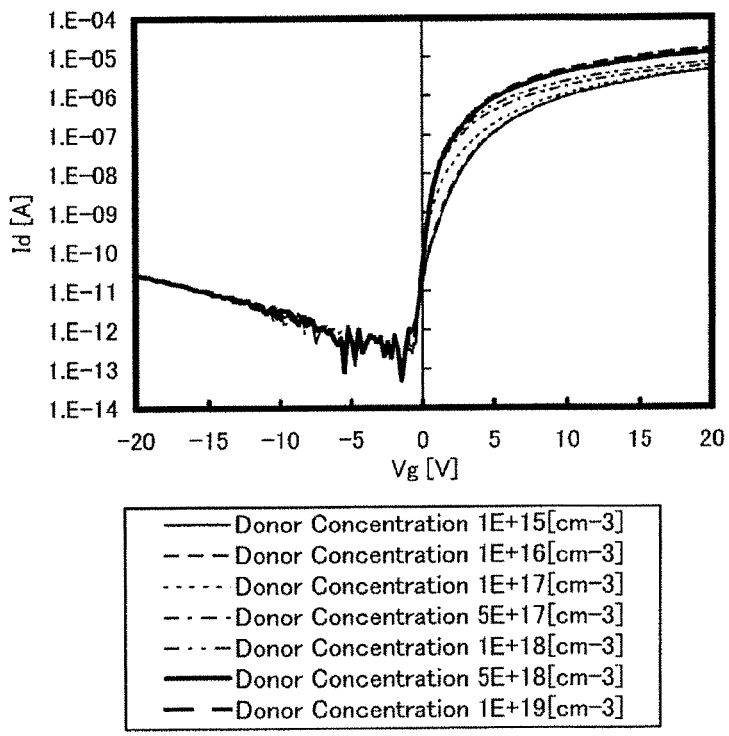
FIG. 27 is a graph showing electric characteristic, which is obtained from the device simulation, of the thin film transistor.

FIG. 26 shows respective current-voltage curves of the thin film transistor when the distance D-N illustrated in FIG. 20 was d, which was 2 μM, and the drain voltage Vd was 1 V. FIG. 27 shows respective current-voltage curves of the thin film transistor when the distance d was 2 μm and the drain voltage Vd was 10 V.

Figure 28:
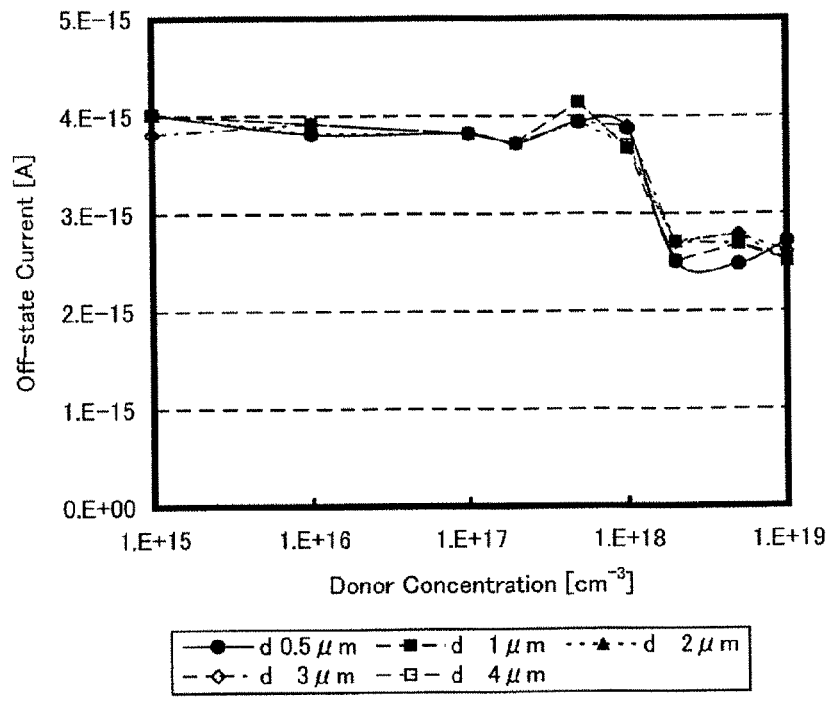
FIG. 28 is a graph showing off-state current, which is obtained from the device simulation, of the thin film transistor.
Figure 29:
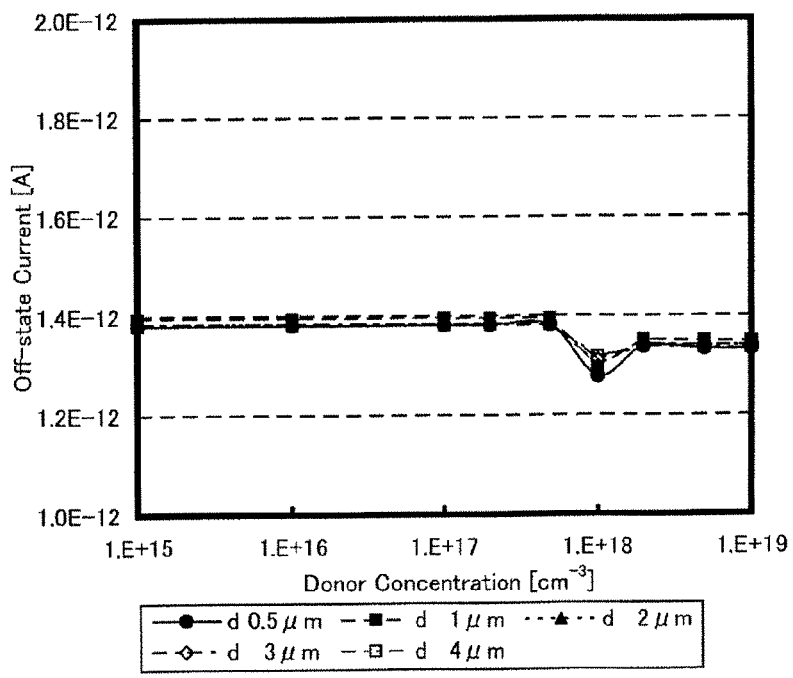
FIG. 29 is a graph showing off-state current, which is obtained from the device simulation, of the thin film transistor.

FIG. 28 shows change of off-state current with respect to the donor concentration when the drain voltage Vd was 1 V, depending on the distance d. FIG. 29 shows change of off-state current with respect to the donor concentration when the drain voltage Vd was 10 V, depending on the distance d.

Figure 30:
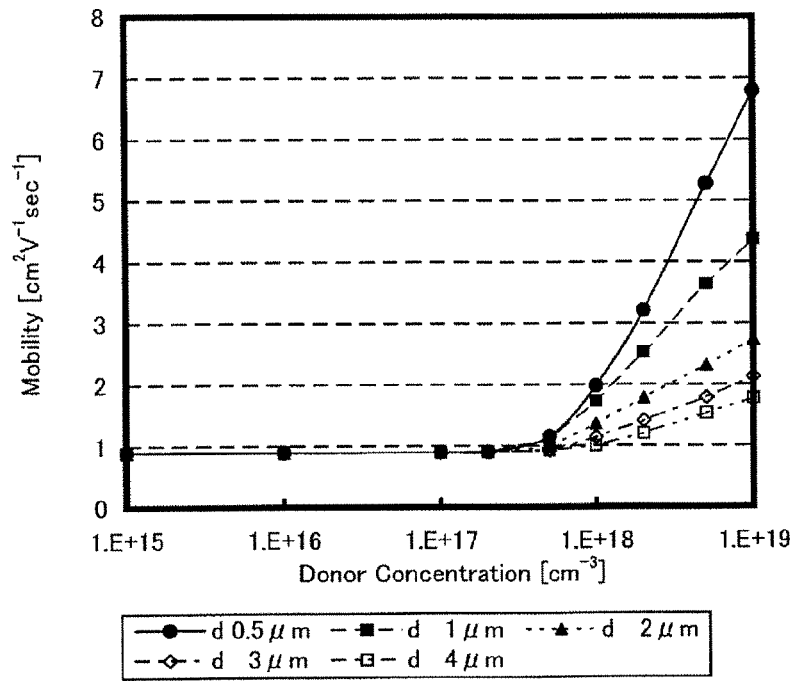
FIG. 30 is a graph showing field-effect mobility, which is obtained from the device simulation, of the thin film transistor.
Figure 31:
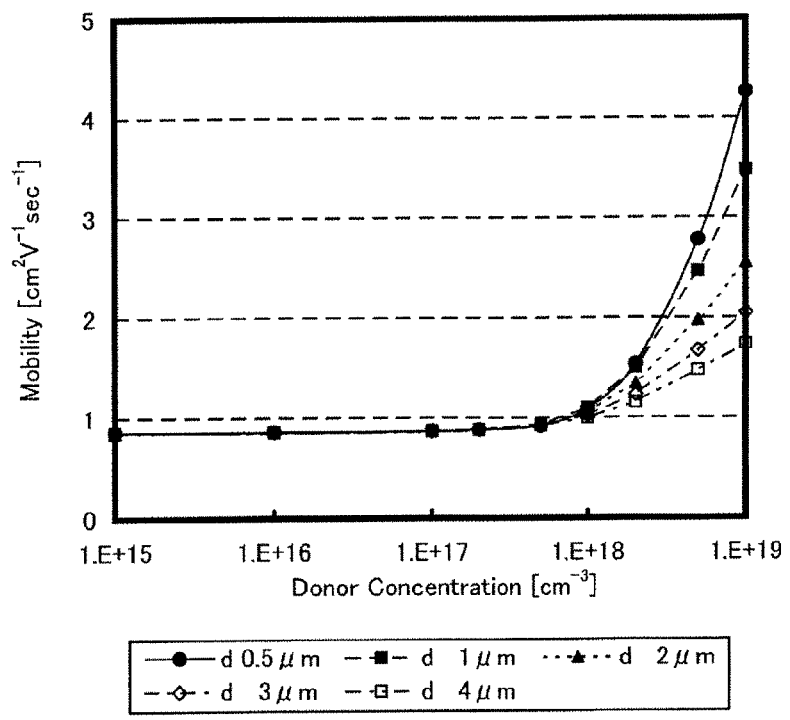
FIG. 31 is a graph showing field-effect mobility, which is obtained from the device simulation, of the thin film transistor.

FIG. 30 shows change of field-effect mobility with respect to the donor concentration when the drain voltage Vd was 1 V, depending on the distance d. FIG. 31 shows change of field-effect mobility with respect to the donor concentration when the drain voltage Vd was 10 V when the distance d was 2 μm, depending on the distance d.

From the graphs shown in FIGS. 28 to 30, for a thin film transistor which can be used in a display device, the following conditions are needed to be satisfied: off-state current is less than or equal to $1\times10^{-9}$ A when the drain voltage Vd is 10 V and is less than or equal to $1\times10^{-10}$ A when the drain voltage Vd is 1 V. The donor concentration satisfying this condition is $1\times10^{15}$ atoms/cm³ to $1\times10^{19}$ atoms/cm³ when the distance d is 0.5 μm to 4 μm.

Further, the donor concentration where the field-effect mobility is greater than or equal to 1.0 cm²/V·sec when the drain voltage Vd is 1 V is $1\times10^{18}$ atoms/cm³ to $1\times10^{19}$ atoms/cm³ when the distance d is 2 μm.

Accordingly, it is preferable that the donor concentration be in the range of $1\times10^{18}$ atoms/cm³ to $1\times10^{19}$ atoms/cm³ when the distance d is 0.5 μm to 4 μm.

When the donor concentration is $1\times10^{18}$ atoms/cm³ to $1\times10^{19}$ atoms/cm³, the electrical conductivity is 0.1 S/cm to 1.8 S/cm when the donor activation rate is 100%. The concentration of the impurity element which serves as a donor, which satisfies these electrical conductivities when the activation rate is 5% to 100%, is $1\times10^{18}$ atoms/cm³ to $2\times10^{20}$ atoms/cm³.

The present application is based on Japanese Patent Application serial No. 2008-051436 filed with Japan Patent Office on Mar. 1, 2008, the entire contents of which are hereby incorporated by reference.

What is claimed is:

1. A semiconductor device comprising:
 a gate electrode over a substrate;
 a gate insulating layer over the gate electrode;
 a conductive layer over the gate insulating layer, the conductive layer having an opening and overlapping with the gate electrode;
 an amorphous semiconductor layer over the conductive layer, the amorphous semiconductor layer having a region where the amorphous semiconductor layer is directly in contact with the gate insulating layer through the opening in the conductive layer;
 a first wiring over the amorphous semiconductor layer, the first wiring overlapping with the region and being electrically connected to the amorphous semiconductor layer; and
 a second wiring over the amorphous semiconductor layer, the second wiring overlapping with the conductive layer and being electrically connected to the amorphous semiconductor layer.

2. The semiconductor device according to claim 1, wherein the conductive layer is a metal layer, a metal nitride layer, a metal carbide layer, a metal boride layer, or a metal silicide layer.

3. The semiconductor device according to claim 1, wherein the conductive layer is a semiconductor layer containing an impurity element serving as a donor.

4. The semiconductor device according to claim 3, wherein a concentration of the donor in the semiconductor layer is greater than or equal to $1\times10^{18}$ atoms/cm³ and less than or equal to $2\times10^{20}$ atoms/cm³.

5. The semiconductor device according to claim 1, wherein the conductive layer is a microcrystalline silicon layer containing an impurity element serving as a donor.

6. The semiconductor device according to claim 5, wherein a concentration of the donor in the microcrystalline silicon layer is greater than or equal to $1\times10^{18}$ atoms/cm$^3$ and less than or equal to $2\times10^{20}$ atoms/cm$^3$.

7. The semiconductor device according to claim 1, wherein the amorphous semiconductor layer is an amorphous silicon layer.

8. A semiconductor device comprising:
a gate electrode over a substrate;
a gate insulating layer over the gate electrode;
a conductive layer over the gate insulating layer, the conductive layer having an opening and overlapping with the gate electrode;
a buffer layer over the conductive layer, the buffer layer having an opening;
an amorphous semiconductor layer over the buffer layer, the amorphous semiconductor layer having a region where the amorphous semiconductor layer is directly in contact with the gate insulating layer through the opening in the buffer layer and the opening in the conductive layer;
a first impurity semiconductor layer over the amorphous semiconductor layer, the first impurity semiconductor layer overlapping with the region;
a second impurity semiconductor layer over the amorphous semiconductor layer, the second impurity semiconductor layer overlapping with the conductive layer;
a first wiring over the first impurity semiconductor layer, the first wiring being in contact with the first impurity semiconductor layer; and
a second wiring over the second impurity semiconductor layer, the second wiring being in contact with the second impurity semiconductor layer.

9. The semiconductor device according to claim 8,
wherein the first impurity semiconductor layer is a circular film, and
wherein the second impurity semiconductor layer is a ring-shaped film.

10. The semiconductor device according to claim 8, wherein the conductive layer is a metal layer, a metal nitride layer, a metal carbide layer, a metal boride layer, or a metal silicide layer.

11. The semiconductor device according to claim 8, wherein the conductive layer is a semiconductor layer containing an impurity element serving as a donor.

12. The semiconductor device according to claim 11, wherein a concentration of the donor in the semiconductor layer is greater than or equal to $1\times10^{18}$ atoms/cm$^3$ and less than or equal to $2\times10^{20}$ atoms/cm$^3$.

13. The semiconductor device according to claim 8, wherein the conductive layer is a microcrystalline silicon layer containing an impurity element serving as a donor.

14. The semiconductor device according to claim 13, wherein a concentration of the donor in the microcrystalline silicon layer is greater than or equal to $1\times10^{18}$ atoms/cm$^3$ and less than or equal to $2\times10^{20}$ atoms/cm$^3$.

15. The semiconductor device according to claim 8, wherein the amorphous semiconductor layer is an amorphous silicon layer.

16. The semiconductor device according to claim 8, wherein the buffer layer is an amorphous silicon layer containing halogen.

* * * * *